United States Patent [19]

Welles, II et al.

[11] Patent Number: 5,119,378
[45] Date of Patent: Jun. 2, 1992

[54] TESTING OF INTEGRATED CIRCUITS INCLUDING INTERNAL TEST CIRCUITRY AND USING TOKEN PASSING TO SELECT TESTING PORTS

[75] Inventors: Kenneth B. Welles, II, Scotia; Richard I. Hartley, Schenectady; Michael J. Hartman; Paul A. Delano, both of Clifton Park, all of N.Y.

[73] Assignee: General Electric Company, Schenectady, N.Y.

[21] Appl. No.: 513,636

[22] Filed: Apr. 24, 1990

Related U.S. Application Data

[63] Continuation-in-part of Ser. No. 487,481, Mar. 2, 1990.

[51] Int. Cl.⁵ .............................................. G01R 31/28
[52] U.S. Cl. ................................... 371/22.5; 371/22.1
[58] Field of Search .................... 371/22.1, 22.3, 22.4, 371/22.5; 324/73.1

[56] References Cited

U.S. PATENT DOCUMENTS

| | | | |
|---|---|---|---|
| 4,701,920 | 10/1987 | Resnick et al. | 371/22.5 |
| 4,740,970 | 4/1988 | Burrows et al. | 371/22.5 |
| 4,910,735 | 3/1990 | Yamashita | 371/22.1 |
| 4,914,379 | 4/1990 | Maeno | 371/22.3 |
| 5,006,787 | 4/1991 | Katircioglu et al. | 324/73.1 |

Primary Examiner—Charles E. Atkinson
Attorney, Agent, or Firm—Marvin Snyder; James C. Davis, Jr.

[57] ABSTRACT

Built-in test circuitry, which is appropriate for monolithic integrated circuit chips that are to be connected in a plural-chip package, uses electronic token passing to select one of the test input ports in the circuitry to be tested for application of test input vectors. The built-in test circuitry also uses electronic token passing to select one of the test output ports in the circuitry to be tested from which test results are to be supplied. Methods for testing based on these token passing procedures are described.

48 Claims, 32 Drawing Sheets

A METHOD FOR TESTING CHUNKS OF ELECTRONICS IN A SYSTEM WITH A PLURALITY OF MONOLITHIC INTEGRATED CIRCUITS

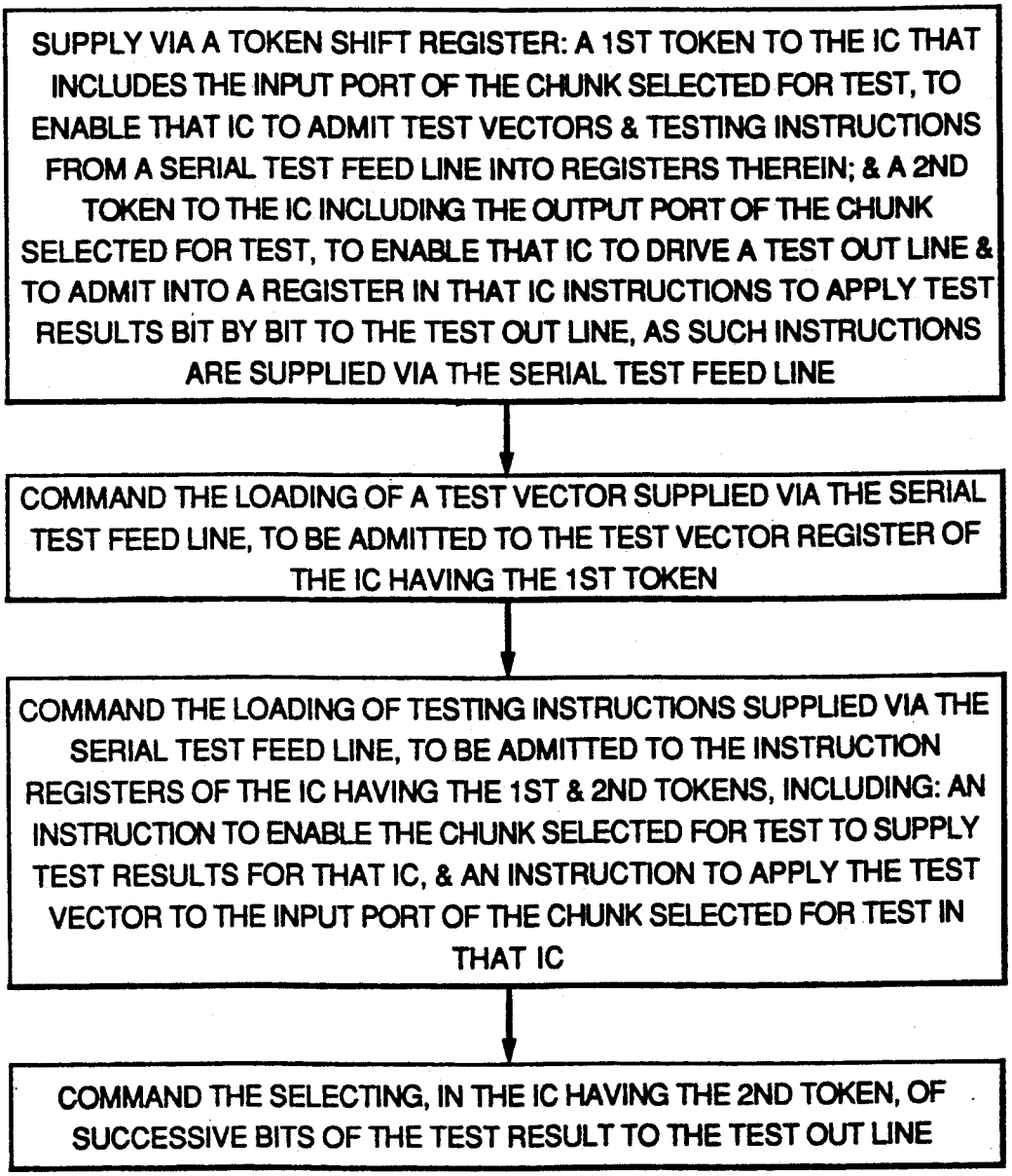
Fig. 11 A METHOD FOR TESTING CHUNKS OF ELECTRONICS IN A SYSTEM WITH A PLURALITY OF MONOLITHIC INTEGRATED CIRCUITS

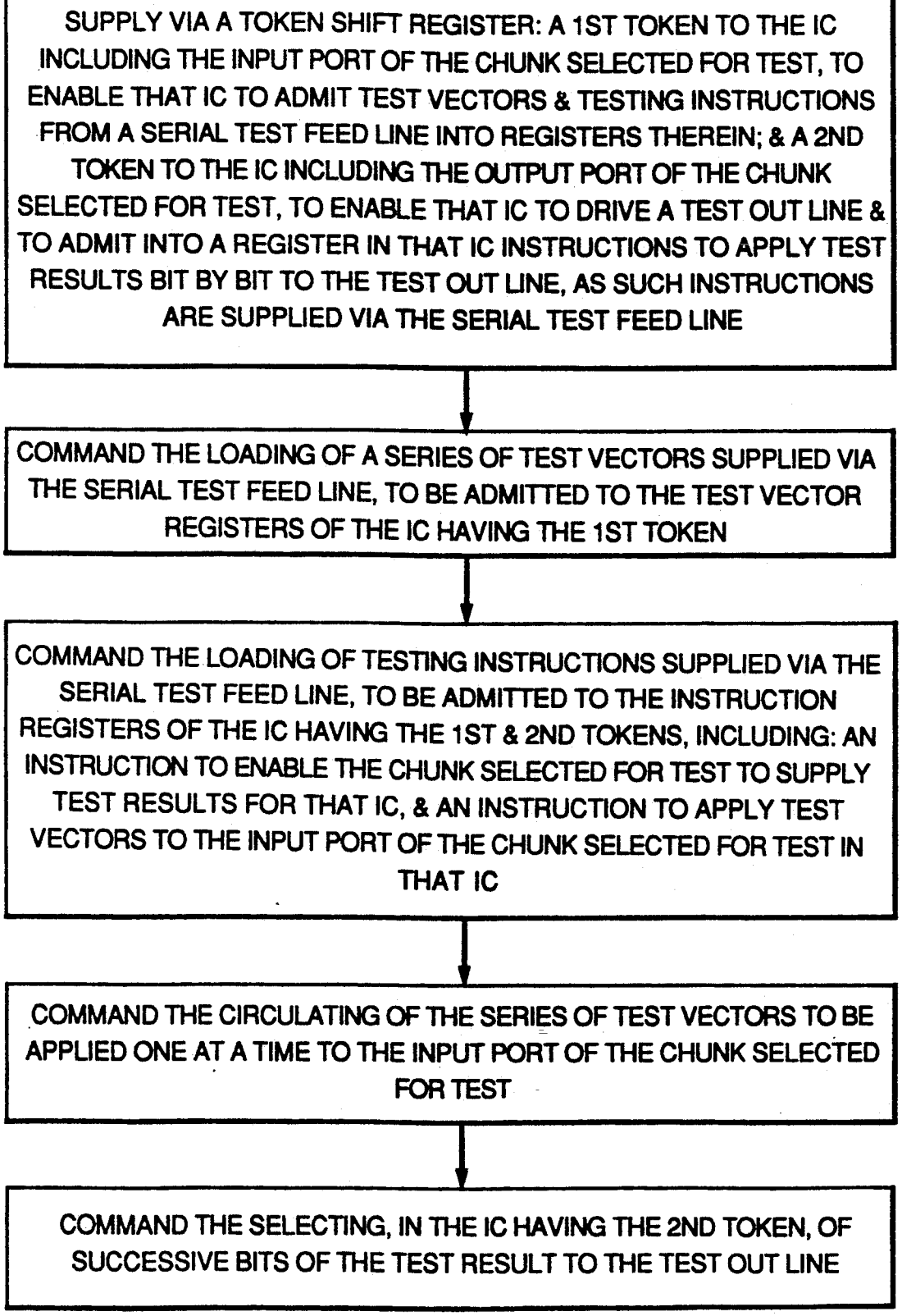
Fig. 12 A METHOD FOR TESTING CHUNKS OF ELECTRONICS IN A SYSTEM WITH A PLURALITY OF MONOLITHIC INTEGRATED CIRCUITS

| SUPPLY VIA A TOKEN SHIFT REGISTER: A 1ST TOKEN TO AT LEAST THE IC WHICH INCLUDES THE INPUT PORT OF THE CHUNK TO WHICH CONNECTIONS SELECTED FOR TEST ARE MADE, TO ENABLE EACH OF THOSE ICS TO ADMIT INTO A REGISTER THEREIN A TEST VECTOR SUPPLIED FROM A SERIAL TEST FEED LINE |
|---|

↓

| COMMAND THE LOADING OF A TEST VECTOR SUPPLIED VIA A SERIAL TEST FEED LINE & HAVING A SELECTED BIT OR BITS OF A LOGIC STATE OPPOSITE TO THE LOGIC STATE OF ITS OTHER BITS, TO BE ADMITTED TO THE TEST VECTOR REGISTER OF EACH IC HAVING A 1ST TOKEN |
|---|

↓

| SUPPLY VIA THE TOKEN SHIFT REGISTER: A 1ST TOKEN JUST TO THE IC INCLUDING THE INPUT PORT OF THE CHUNK TO WHICH CONNECTIONS SELECTED FOR TEST ARE MADE, TO ENABLE THAT IC TO ADMIT INTO INSTRUCTION REGISTERS THEREIN TESTING INSTRUCTIONS SUPPLIED VIA THE SERIAL TEST FEED LINE; & A 2ND TOKEN JUST TO THE IC INCLUDING THE OUTPUT PORT OF THE CHUNK TO WHICH CONNECTIONS SELECTED FOR TEST ARE MADE, TO ENABLE THAT IC TO DRIVE A TEST OUT LINE & TO ADMIT INTO A REGISTER IN THAT IC INSTRUCTIONS TO APPLY TEST RESULTS BIT BY BIT TO THE TEST OUT LINE, AS SUCH INSTRUCTIONS ARE SUPPLIED VIA THE SERIAL TEST FEED LINE |
|---|

↓

| COMMAND THE LOADING OF TESTING INSTRUCTIONS SUPPLIED VIA THE SERIAL TEST FEED LINE INCLUDING: AN INSTRUCTION TO ENABLE THE OUTPUT PORT OF THE CHUNK FROM WHICH CONNECTIONS SELECTED FOR TEST ARE MADE TO SUPPLY TEST RESULTS FOR THE IC HAVING THE 2ND TOKEN, AN INSTRUCTION TO APPLY THE TEST VECTOR TO THE INPUT PORT OF THE CHUNK IN THE IC HAVING THE 1ST TOKEN, & AN INSTRUCTION TO SELECT IN THE IC HAVING THE 1ST TOKEN WHICH BIT(S) OF THE TEST VECTOR WILL BE APPPLIED AT RELATIVELY LOW OUTPUT IMPEDANCE AS COMPARED TO THE OTHER OF ITS BITS |
|---|

Fig. 13 PRELIMINARY STEPS OF THE FIGURE 14 AND 15 METHODS FOR TESTING INTERCONNECTIONS BETWEEN CHUNKS OF ELECTRONICS IN THE SAME ONE OF A PLURALITY OF MONOLITHIC INTEGRATED CIRCUITS CONNECTED TOGETHER IN A SYSTEM

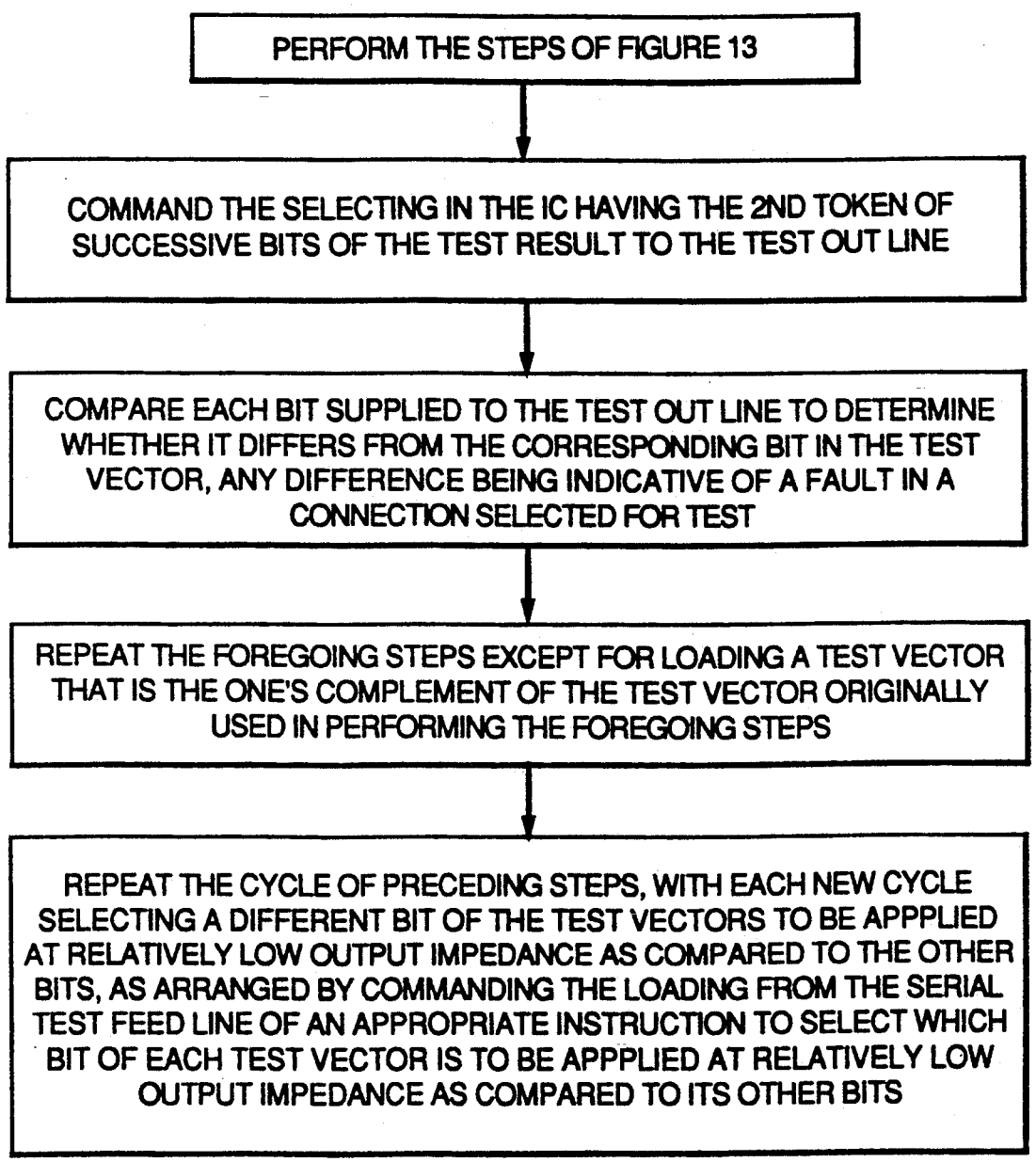
Fig. 14 A METHOD FOR TESTING INTERCONNECTIONS BETWEEN CHUNKS OF ELECTRONICS IN THE SAME ONE OF A PLURALITY OF MONOLITHIC INTEGRATED CIRCUITS CONNECTED TOGETHER IN A SYSTEM

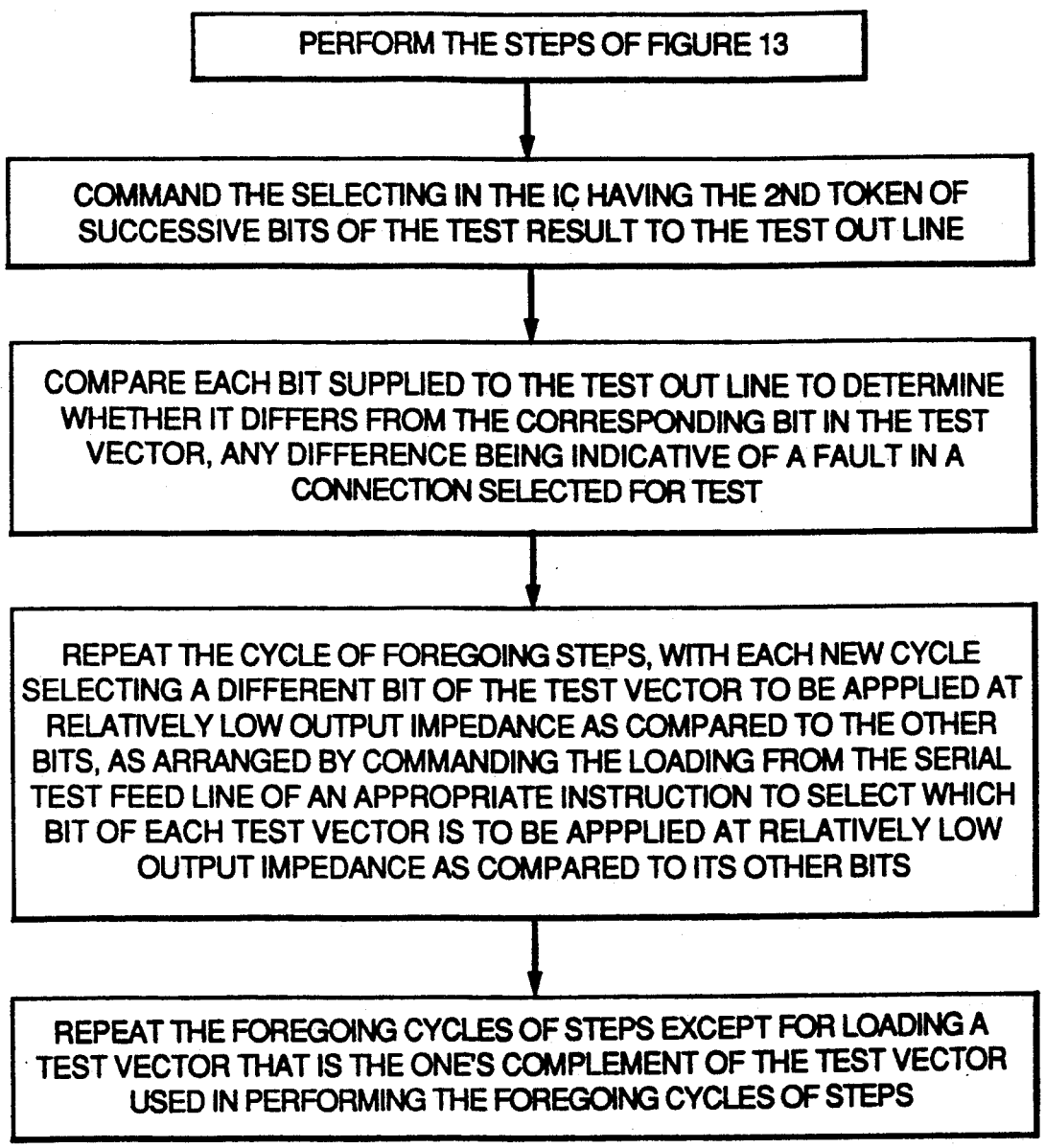
Fig. 15 A METHOD FOR TESTING INTERCONNECTIONS BETWEEN CHUNKS OF ELECTRONICS IN THE SAME ONE OF A PLURALITY OF MONOLITHIC INTEGRATED CIRCUITS CONNECTED TOGETHER IN A SYSTEM

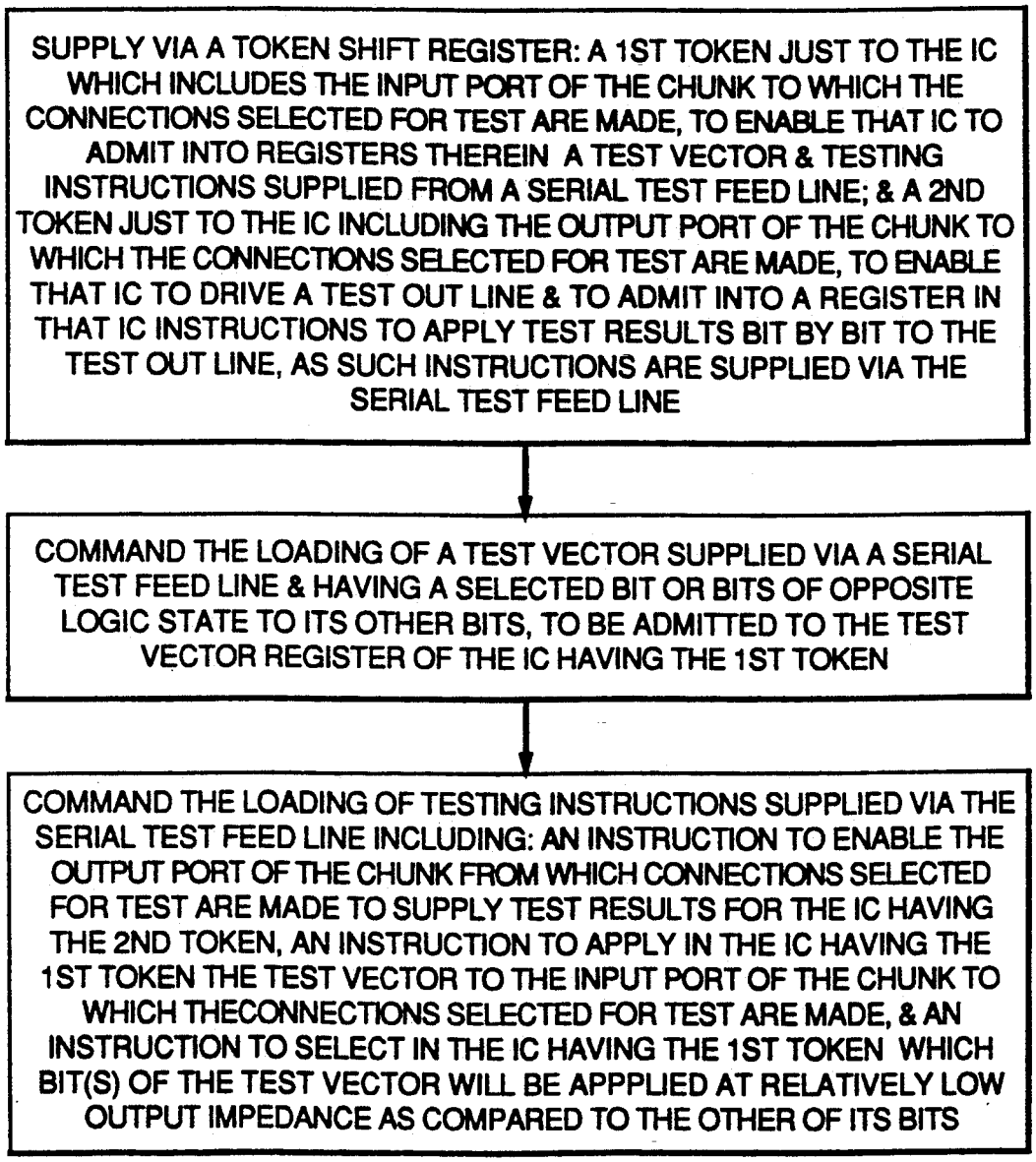
Fig. 16 PRELIMINARY STEPS OF THE FIGURE 17 & 18 METHODS FOR TESTING INTERCONNECTIONS BETWEEN CHUNKS OF ELECTRONICS IN THE SAME ONE OF A PLURALITY OF MONOLITHIC INTEGRATED CIRCUITS CONNECTED TOGETHER IN A SYSTEM

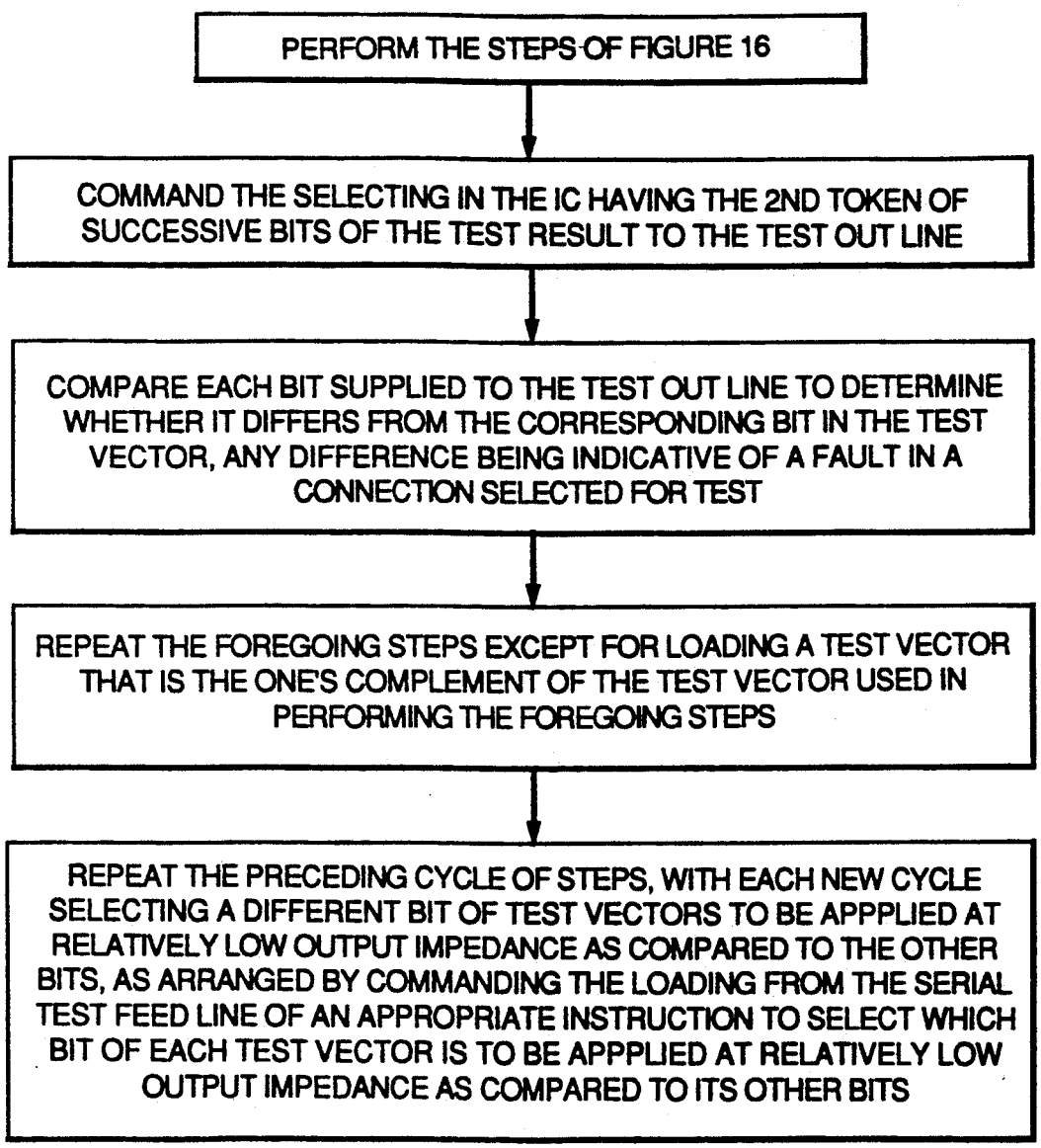
Fig. 17 A METHOD FOR TESTING INTERCONNECTIONS BETWEEN CHUNKS OF ELECTRONICS IN THE SAME ONE OF A PLURALITY OF MONOLITHIC INTEGRATED CIRCUITS CONNECTED TOGETHER IN A SYSTEM

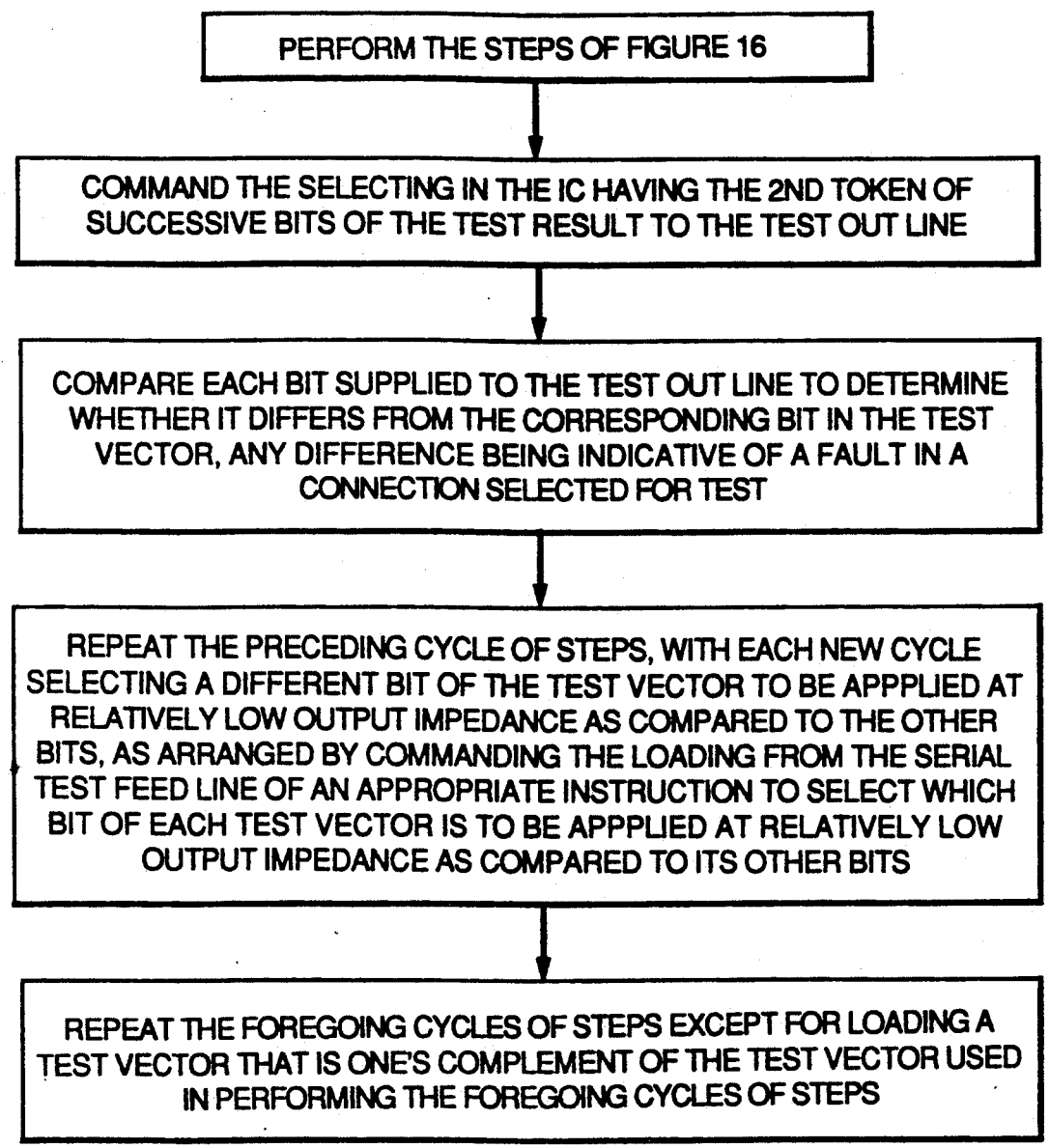
Fig. 18 A METHOD FOR TESTING INTERCONNECTIONS BETWEEN CHUNKS OF ELECTRONICS IN THE SAME ONE OF A PLURALITY OF MONOLITHIC INTEGRATED CIRCUITS CONNECTED TOGETHER IN A SYSTEM

| SUPPLY VIA A TOKEN SHIFT REGISTER: A 1ST TOKEN TO AT LEAST THE IC WHICH INCLUDES THE INPUT PORT OF THE CHUNK TO WHICH CONNECTIONS SELECTED FOR TEST ARE MADE, TO ENABLE EACH OF THOSE ICS TO ADMIT INTO ITS RESPECTIVE TEST VECTOR REGISTERS A TEST VECTOR SUPPLIED VIA A SERIAL TEST FEED LINE |
|---|

↓

| COMMAND THE LOADING OF A TEST VECTOR SUPPLIED VIA THE SERIAL TEST FEED LINE & HAVING A SELECTED BIT OR BITS OF A LOGIC STATE OPPOSITE TO THE LOGIC STATE OF ITS OTHER BITS, TO BE ADMITTED TO THE TEST VECTOR REGISTER OF EACH IC HAVING A 1ST TOKEN |
|---|

↓

| SUPPLY VIA THE TOKEN SHIFT REGISTER: A 1ST TOKEN JUST TO THE IC INCLUDING THE OUTPUT PORT OF THE CHUNK TO WHICH CONNECTIONS SELECTED FOR TEST ARE MADE, TO ENABLE IT TO ADMIT INTO INSTRUCTION REGISTERS THEREIN TESTING INSTRUCTIONS SUPPLIED VIA THE SERIAL TEST FEED LINE |
|---|

↓

| COMMAND THE LOADING OF TESTING INSTRUCTIONS SUPPLIED VIA THE SERIAL TEST FEED LINE, TO BE ADMITTED TO THE INSTRUCTION REGISTERS OF THE IC HAVING THE 1ST TOKEN, INCLUDING: AN INSTRUCTION TO ENABLE THE OUTPUT PORT OF THE CHUNK FROM WHICH CONNECTIONS SELECTED FOR TEST ARE MADE TO SUPPLY TEST RESULTS FOR THE IC CURRENTLY HAVING THE 1ST TOKEN WHEN THAT IC SUBSEQUENTLY HAS A 2ND TOKEN |
|---|

Fig. 19 PRELIMINARY STEPS OF THE FIGURE 21, 22 AND 23 METHODS OF TESTING INTERCONNECTIONS BETWEEN CHUNKS OF ELECTRONICS IN DIFFERENT ONES OF A PLURALITY OF MONOLITHIC INTEGRATED CIRCUITS CONNECTED TOGETHER IN A SYSTEM

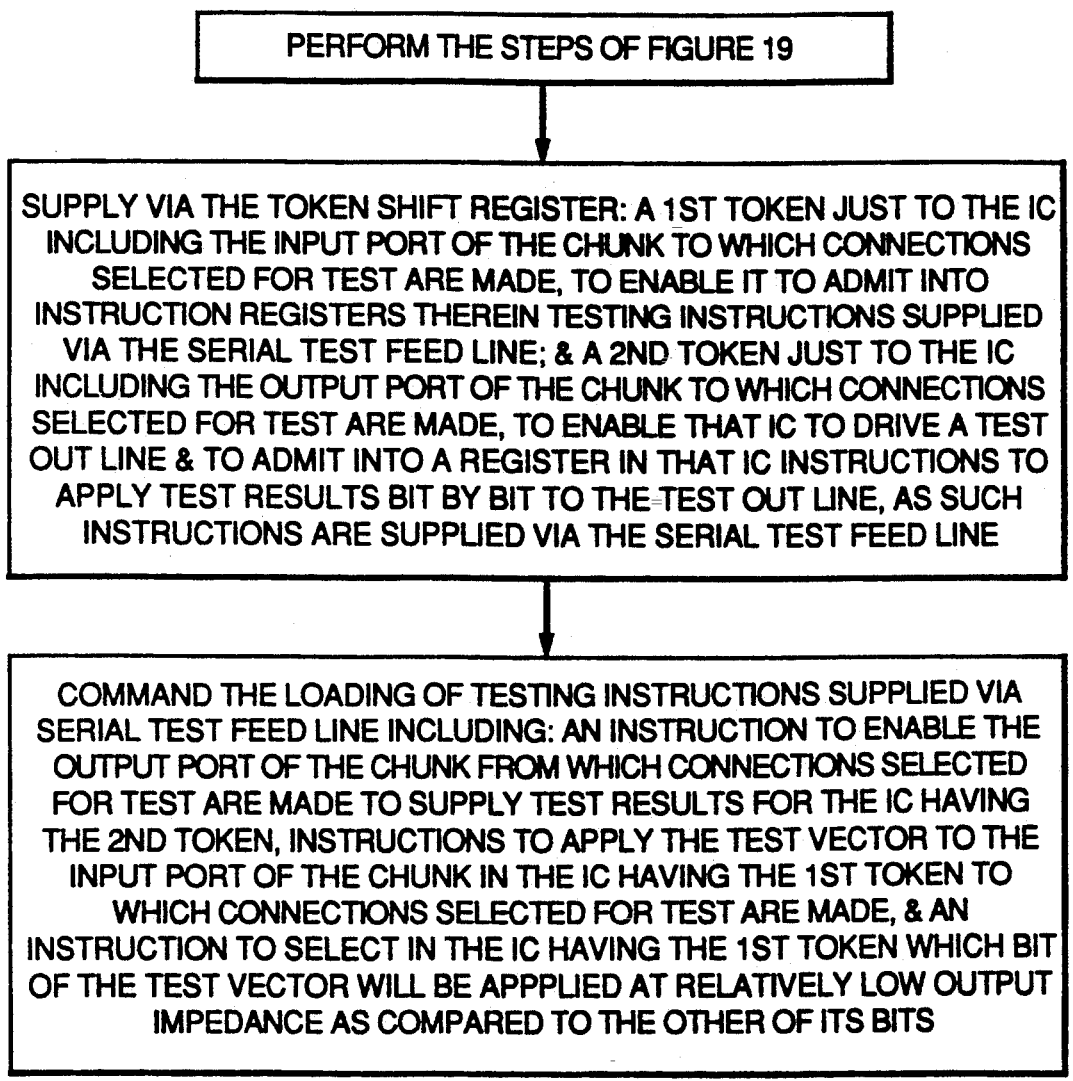
Fig. 20 FURTHER PRELIMINARY STEPS OF THE FIGURE 21 AND 22 METHODS OF TESTING INTERCONNECTIONS BETWEEN CHUNKS OF ELECTRONICS IN DIFFERENT ONES OF A PLURALITY OF MONOLITHIC INTEGRATED CIRCUITS CONNECTED TOGETHER IN A SYSTEM

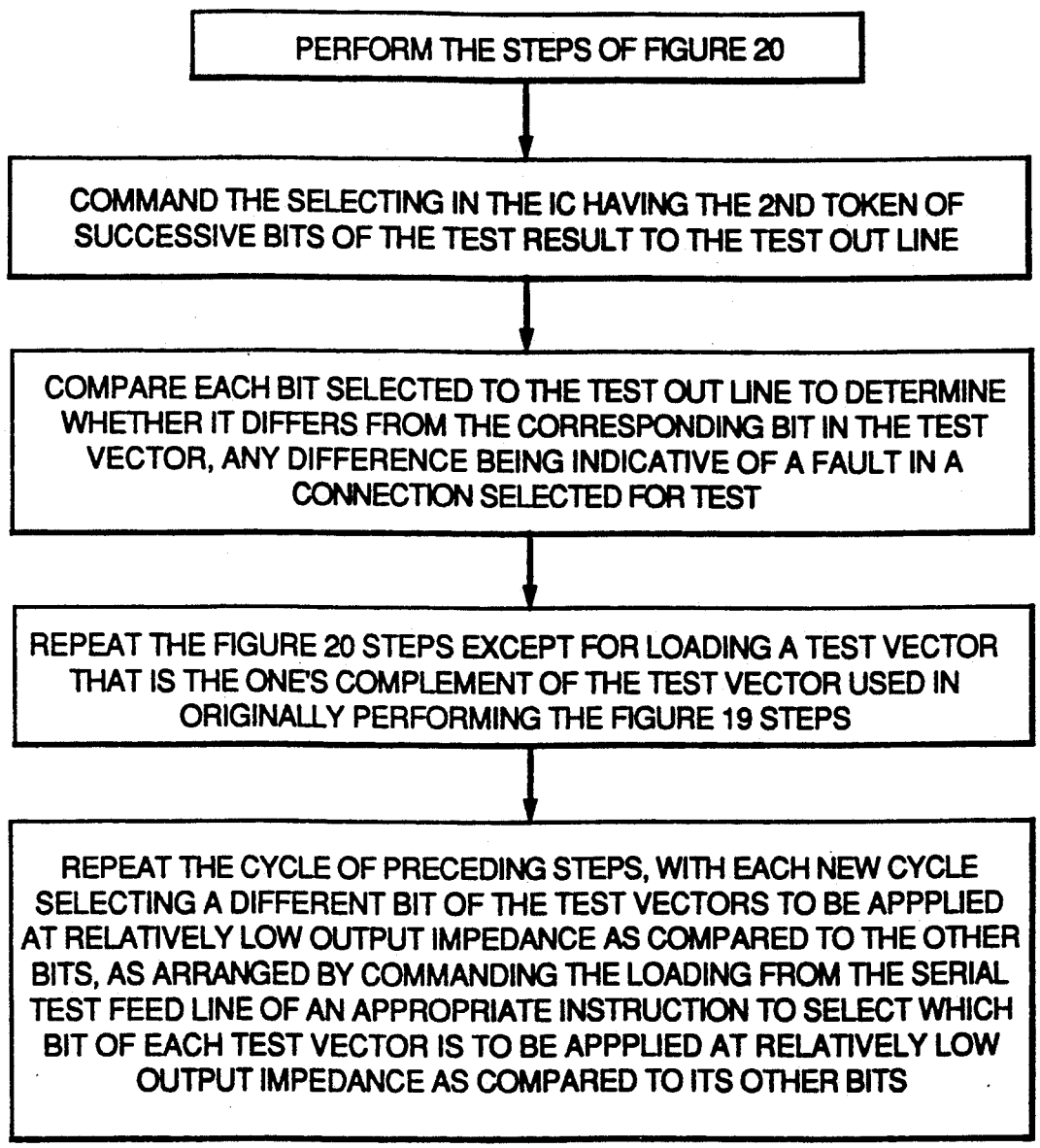
Fig. 21 A METHOD OF TESTING INTERCONNECTIONS BETWEEN CHUNKS OF ELECTRONICS IN DIFFERENT ONES OF A PLURALITY OF MONOLITHIC INTEGRATED CIRCUITS CONNECTED TOGETHER IN A SYSTEM

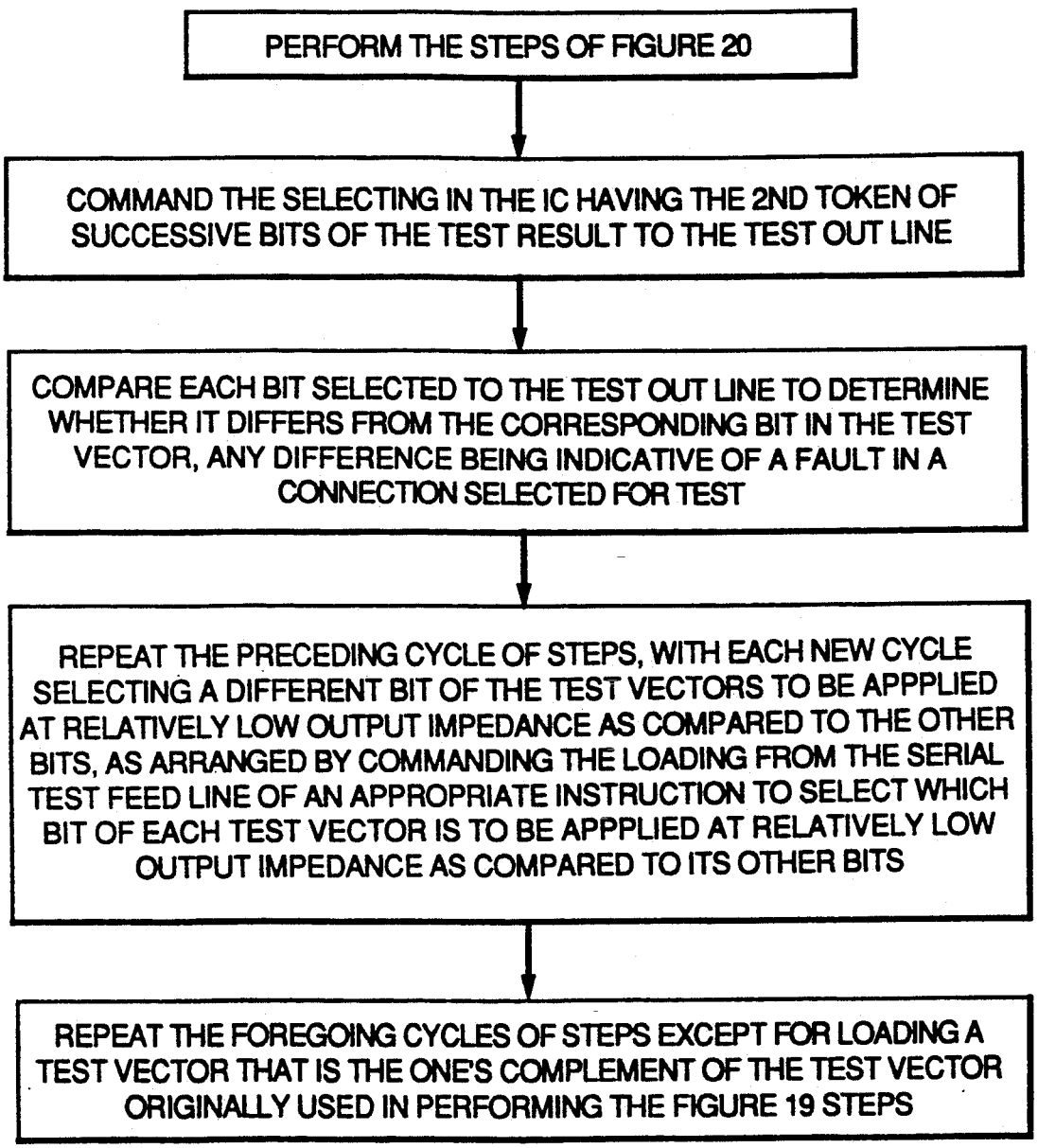
Fig. 22 A METHOD OF TESTING INTERCONNECTIONS BETWEEN CHUNKS OF ELECTRONICS IN DIFFERENT ONES OF A PLURALITY OF MONOLITHIC INTEGRATED CIRCUITS CONNECTED TOGETHER IN A SYSTEM

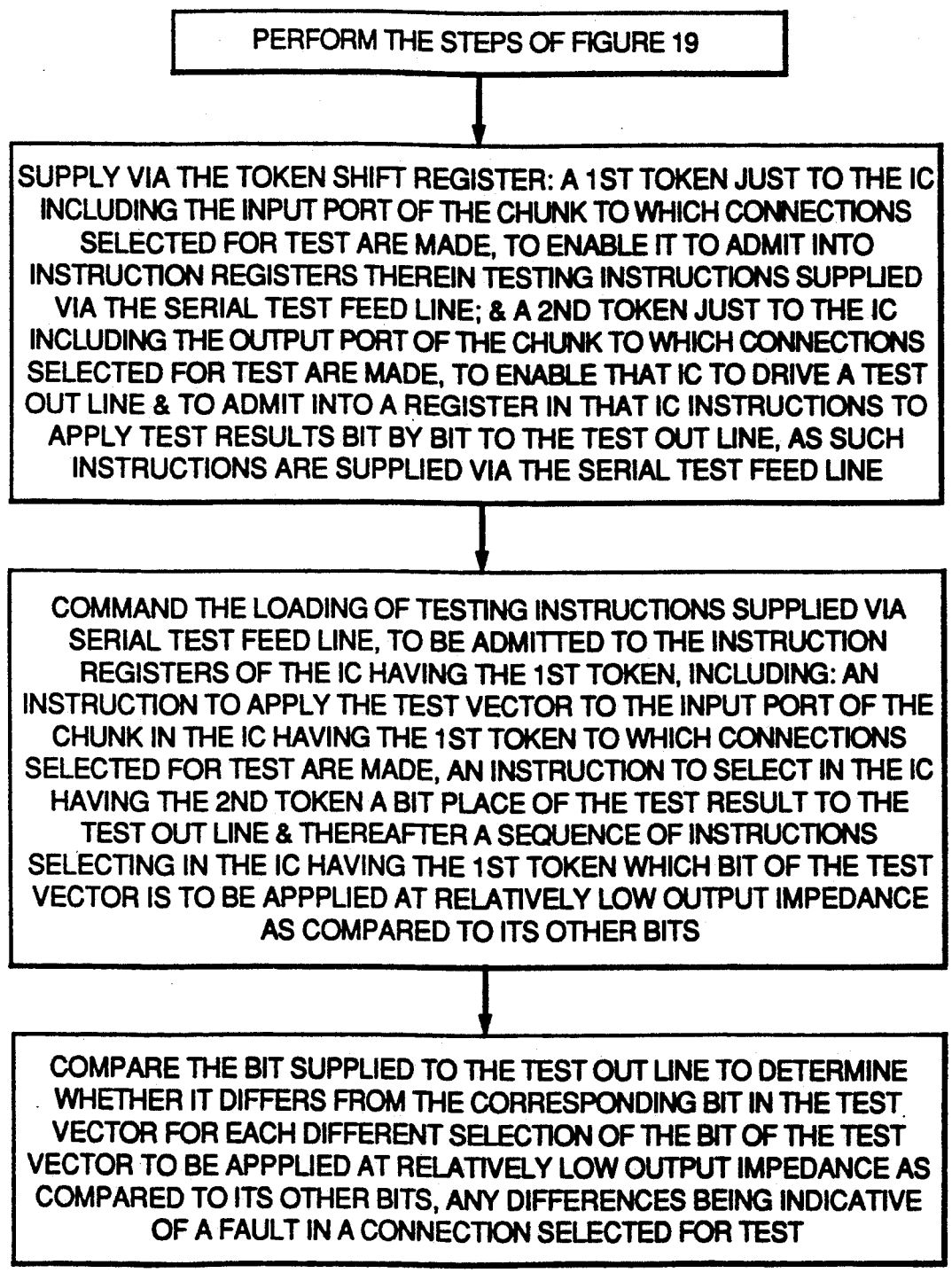
Fig. 23 A METHOD OF TESTING INTERCONNECTIONS BETWEEN CHUNKS OF ELECTRONICS IN DIFFERENT ONES OF A PLURALITY OF MONOLITHIC INTEGRATED CIRCUITS CONNECTED TOGETHER IN A SYSTEM

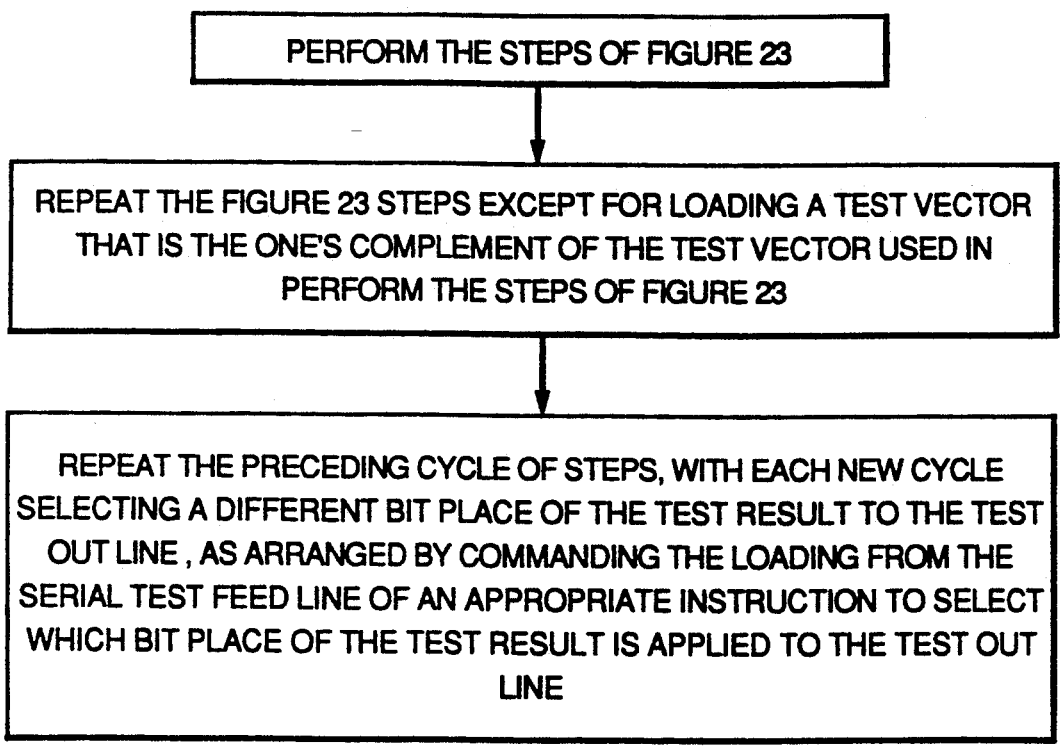
Fig. 24 A METHOD OF TESTING INTERCONNECTIONS BETWEEN CHUNKS OF ELECTRONICS IN DIFFERENT ONES OF A PLURALITY OF MONOLITHIC INTEGRATED CIRCUITS CONNECTED TOGETHER IN A SYSTEM

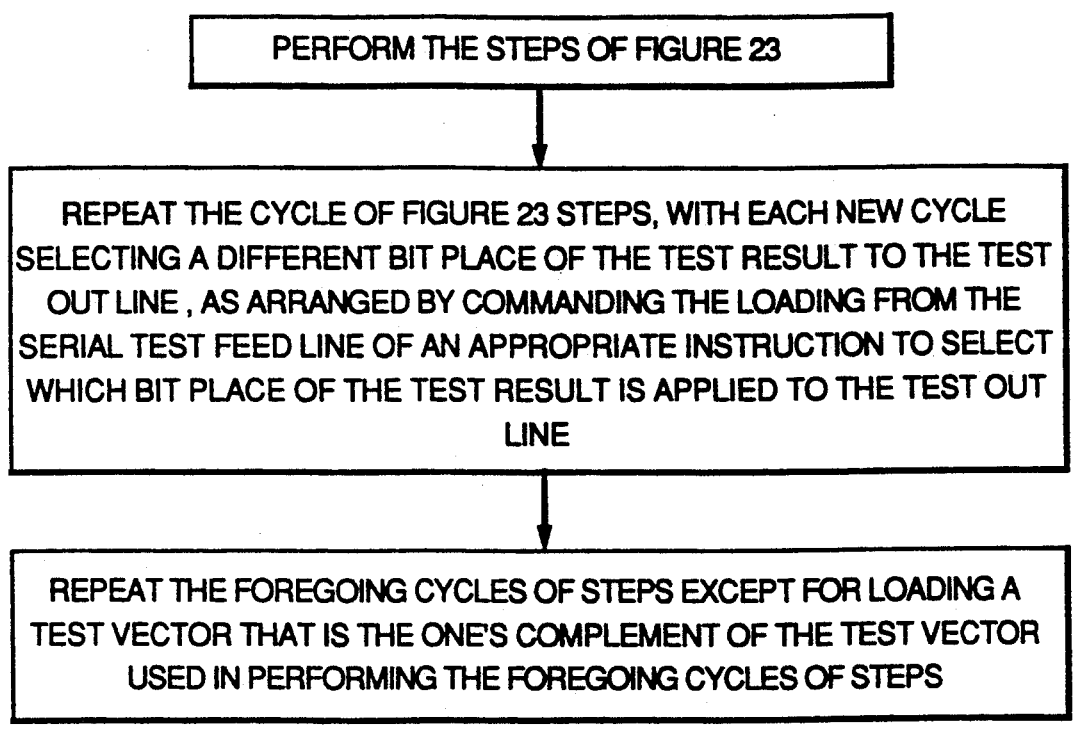
Fig. 25 A METHOD OF TESTING INTERCONNECTIONS BETWEEN CHUNKS OF ELECTRONICS IN DIFFERENT ONES OF A PLURALITY OF MONOLITHIC INTEGRATED CIRCUITS CONNECTED TOGETHER IN A SYSTEM

```
┌─────────────────────────────────────────────────────────────────┐
│ SUPPLY VIA A TOKEN SHIFT REGISTER: A 1ST TOKEN TO AT LEAST THE  │
│ IC WHICH INCLUDES THE INPUT PORT OF THE CHUNK TO WHICH CONNEC-  │
│ TIONS SELECTED FOR TEST ARE MADE, TO ENABLE EACH OF THOSE ICS   │
│ TO ADMIT INTO A CIRCULATING REGISTER THEREIN A SUCCESSION OF    │
│ TEST VECTORS SUPPLIED FROM A SERIAL TEST FEED LINE              │
└─────────────────────────────────────────────────────────────────┘
                                  │
                                  ▼
┌─────────────────────────────────────────────────────────────────┐
│ COMMAND THE LOADING OF A SUCCESSION OF TEST VECTORS SUPPLIED    │
│ VIA A SERIAL TEST FEED LINE, TO BE ADMITTED TO THE CIRCULATING  │
│ REGISTER OF EACH IC HAVING A 1ST TOKEN, THE TEST VECTORS BEING  │
│ SUCH THAT EACH BIT PLACE EXHIBITS ALTERNATING ONES & ZEROES     │
│ DURING THEIR CIRCULATION                                        │
└─────────────────────────────────────────────────────────────────┘
                                  │
                                  ▼
┌─────────────────────────────────────────────────────────────────┐
│ SUPPLY VIA THE TOKEN SHIFT REGISTER: A 1ST TOKEN JUST TO THE IC │
│ INCLUDING THE INPUT PORT OF THE CHUNK TO WHICH CONNECTIONS      │
│ SELECTED FOR TEST ARE MADE, TO ENABLE THAT IC TO ADMIT INTO     │
│ INSTRUCTION REGISTERS THEREIN TESTING INSTRUCTIONS SUPPLIED     │
│ VIA THE SERIAL TEST FEED LINE; & A 2ND TOKEN JUST TO THE IC     │
│ INCLUDING THE OUTPUT PORT OF THE CHUNK TO WHICH CONNECTIONS     │
│ SELECTED FOR TEST ARE MADE, TO ENABLE THAT IC TO DRIVE A TEST   │
│ OUT LINE & TO ADMIT INTO A REGISTER IN THAT IC INSTRUCTIONS TO  │
│ APPLY TEST RESULTS BIT BY BIT TO THE TEST OUT LINE, AS SUCH     │
│ INSTRUCTIONS ARE SUPPLIED VIA THE SERIAL TEST FEED LINE         │
└─────────────────────────────────────────────────────────────────┘
                                  │
                                  ▼
┌─────────────────────────────────────────────────────────────────┐
│ COMMAND THE LOADING OF TESTING INSTRUCTIONS SUPPLIED VIA THE    │
│ SERIAL TEST FEED LINE INCLUDING: AN INSTRUCTION TO ENABLE THE   │
│ OUTPUT PORT OF THE CHUNK FROM WHICH CONNECTIONS SELECTED FOR    │
│ TEST ARE MADE TO SUPPLY TEST RESULTS FOR THE IC HAVING THE 2ND  │
│ TOKEN, & AN INSTRUCTION TO APPLY THE TEST VECTORS TO THE INPUT  │
│ PORT OF THE CHUNK IN THE IC HAVING THE 1ST TOKEN                │
└─────────────────────────────────────────────────────────────────┘
```

Fig. 26 PRELIMINARY STEPS OF THE FIGURE 27 AND 28 METHODS FOR TESTING INTERCONNECTIONS BETWEEN CHUNKS OF ELECTRONICS IN A MONOLITHIC INTEGRATED CIRCUIT

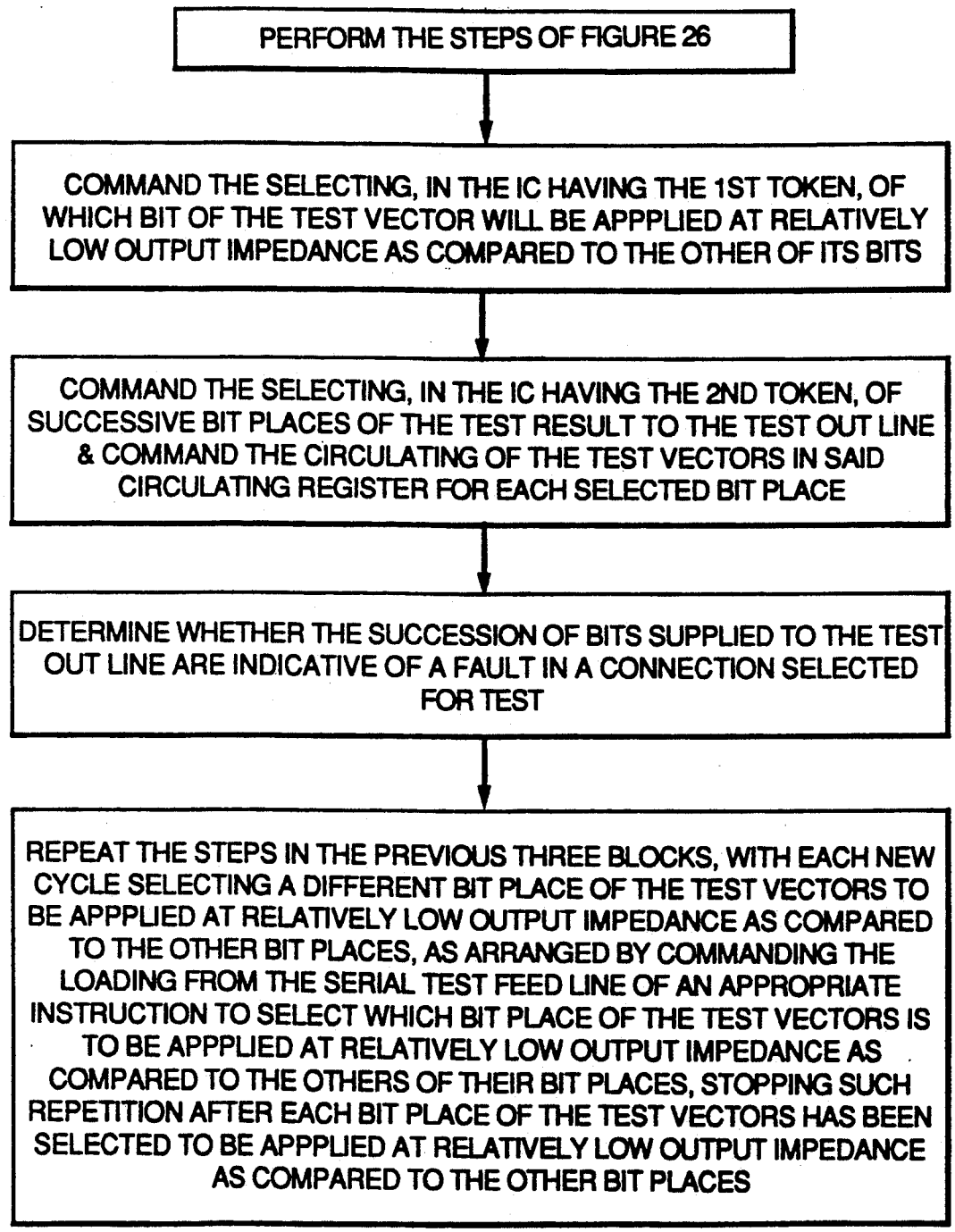
Fig. 27 A METHOD FOR TESTING INTERCONNECTIONS BETWEEN CHUNKS OF ELECTRONICS IN THE SAME ONE OF A PLURALITY OF MONOLITHIC INTEGRATED CIRCUITS CONNECTED TOGETHER IN A SYSTEM

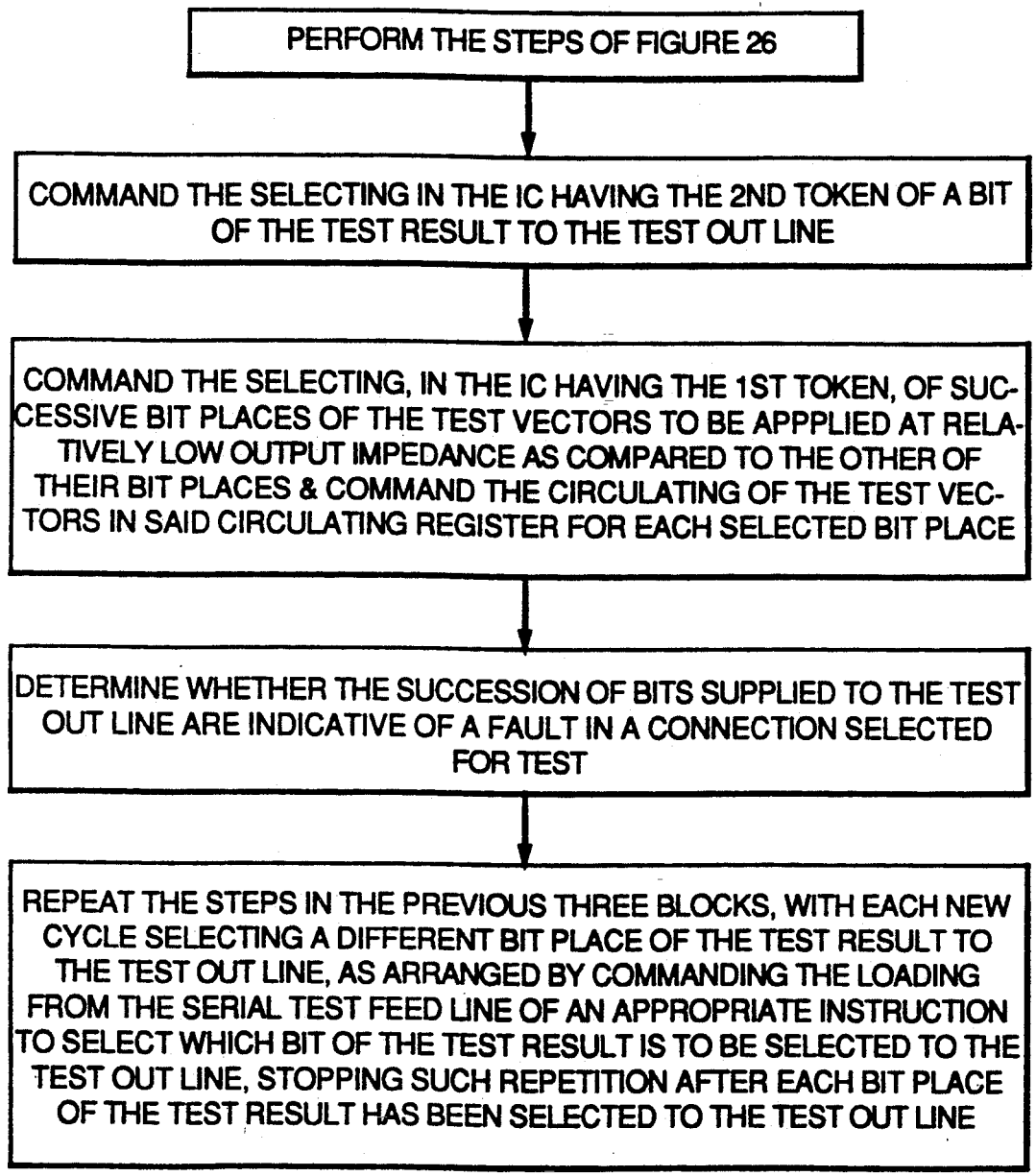
Fig. 28 A METHOD FOR TESTING INTERCONNECTIONS BETWEEN CHUNKS OF ELECTRONICS IN THE SAME ONE OF A PLURALITY OF MONOLITHIC INTEGRATED CIRCUITS CONNECTED TOGETHER IN A SYSTEM SUPPLY VIA A TOKEN SHIFT REGISTER: A 1ST TOKEN TO AT LEAST THE IC WHICH INCLUDES THE INPUT PORT OF THE CHUNK TO WHICH CONNECTIONS SELECTED FOR TEST ARE MADE, TO ENABLE EACH OF THOSE ICS TO ADMIT INTO A CIRCULATING REGISTER THEREIN A SUCCESSION OF TEST VECTORS SUPPLIED FROM A SERIAL TEST FEED LINE

↓

COMMAND THE LOADING OF A SUCCESSION OF TEST VECTORS SUPPLIED VIA A SERIAL TEST FEED LINE, TO BE ADMITTED TO THE CIRCULATING REGISTER OF EACH IC HAVING A 1ST TOKEN, THE TEST VECTORS BEING SUCH THAT EACH BIT PLACE EXHIBITS ALTERNATING ONES & ZEROES DURING THEIR CIRCULATION

↓

SUPPLY VIA THE TOKEN SHIFT REGISTER: A 1ST TOKEN JUST TO THE IC INCLUDING THE OUTPUT PORT OF THE CHUNK TO WHICH CONNECTIONS SELECTED FOR TEST ARE MADE, TO ENABLE IT TO ADMIT INTO INSTRUCTION REGISTERS THEREIN TESTING INSTRUCTIONS SUPPLIED VIA THE SERIAL TEST FEED LINE

↓

COMMAND THE LOADING OF TESTING INSTRUCTIONS SUPPLIED VIA THE SERIAL TEST FEED LINE, TO BE ADMITTED TO THE INSTRUCTION REGISTERS OF THE IC HAVING THE 1ST TOKEN, INCLUDING: AN INSTRUCTION TO ENABLE THE OUTPUT PORT OF THE CHUNK FROM WHICH CONNECTIONS SELECTED FOR TEST ARE MADE TO SUPPLY TEST RESULTS FOR THE IC CURRENTLY HAVING THE 1ST TOKEN WHEN THAT IC SUBSEQUENTLY HAS A 2ND TOKEN

Fig. 29 PRELIMINARY STEPS OF THE FIGURE 31 AND 32 METHODS OF TESTING INTERCONNECTIONS BETWEEN CHUNKS OF ELECTRONICS IN DIFFERENT ONES OF A PLURALITY OF MONOLITHIC INTEGRATED CIRCUITS CONNECTED TOGETHER IN A SYSTEM

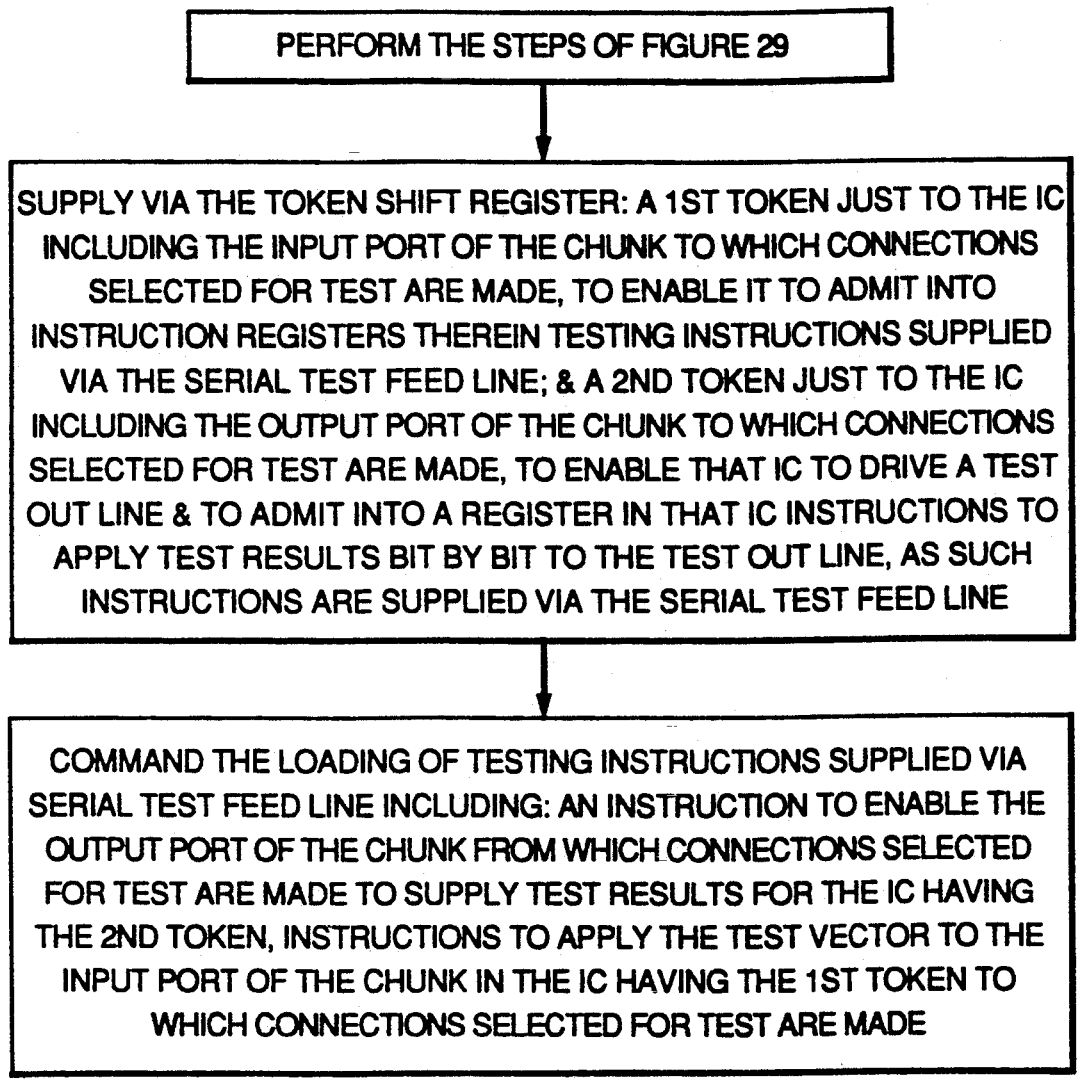
Fig. 30 FURTHER PRELIMINARY STEPS OF THE FIGURE 31 AND 32 METHODS OF TESTING INTERCONNECTIONS BETWEEN CHUNKS OF ELECTRONICS IN DIFFERENT ONES OF A PLURALITY OF MONOLITHIC INTEGRATED CIRCUITS CONNECTED TOGETHER IN A SYSTEM

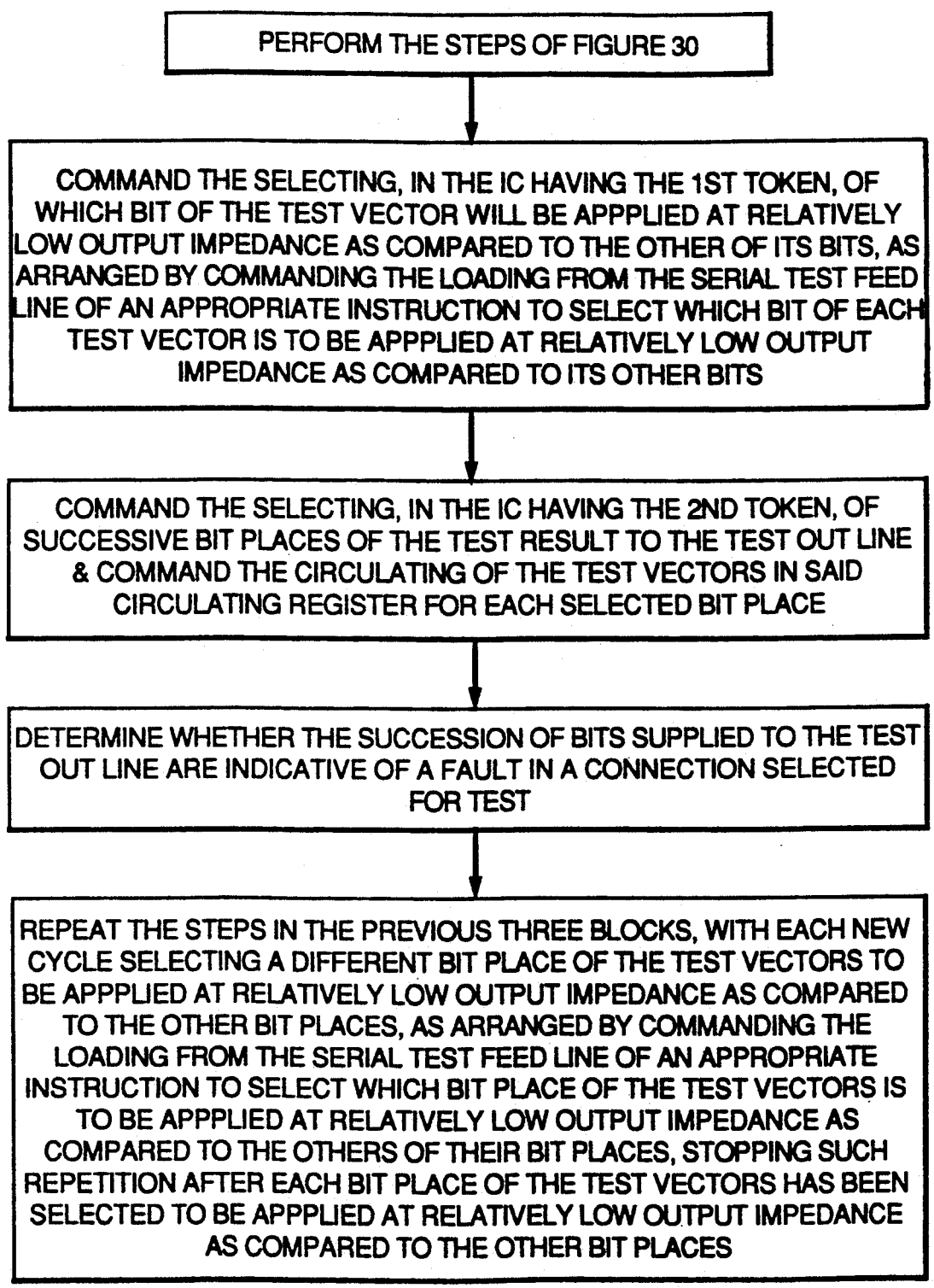
Fig. 31 A METHOD FOR TESTING INTERCONNECTIONS BETWEEN CHUNKS OF ELECTRONICS IN DIFFERENT ONES OF A PLURALITY OF MONOLITHIC INTEGRATED CIRCUITS CONNECTED TOGETHER IN A SYSTEM

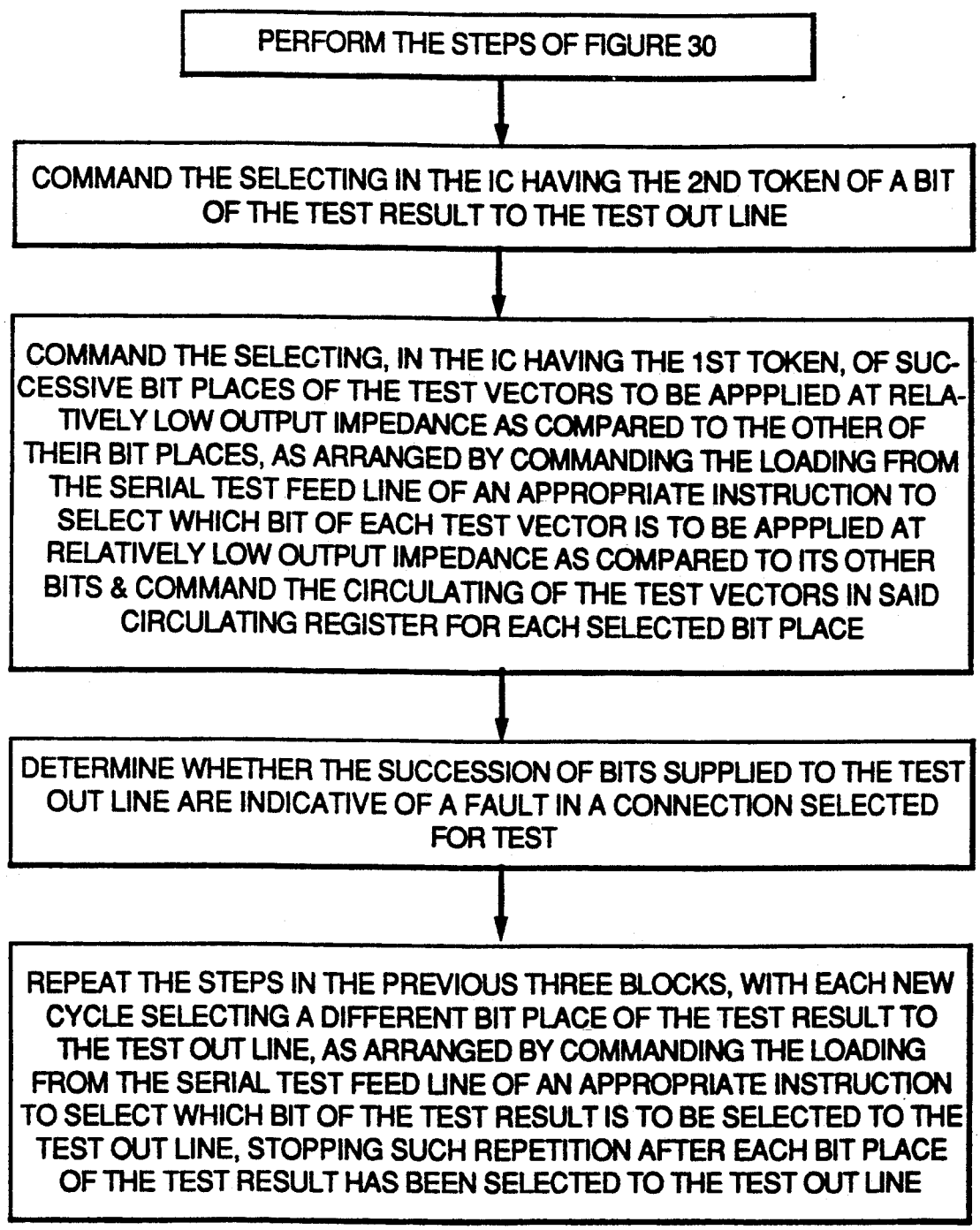
Fig. 32 A METHOD FOR TESTING INTERCONNECTIONS BETWEEN CHUNKS OF ELECTRONICS IN DIFFERENT ONES OF A PLURALITY OF MONOLITHIC INTEGRATED CIRCUITS CONNECTED TOGETHER IN A SYSTEM

TESTING OF INTEGRATED CIRCUITS INCLUDING INTERNAL TEST CIRCUITRY AND USING TOKEN PASSING TO SELECT TESTING PORTS

This is a continuation-in-part of application Ser. No. 487,481 filed Mar. 2, 1990.

The invention relates to methods of testing monolithic integrated-circuit chips provided with internal test circuitry, as can be packaged together in plural-chip integrated-circuit electronic systems.

RELATIONSHIP TO OTHER APPLICATIONS

This specification incorporates by reference U.S. Pat. No. 4,866,508 issued Sep. 12, 1989 to C. W. Eichelberger, K. B. Welles, II and R. J. Wojnarowski, entitled "INTEGRATED CIRCUIT PACKAGING CONFIGURATION FOR RAPID CUSTOMIZED DESIGN AND UNIQUE TEST CAPABILITY", and assigned to General Electric Company. A continuation application Ser. No. 363,646 of the same title was filed by the same inventors Jun. 8, 1989, contains claims to the testing circuitry and methods for a plural-chip integrated chip, and is assigned to General Electric Company. A U.S. patent application Ser. No. 487,481 allowed entitled "INTERNAL TEST CIRCUITRY FOR INTEGRATED CIRCUITS USING TOKEN PASSING TO SELECT TESTING PORTS" and assigned to General Electric Company was filed by the present inventors Mar. 2, 1990. C. W. Eichelberger, R. J. Wojnarowski and the present inventors were all obligated to assign to General Electric Company their inventions at the time their respective inventions were made.

BACKGROUND OF THE INVENTION

U.S. Pat. No. 4,866,508 describes a plural-chip integrated circuit in which a number of monolithic integrated-circuit chips are flush-mounted in wells located on the surface of a common substrate and covered over with an insulating polyimide layer. These chips are connected to each other and to on-substrate metallization by High Density Interconnection (HDI) technology. The HDI connections are made through vias in the polyimide layer to bond pads as small as 25 microns across, which can be placed anywhere on the surfaces of the monolithic i-c chips or on the substrate; and connections can be made routing right over active portions of the integrated circuits by virtue of the intervening insulating polyimide layer. Up to four layers of metal interconnection separated by insulating polyimide layers may be used. A limited number of conventional-size bond pads allowing for plural-chip i-c pin-out are provided on the substrate.

Also described is the testing circuitry included within each monolithic i-c chip. Each chip includes a serial-in/parallel-out (SIPO) register for receiving a succession of test vectors supplied thereto in bit-serial form and for cyclically applying that succession of test vectors in bit-parallel form, either to the input ports of the chip or to each output port of each preceding chip as selected by test mode signals. Each chip includes a parallel-in/serial-out (PISO) register for receiving test results in parallel-bit form, either from the output ports of the chip or from each input port of each succeeding chip as selected by test mode signals, and converting the test results to bit-serial output form. The SIPO registers on the chips are also provided with serial-out capabilities, permitting their cascade interconnection as an extended shift register, through which test vectors supplied in serial form may be successively written to each of the SIPO registers. Similarly, the PISO registers on the chips are also provided with serial-in capabilities, permitting their cascade interconnection as another extended shift register, through which test results may be successively read in serial form from each of the PISO registers.

A problem encountered in testing using the approach described in U.S. Pat. No. 4,866,508 is that access times become excessively long as the number of chips in a pluralchip integrated circuit increases, especially if the number of ports being tested per chip increases, causing increases in the lengths of the extended shift registers used for writing in test vectors to a test input port on one of the chips in the digital electronics system and for reading out test results from a test output port on that chip or another. Testing is usually carried out by isolating chunks of electronic circuitry located in respective portions of one or more monolithic integrated circuits and then subjecting the chunks to testing one at a time. (In interconnection testing, a pair of chunks at opposite ends of an interconnection are selected for testing at any one time). The successive input test patterns each have to be clocked completely through the cascaded SIPO registers for test input data before the next test pattern is entered. So substantial time is taken up during testing just to properly locate input test data in the cascade connection of SIPO registers for test input data. There is the further problem of the shifting of test output results from an extended PISO register adding to the time taken up by testing.

The problem of the extended times for testing a chunk at a time can be avoided by testing several chunks, in parallel, at the same time. However, this undesirably complicates the design of programs for automatically generating test sequences working from a software description of digital system internodal connections. To simplify the design of such programs, it is highly desirable to be able to specify on a selective-access basis the ports in a digital electronics system to which test input data are to be applied in bit-serial form and from which test output results are to be taken in bit-serial form.

Such selective access is provided by multiplexing to ports for applying test input data and from ports for sensing test output responses in systems of monolithic integrated circuit chips as described in U.S. patent application Ser. No. 487,481. It is desirable to use local switching circuitry for multiplexing the SIPO test input data registers so that multiplexing circuitry for test input data and test output results can be extended over as many portions of digital electronic systems as one may seek to test. It is also desirable to use local switching circuitry for multiplexing the test output results in real time, so as to be able to avoid the delays occasioned by the use of PISO test output data registers.

A method of providing for multiplexing used in the data communication arts is token passing, wherein local switching circuits pass among them a token (e.g., a logic ONE electric signal) possession of which grants access to a shared communications channel. Schemes are known in which transceiver stations pass only one token among themselves to determine which single transceiver shall be able to transmit data over the shared communications channel, with all transceivers not possessing the token being conditioned only to receive data. Plural token passing schemes are also known. In one such scheme transceivers pass two tokens along separate paths, the first token determining which single transceiver can transmit over the channel and the second token determining which single transceiver can receive the transmission. Plural token passing schemes are known where the path for passing the second token can contain further tokens enabling selected transceivers to receive. Relaying schemes are known where the transceivers use one communications channel and pass both the first token enabling reception and the second token enabling transmission along the same path, one after the other. None of these prior-art token passing schemes in which a shared communications channel is used simultaneously by a plurality of transceivers is appropriate for use in testing selected portions of an electronics system.

Token passing is utilized in the invention for controlling the mulitplexing of bit serial input data to portions of an electronics system under test and for controlling the multiplexing of bit-serial test results from portions of the electronics system under test, so the switching circuitry for carrying out the multiplexing of each portion of the electronics system can be local. During testing there are two channels being assigned using respective tokens. One channel is used for controlling the application of test signals and sequencing of testing and the other channel is used for extracting test results. A single portion of the electronics system under test uses both channels and does not communicate to other portions of the electronics system.

A plural-dimension addressing scheme devised by the inventors uses token passing to select the monolithic integrated circuit involved in testing (or pair of circuits interconnections between chunks) involved in testing and uses additional token passing to select the specific chunk (or pair of chunks) involved in testing.

Token passing involves a positional code and requires considerably more bits than a binary number code to indicate a selection. The shift register for implementing token passing to determine which of a set of successive ports is to be tested has reduced latency as compared to the extended test input data SIPO register, however, and to the extended test output result PISO register as well. This is because the token is normally only one bit or a few bits long, rather than several bits long as is the case with test input data and test output results. The use of binary number codes to control local switching circuitry forming the multiplexers is possible, as already noted, but the number of control lines required to convey the binary number bits in parallel is larger than one would like. Bit-serial transmission schemes for the binary number codes tend to involve the latency problem in another form, especially if the codes are made self-parsing to avoid the need for two control lines.

SUMMARY OF THE INVENTION

The objective of the invention is to allow for the speeding up the accessing of test ports in the electronics system and components thereof, by avoiding the entering of test input data through extended serial-in/parallel-out (SIPO) registers and extracting test output results through extended parallel-in/serial-out (PISO) registers, as employed in prior art approaches to test circuitry. The invention uses port-to-port multiplexing of test input data directly to the serial input port of a selected one of individual SIPO registers associated with different test input ports, rather than using time-division multiplexing of test input data to a concatenation of the individual SIPO registers. The invention also uses bit-selection multiplexing of test output data directly from a selected one of the output ports of chunks of electonic circuitry within a selected integrated circuit, rather than using time-division multiplexing of output data from a concatenation of the individual PISO registers. The port-to-port multiplexing and the bit-selection multiplexing are each controlled by token passing.

BRIEF DESCRIPTION OF THE DRAWING

FIG. 11 is a flow chart for A METHOD FOR TESTING CHUNKS OF ELECTRONICS IN A SYSTEM WITH A PLURALITY OF MONOLITHIC INTEGRATED CIRCUITS, illustrating Claims 1 and 2.

FIG. 12 is a flow chart for A METHOD FOR TESTING CHUNKS OF ELECTRONICS IN A SYSTEM WITH A PLURALITY OF MONOLITHIC INTEGRATED CIRCUITS, illustrating Claims 3 and 4.

FIG. 13 is a flow chart showing PRELIMINARY STEPS OF THE FIGS. 14 AND 15 METHODS FOR TESTING INTERCONNECTIONS BETWEEN CHUNKS OF ELECTRONICS IN THE SAME ONE OF A PLURALITY OF MONOLITHIC INTEGRATED CIRCUITS CONNECTED TOGETHER IN A SYSTEM.

FIG. 14 is a flow chart for A METHOD FOR TESTING INTERCONNECTIONS BETWEEN CHUNKS OF ELECTRONICS IN THE SAME ONE OF A PLURALITY OF MONOLITHIC INTEGRATED CIRCUITS CONNECTED TOGETHER IN A SYSTEM, together with FIG. 13 illustrating Claims 5-8 and 9.

FIG. 15 is a flow chart for A METHOD FOR TESTING INTERCONNECTIONS BETWEEN CHUNKS OF ELECTRONICS IN THE SAME ONE OF A PLURALITY OF MONOLITHIC INTEGRATED CIRCUITS CONNECTED TOGETHER IN A SYSTEM, together with FIG. 13 illustrating Claims 5-7, 10 and 11.

FIG. 16 is a flow chart showing PRELIMINARY STEPS OF THE FIGS. 17 AND 18 METHODS FOR TESTING INTERCONNECTIONS BETWEEN CHUNKS OF ELECTRONICS IN THE SAME ONE OF A PLURALITY OF MONOLITHIC INTEGRATED CIRCUITS CONNECTED TOGETHER IN A SYSTEM.

FIG. 17 is a flow chart for A METHOD FOR TESTING INTERCONNECTIONS BETWEEN CHUNKS OF ELECTRONICS IN THE SAME ONE OF A PLURALITY OF MONOLITHIC INTEGRATED CIRCUITS CONNECTED TOGETHER IN A SYSTEM, together with FIG. 16 illustrating Claims 12-15 and 16.

FIG. 18 is a flow chart for A METHOD FOR TESTING INTERCONNECTIONS BETWEEN CHUNKS OF ELECTRONICS IN THE SAME ONE OF A PLURALITY OF MONOLITHIC INTEGRATED CIRCUITS CONNECTED TOGETHER IN A SYSTEM, together with FIG. 16 illustrating Claims 12-14, 17 and 18.

FIG. 19 is a flow chart showing PRELIMINARY STEPS OF THE FIGS. 21 AND 22 METHODS OF TESTING INTERCONNECTIONS BETWEEN CHUNKS OF ELECTRONICS IN DIFFERENT ONES OF A PLURALITY OF MONOLITHIC INTEGRATED CIRCUITS CONNECTED TOGETHER IN A SYSTEM.

FIG. 20 is a flow chart showing FURTHER PRELIMINARY STEPS OF THE FIGS. 21 AND 22 METHODS OF TESTING INTERCONNECTIONS BETWEEN CHUNKS OF ELECTRONICS IN DIFFERENT ONES OF A PLURALITY OF MONOLITHIC INTEGRATED CIRCUITS CONNECTED TOGETHER IN A SYSTEM.

FIG. 21 is a flow chart for A METHOD FOR TESTING INTERCONNECTIONS BETWEEN CHUNKS OF ELECTRONICS IN DIFFERENT ONES OF A PLURALITY OF MONOLITHIC INTEGRATED CIRCUITS CONNECTED TOGETHER IN A SYSTEM, together with FIGS. 19 and 20 illustrating Claims 19-22 and 23.

FIG. 22 is a flow chart for A METHOD FOR TESTING INTERCONNECTIONS BETWEEN CHUNKS OF ELECTRONICS IN DIFFERENT ONES OF A PLURALITY OF MONOLITHIC INTEGRATED CIRCUITS CONNECTED TOGETHER IN A SYSTEM, together with FIGS. 19 and 20 illustrating Claims 19-21, 24 and 25.

FIG. 23 is a flow chart for A METHOD FOR TESTING INTERCONNECTIONS BETWEEN CHUNKS OF ELECTRONICS IN DIFFERENT ONES OF A PLURALITY OF MONOLITHIC INTEGRATED CIRCUITS CONNECTED TOGETHER IN A SYSTEM, together with FIG. 19 illustrating Claims 26-28.

FIG. 24 is a flow chart for A METHOD FOR TESTING INTERCONNECTIONS BETWEEN CHUNKS OF ELECTRONICS IN DIFFERENT ONES OF A PLURALITY OF MONOLITHIC INTEGRATED CIRCUITS CONNECTED TOGETHER IN A SYSTEM, together with FIG. 19 illustrating Claims 29 and 30.

FIG. 25 is a flow chart for A METHOD FOR TESTING INTERCONNECTIONS BETWEEN CHUNKS OF ELECTRONICS IN DIFFERENT ONES OF A PLURALITY OF MONOLITHIC INTEGRATED CIRCUITS CONNECTED TOGETHER IN A SYSTEM, illustrating Claims 31 and 32.

FIG. 26 is a flow chart for PRELIMINARY STEPS OF THE FIGS. 27 AND 28 METHODS FOR TESTING INTERCONNECTIONS BETWEEN CHUNKS OF ELECTRONICS IN A MONOLITHIC INTEGRATED CIRCUIT.

FIG. 27 is a flow chart for A METHOD FOR TESTING INTERCONNECTIONS BETWEEN CHUNKS OF ELECTRONICS IN THE SAME ONE OF A PLURALITY OF MONOLITHIC INTEGRATED CIRCUITS CONNECTED TOGETHER IN A SYSTEM, together with FIG. 26 illustrating Claims 33-38.

FIG. 28 is a flow chart for A METHOD FOR TESTING INTERCONNECTIONS BETWEEN CHUNKS OF ELECTRONICS IN THE SAME ONE OF A PLURALITY OF MONOLITHIC INTEGRATED CIRCUITS CONNECTED TOGETHER IN A SYSTEM, together with FIG. 26 illustrating Claims 33-36, 39 and 40.

FIG. 29 is a flow chart for PRELIMINARY STEPS OF THE FIGS. 31 AND 32 METHODS OF TESTING INTERCONNECTIONS BETWEEN CHUNKS OF ELECTRONICS IN DIFFERENT ONES OF A PLURALITY OF MONOLITHIC INTEGRATED CIRCUITS CONNECTED TOGETHER IN A SYSTEM.

FIG. 30 is a flow chart for FURTHER PRELIMINARY STEPS OF THE FIGS. 31 AND 32 METHODS OF TESTING INTERCONNECTIONS BETWEEN CHUNKS OF ELECTRONICS IN DIFFERENT ONES OF A PLURALITY OF MONOLITHIC INTEGRATED CIRCUITS CONNECTED TOGETHER IN A SYSTEM.

FIG. 31 is a flow chart for A METHOD FOR TESTING INTERCONNECTIONS BETWEEN CHUNKS OF ELECTRONICS IN DIFFERENT ONES OF A PLURALITY OF MONOLITHIC INTEGRATED CIRCUITS CONNECTED TOGETHER IN A SYSTEM, together with FIGS. 29 and 30 illustrating Claims 41-46.

FIG. 32 is a flow chart for A METHOD FOR TESTING INTERCONNECTIONS BETWEEN CHUNKS OF ELECTRONICS IN DIFFERENT ONES OF A PLURALITY OF MONOLITHIC INTEGRATED CIRCUITS CONNECTED TOGETHER IN A SYSTEM, together with FIGS. 29 and 30 illustrating Claims 41-44, 47 and 48.

DETAILED DESCRIPTION

Digital electronics systems with built-in test circuitry may be constructed by high density interconnection (HDI) of monolithic integrated circuits mounted on a common substrate, as described above in the "Background of Invention". Implementation of such systems is facilitated by the monolithic integrated circuits being constructed to a standard with regard to their respective built-in test circuitry, which standard can be one of the types described further on in this specification. The portion of the electronics system included within such a chip is usually subdivided into chunks of electronic circuitry that one wishes to test individually, each of which chunks has during normal operation at least one respective output port for digital signal, and many of which chunks each have during normal operation at least one respective input port for digital signal. If a chunk has more than one input port during normal operation, usually these input ports are aligned with each other to form a single input port of extended bit width for testing. If a chunk has more than one output port during normal operation, usually these output ports are aligned with each other to form a single output port of extended bit width for testing, the bits of which port are polled one after the other.

Figure 1:
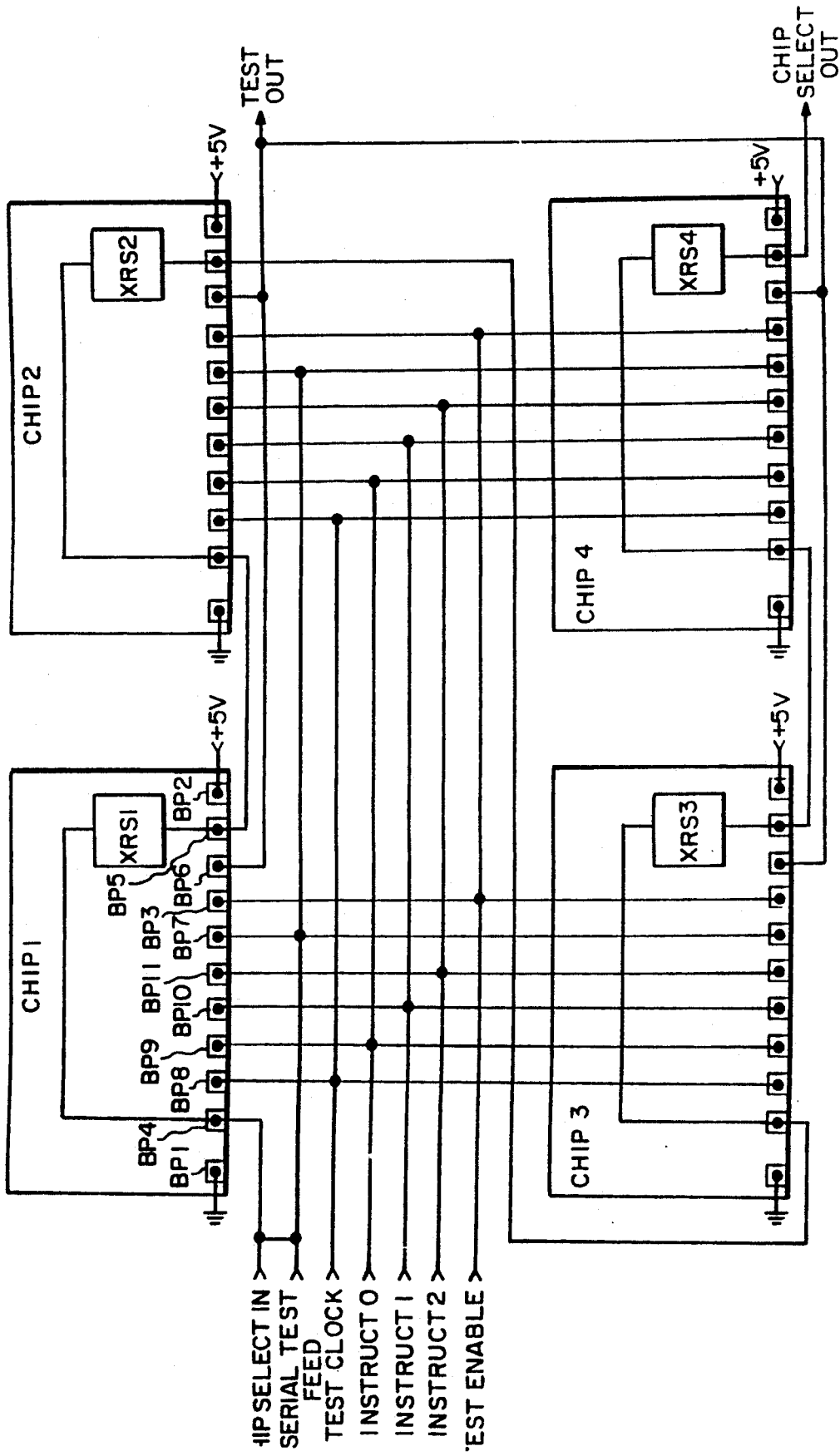
FIG. 1 is a block schematic diagram of a plural-chip integrated circuit formed by mounting on a common substrate a plurality of monolithic integrated-circuit chips each of which has built-in test circuitry, showing the interconnections of those monolithic integrated circuits to facilitate testing according to the methods of the invention.

FIG. 1 shows a digital electronics system that is a plural-chip integrated circuit having four monolithic integrated circuit chips CHIP1, CHIP2, CHIP3 and CHIP4. Each of these chips has full-size bond pads (indicated by small squares) at standardized locations therein and contains standardized built-in test circuitry (not specifically shown). Relatively negative (0 V.) and relatively positive (+5 V.) operating voltages are supplied in parallel to first and second full-sized bond pads BP1 and BP2 respectively of each of the chips CHIP1, CHIP2, CHIP3 and CHIP4 of the FIG. 1 plural-chip integrated circuit during its testing, which application of operating voltages may also be done during normal operation of the plural-chip integrated circuit. A TEST ENABLE bus connects to each of the chips CHIP1, CHIP2, CHIP3 and CHIP4 for applying to them a mode-controlling TEST ENABLE signal, which TEST ENABLE signal has a first state during testing and has a second state during normal operation. In the standardized testing circuitry developed by the inventors these first and second states are logic ONE and logic ZERO, respectively. A TEST CLOCK bus connects to each of the chips CHIP1, CHIP2, CHIP3 and CHIP4. The TEST CLOCK bus is supplied a square wave, transitions of which are used to synchronize the respective generation on each of these chips of non-overlapping plural phases of clocking signal. Alternatively, to avoid the need for generating non-overlapping two-phase clocking signal on each monolithic integrated circuit chip, two TEST CLOCK lines may be used to distribute non-overlapping two-phase clocking signal to all the chips. A SERIAL TEST FEED bus connects to each of the chips CHIP1, CHIP2, CHIP3 and CHIP4. Data for controlling the generation of test input vectors, for controlling the application of those test input vectors, and for controlling the bit selection of test output results are applied, on a time-division-multiplexed basis, in serial form via the SERIAL TEST FEED bus. A TEST OUT bus connects from each of the chips CHIP1, CHIP2, CHIP3 and CHIP4 for receiving the test output results of a selected one of them in serial form.

Time-division-multiplexed testing of CHIP1, CHIP2, CHIP3 and CHIP4 is controlled responsive to token signals passed to each in turn through an extended shift register, the zeroeth shift register, a respective segment of which extended or zeroeth shift register is located in each of the chips. The zeroeth shift register extends from a SELECT IN terminal to a SELECT OUT terminal, and comprises the cascaded segments XRS1 (in CHIP1), XRS2 (in CHIP2), XRS3 (in CHIP3) and XRS4 (in CHIP4). Depending on one's desires, the SELECT IN terminal can be connected to the SERIAL TEST FEED terminal, as shown, or can be kept apart from the SERIAL TEST FEED terminal.

A plural-line INSTRUCTION bus for carrying respective bits of plural-bit instruction codes connects to each of the chips CHIP1, CHIP2, CHIP3 and CHIP4. FIG. 1 shows an INSTRUCTION bus comprising three lines INSTRUCT0, INSTRUCT1 and INSTRUCT2. One of the instruction codes controls the selective clocking of the zeroeth, extended shift register. Another of the instruction codes controls the successive selection to the TEST OUT bus of the bits of the output test results that are generated in parallel in the one of the chips CHIP1, CHIP2, CHIP3 and CHIP4 that is selected, or enabled, for testing by a CHIP OUTPUT ENABLE token passed via the zeroeth, extended shift register. Certain other of the instruction codes control demultiplexing of serial data on the SERIAL TEST FEED bus within the one of the chips CHIP1, CHIP2, CHIP3 and CHIP4 selected, or enabled, for testing by a CHIP SELECT token passed via the zeroeth, extended shift register.

Consider now the circuitry, especially the built-in test circuitry, which is to be found within each of the chips CHIP1, CHIP2, CHIP3 and CHIP4 of FIG. 1 and other chips of a standard type. This circuitry as found on one such chip CHIP 1 comprises that shown in FIGS. 2–6. (The FIG. 6 portion of the circuitry is a reiteration of the FIG. 5 portion of the circuitry, which FIG. 5 portion of the circuitry is generally replicated several fold.) This circuitry shown in FIGS. 2–6 uses token passing to address the test input ports and test output ports in both chip-selection and chunk-selection dimensions. Token passing in the zeroeth, extended shift register selects the chip containing the test input port, and further token passing selects the chunk containing the test output port.

Figure 2:
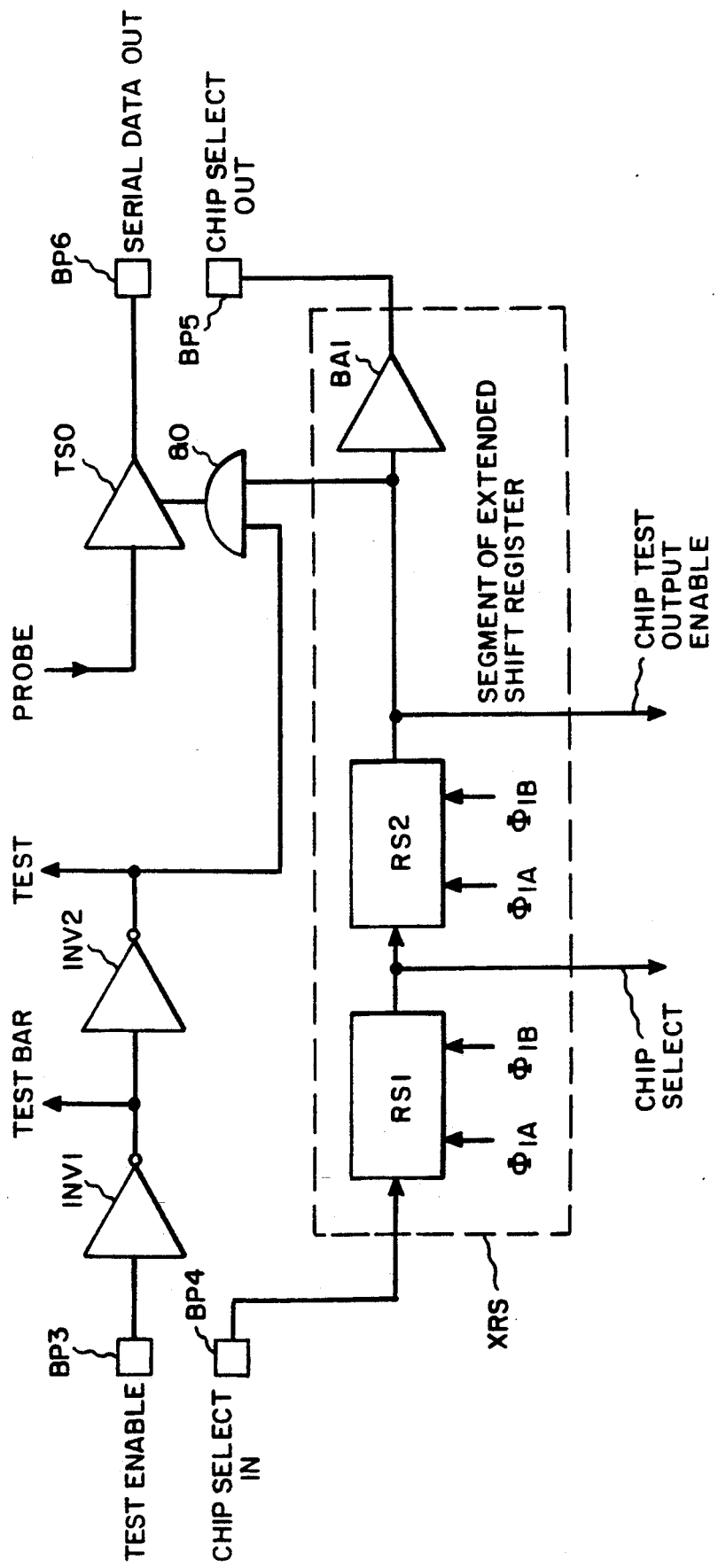
FIGS. 2, 3, 4, 5 and 6 are block schematic diagrams of respective portions of the built-in test circuitry in a monolithic integrated circuit as used in a plural-chip integrated circuit of the type illustrated in FIG. 1.

FIG. 2 shows a third full-size bond pad BP3 located on the chip, connected from the TEST ENABLE bus, and connected to the input port of a logic inverter INV1. Logic inverter INV1 responds to TEST ENABLE signal supplied via TEST ENABLE bus to generate a complementary TESTBAR signal at its output port. TESTBAR signal is applied to the input port of a further logic inverter INV2 which provides at its output port buffered TEST signal complementary to TESTBAR. The use of the TEST and TESTBAR signals in other circuitry on the chip will be explained further on in this specification. A fourth full-sized bond pad BP4 and a fifth full-size bond pad BP5 include between them a segment XRS of the zeroeth, extended shift register. The extended shift register segment XRS comprises, in cascade connection, shift register stages RS1 and RS2 and a buffer amplifier BA1. A logic ONE in the initial shift stage RS1 provides a CHIP SELECT token to circuitry in FIG. 3, to enable the selective generation of two-phase clock signals $\Phi_{34A}$ and $\Phi_{34B}$ for a first shift register SR1 that stores at least one input test vector, two-phase clock signals $\Phi_{5A}$ and $\Phi_{5B}$ for a third shift register SR3 that stores a test vector mask, and two-phase clock signals $\Phi_{6A}$ and $\Phi_{6B}$ for a fourth shift register SR4 that stores CHUNK SELECTION token signals for a plurality of chunks M in number.

Figure 3:
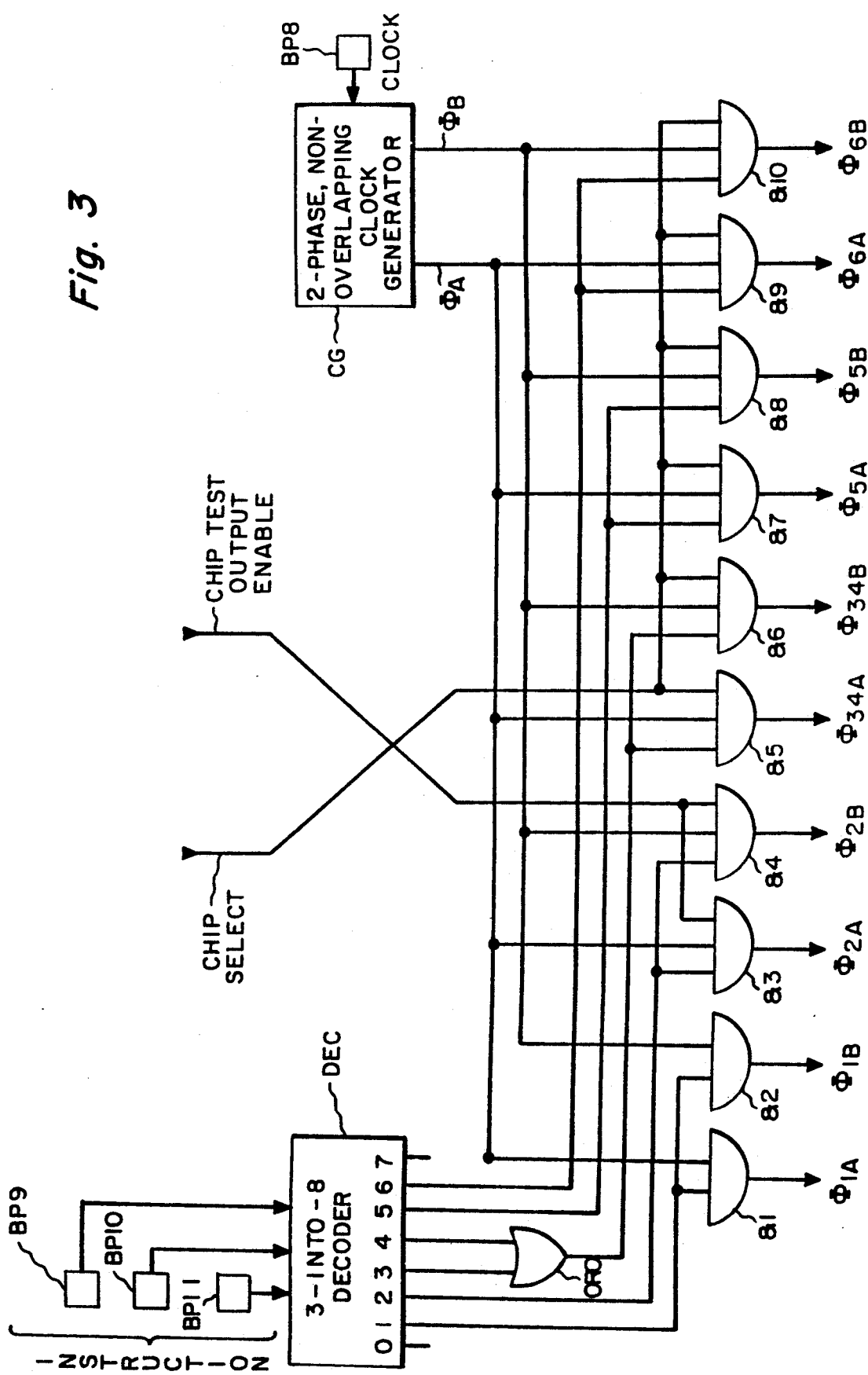
Figure 4:
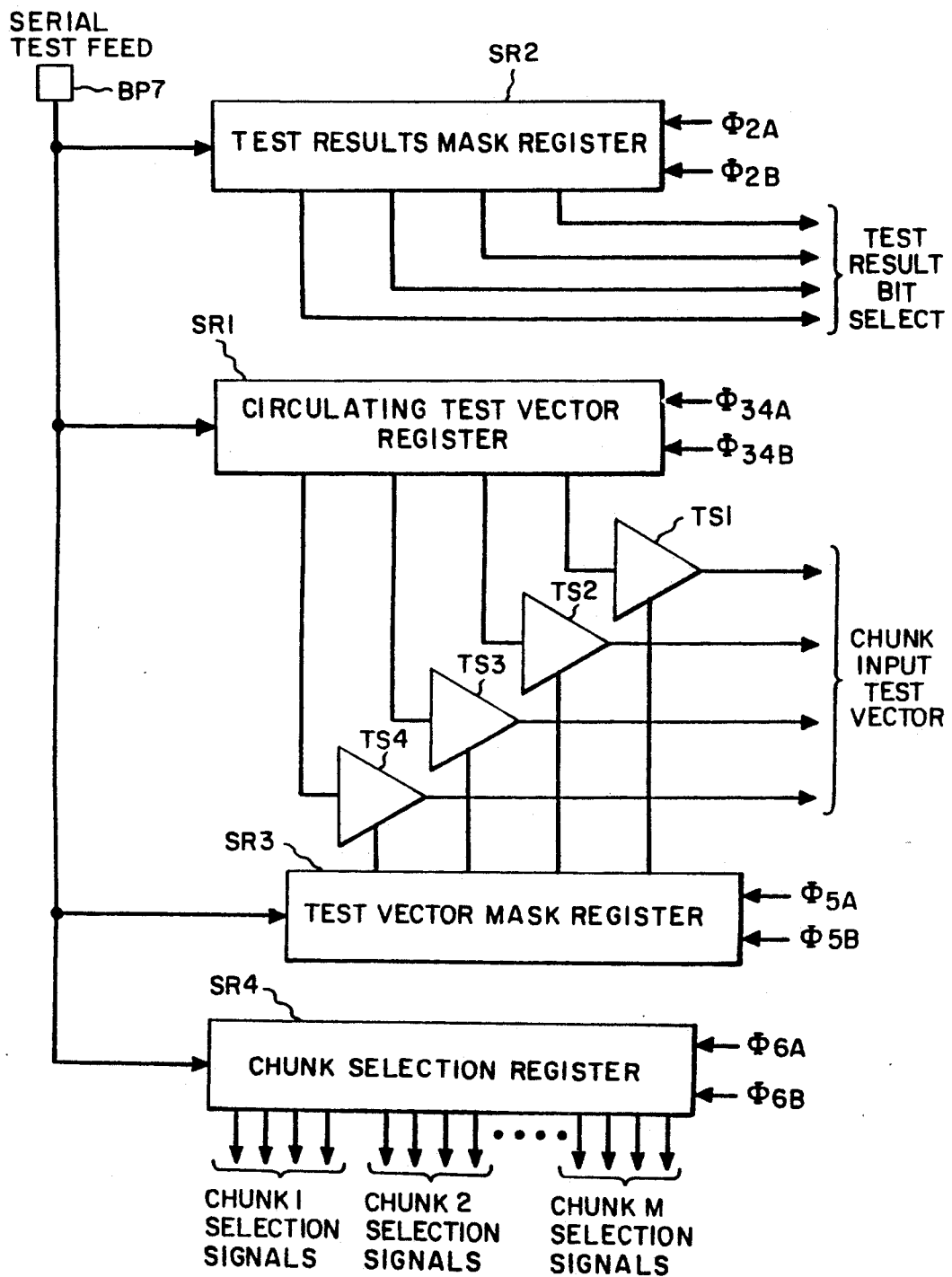
Figure 5:
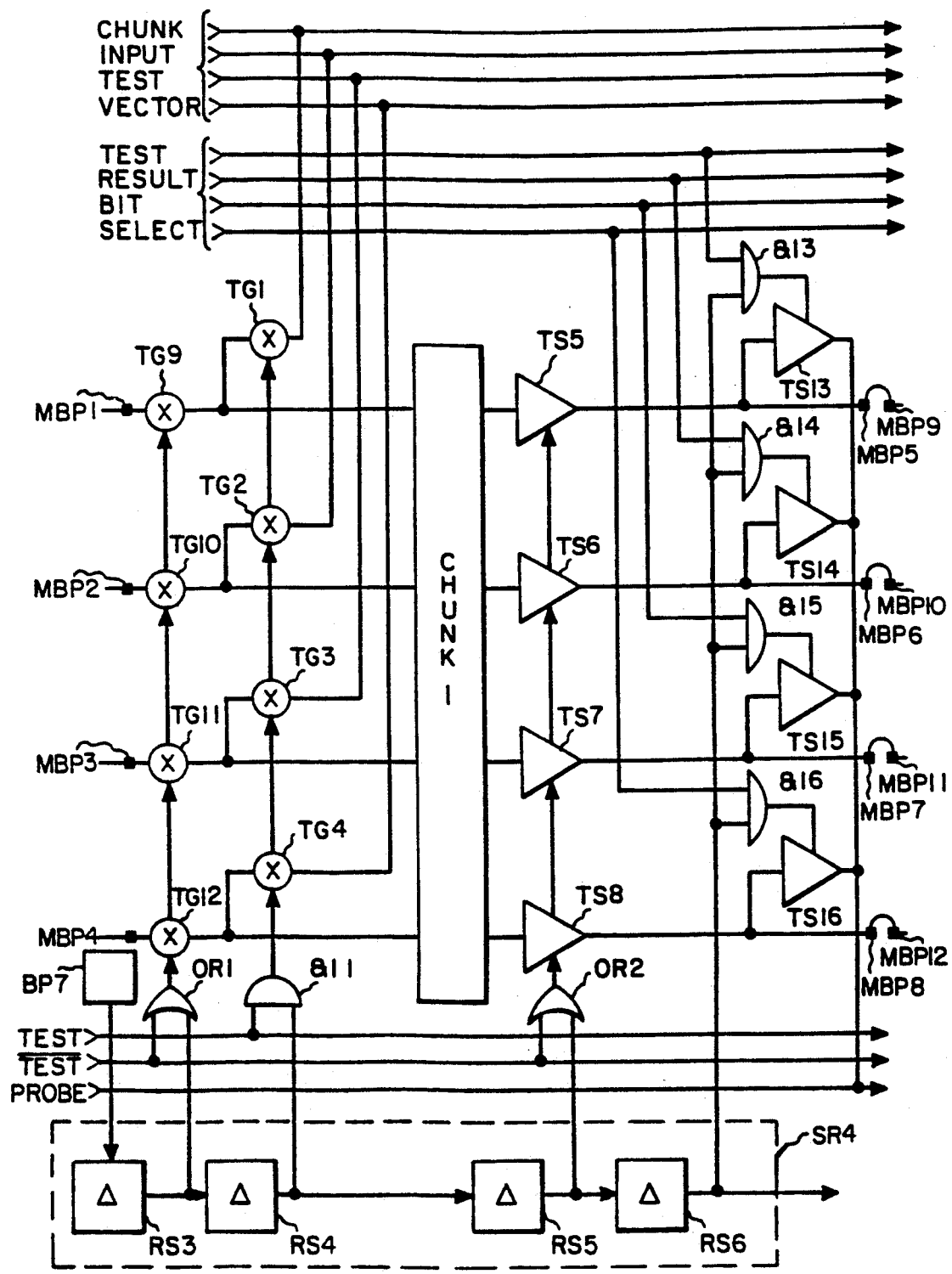
Figure 6:
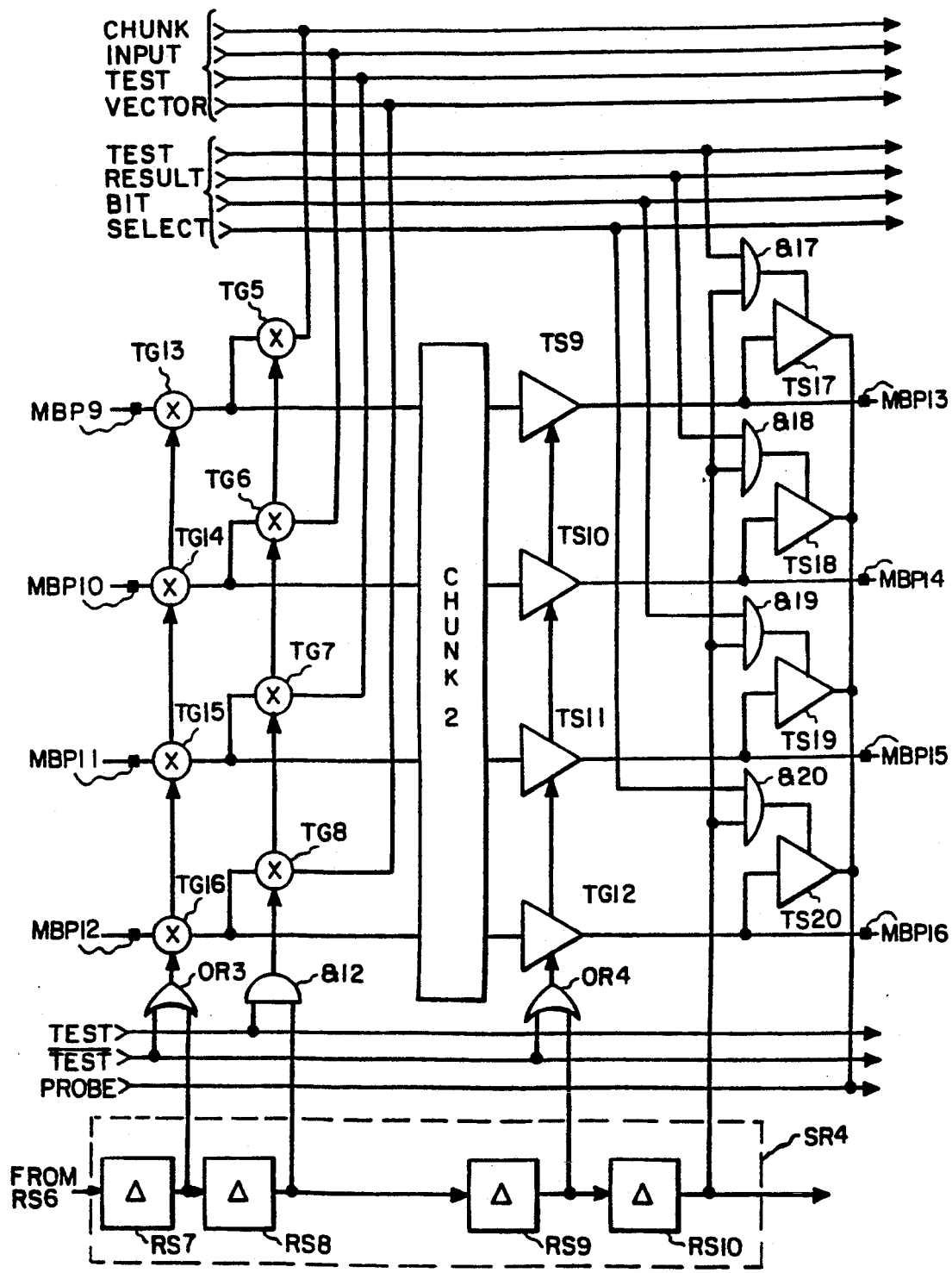

In FIG. 2 a logic ONE in the final shift stage RS2 provides a CHIP TEST OUTPUT ENABLE token to circuitry in FIG. 3 therein to enable the selective application of clock signals to the second shift register SR2 in FIG. 4, which stores a test result mask that is used to select which bit of the test output port of a selected chunk is supplied to a PROBE bus. In FIG. 2 the CHIP TEST OUTPUT ENABLE signal and the TEST EN- ABLE signal concurrently being logic ONEs causes a logic ONE response from an AND gate &0. The ONE response from AND gate &0 conditions a powerful tristate driver TSO to apply, to a full-size bond pad BP6 connected to the TEST OUT bus, the logic condition on the PROBE bus to which the output connections of chunks of electronic circuitry are polled. This polling is done using procedures that will be described in more detail when FIGS. 5 and 6 are considered in detail.

FIG. 4 shows shift registers SR1, SR3 and SR4 and another shift register SR2 that stores a test result mask. The CHIP SELECT token enables the selective loading of serial input data applied to a full-size bond pad BP7 in FIG. 4 to shift registers SR1, SR2, SR3 and SR4 of the chip under consideration and enables the subsequent shifting of that data through these registers.

The first shift register SR1 is preferably of a type that can store a plurality, p in number, of input test vectors and could as described in U.S. Pat. No. 4,866,508 consist of a shift register providing parallel data output signal from every $p^{th}$ one of successive shift register stages. As will be described further on, in reference to FIG. 7, such a shift register can be modified so as to permit electrically controlled reconnection of its shift stages in a plurality of looped shift register connections, each having p shift stages therein. This permits the plurality of p input test vectors to be circulated in their application to test input ports of the circuitry to be tested.

During the testing of interconnections between circuitry chunks only one bit position at a time in the interconnection under test is to be driven with the bits of input test vectors stored in the first shift register SR1. Accordingly, as shown in FIG. 4, the application of the bits of test vectors from the parallel data output port of register SR1 to the input port or paralleled input ports of each electronic circuitry chunk on the chip is selectively made from low source impedances using tristate drivers TS1, TS2, TS3, TS4, etc. The source impedances appearing at the output ports of the tristate drivers TS1, TS2, TS3, TS4, etc. are controlled by the logic conditions stored in respective stages of the third shift register SR3. Each stage of the third shift register SR3 either: holds a ONE to condition a respective one of these tristate drivers to apply its response at relatively low impedance to the electronic circuitry chunks, or holds a ZERO to condition that respective tristate driver to exhibit relatively high impedance to the electronic circuitry chunks. The pattern of ONEs and ZEROs in the shift register SR3 is a mask for applying test vectors. The mask has a ZERO at each position corresponding to a connection to an input port of a chunk under test that is to be driven from relatively high source impedance, and the mask has a ONE at each position corresponding to a connection to the input port of the chunk under test that is to be driven from a relatively low source impedance.

The fourth shift register SR4, shown in FIG. 4 is a part of the chunk selection circuitry for isolating each chunk of electronic circuitry and testing its response. This circuitry will be described in detail further on in this specification, referring to FIGS. 5 and 6.

In a digital electronics system to be tested having the built-in test circuitry, the shift register stages in the respective segments of a zeroeth shift register on the component chips are connected in cascade to form the extended zeroeth shift register for passing token signals, as noted in regard to FIG. 1. In the circuitry of FIG. 2 (and FIGS. 3–6) these CHIP SELECT and CHIP OUTPUT ENABLE token signals, each a respective logic ONE bit, are usually applied by a conventional tester one after the other during successive TEST CLOCK cycles to the SELECT IN port of the zeroeth, extended shift register and clocked forward by the selective application of clocking signals to the segment XRS and other segments of that extended shift register. This selective application of clocking signals is done responsive to the first plural-bit instruction code being applied to the INSTRUCT0, INSTRUCT1 and INSTRUCT2 lines of the INSTRUCTION bus. When doing functional testing, the two ONEs response in the shift stages RS1 and RS2 of the chip on which the chunk being tested is located. When testing the HDI interconnections between two chunks on the same chip, using a succession of test vectors applied one bit at a time, the two successive ONEs also repose in the shift stages RS1 and RS2 of the chip being tested. A logic ONE in shift stage RS1 is a first token, which is a CHIP SELECT signal that enables the selective application of test vectors to the chip selected by its possession of that first token. A logic ONE in shift stage RS2 is a second token, which is a CHIP TEST OUTPUT ENABLE signal that enables the selective extraction of test results from the chip selected by its possession of that second token.

The chunk selection circuitry, which is shown in FIGS. 5 and 6 and will be described in detail further on in this specification, provides for isolating each chunk of electronic circuitry and testing its response. The chunk selection circuitry also provides for testing HDI interconnections between a preceding chunk of electronic circuitry and a succeeding chunk, by driving test values from the input port of the succeeding chunk of electronic circuitry to the output port of the preceding chunk in accordance with the testing philosophy set forth by C. W. Eichelberger, K. B. Welles, II and R. J. Wojnarowski in the references cited above.

When testing the high-density interconnections from the output port of a chunk on a first chip to the input port of a chunk on a second chip, a ZERO and a ONE are stored in the successive stages of the zeroeth shift register segment on the first chip and a ONE and a ZERO are stored in the successive stages of the zeroeth shift register segment on the second chip. Where the chunks on the first chip are in a pipeline that continues through the chunks on the second chip, connection of the SELECT OUT port of the zeroeth shift register segment in the first chip directly to the SELECT IN port of the zeroeth shift register segment in the second chip permits the passing of the doublly-repeated-ONE when sequentially performing all testing procedures on the pipeline.

When logic flow through a network is not restricted to non-branching pipelines, a pair of separate ONEs with appropriate numbers of ZEROs therebetween will have to be passed through the zeroeth, extended shift register. In the design of chips for implementing a digital electronics system, a consideration that can be made is the partitioning of the system among the chips to reduce the number of special patterns of token signals required for chip selection, possibly controlling the testing of a plurality of different chip-to-chip high-density interconnections by using a single special token pattern differently positioned in the zeroeth, extended shift register.

In FIG. 3 a clock generator CG receives a square-wave signal applied to an eighth full-sized bond pad BP8 via TEST CLOCK bus and generates plural phases of clocking signal that are selectively applied to parts of the built-in test circuitry to control its operation. This clocking signal can be separate from clocking signals that are employed during normal operation and are applied to the chip via its HDI bond pads. When shift register stages as shown in FIGS. 4-6 are used, clock generator CG generates two phases $\Phi_A$ and $\Phi_B$ of clocking signal that are respectively logic ONE during alternate non-overlapping time periods and that are otherwise logic ZERO. Alternatively, to avoid the need for generating non-overlapping two-phase clocking signal on each monolithic integrated circuit chip, as noted previously, two TEST CLOCK lines may be used to distribute non-overlapping two-phase clocking signal to all the chips.

The three-into-eight decoder DEC in FIG. 3 provides response to eight instruction codes received via the INSTRUCT0, INSTRUCT1 and INSTRUCT2 instruction lines, compliance with only the first of which codes has been thus far considered. A representative set of eight instruction codes and their corresponding instructions is tabulated immediately hereafter.

| CODE | INSTRUCTION |
|---|---|
| 000 | Reserved For other use |
| 001 | Shift the contents of the shift stages in the clocked CHIP SELECT bus storing CHIP SELECT and CHIP TEST OUTPUT ENABLE bits and load new bits serially into the zeroeth, extended shift register. |
| 010 | Shift contents of the second shift register SR2 storing OUTPUT TEST RESULT MASK bits and load new bits serially into the second shift register SR2. |
| 011 | Load new bits serially from said SERIAL TEST FEED bus into the first shift register SR1 storing input test vectors. |
| 100 | Circulate the input test vectors stored in first shift register SR1, for testing chunk functionality or high-density interconnection. |
| 101 | Shift contents of the third shift register SR3 storing INPUT TEST VECTOR MASK bits and load new bits serially into the third register SR3. |
| 110 | Shift contents of the fourth shift register SR4 storing CHUNK SELECT SIGNAL bits and load new bits serially into the fourth register SR4. |
| 111 | Reserved for other use |

The first instruction is unconditionally followed in all chips receptive thereof to selectively generate $\Phi_{1A}$ and $\Phi_{1B}$ phases of clocking signal for application to the respective zeroeth extended shift register segment XRS comprising shift register stages RS1 and RS2 followed in cascade by buffer amplifier BA1. The instructions associated with codes 010, 011, 100, 101 and 110 are conditionally followed in each chip receptive thereof. In FIG. 3 AND gates &3 and &4 respond to $\Phi_A$ and $\Phi_B$ clocking signal phases to supply $\Phi_{2A}$ and $\Phi_{2B}$ to the second shift register SR2 of FIG. 4 only if the CHIP OUTPUT ENABLE signal stored in shift register stage RS2 is a ONE, as well as the second instruction code 010 being supplied to decoder DEC from the INSTRUCT0, INSTRUCT1 and INSTRUCT2 lines of the INSTRUCTION bus via full-size bond pads BP9, BP10 and BP11. In FIG. 2 either the third instruction code 011 or the fourth instruction code 100 causes an OR gate ORO after decoder DEC to supply a ONE to AND gates &5 and &6. The CHIP SELECT signal from shift register stage RS1 must also be a ONE to enable AND gates &5 and &6 to respond to clocking signal phases to generate clocking signal phases $\Phi_{34A}$ and $\Phi_{34B}$ applied to the first shift register SR1 of FIG. 4. In FIG. 2 AND gates &7 and &8 respond to $\Phi_A$ and $\Phi_B$ clocking signal phases to supply $\Phi_{5A}$ and $\Phi_{5B}$ clocking phases to the third shift register SR3 of FIG. 4 only if the CHIP SELECT signal stored in shift register stage RS2 is a ONE as well as the fifth instruction code 101 being supplied to decoder DEC from the INSTRUCT0, INSTRUCT1 and INSTRUCT2 lines of the INSTRUCTION bus via bond pads BP9, BP10 and BP11. In FIG. 2 AND gates &9 and &10 respond to $\Phi_A$ and $\Phi_B$ clocking signal phases to supply $\Phi_{6A}$ and $\Phi_{6B}$ clocking phases to the fourth shift register SR4 of FIG. 4 only if the CHIP SELECT signal stored in shift register stage RS2 is a ONE as well as the sixth instruction code 110 being supplied to decoder DEC.

The zeroeth, extended shift register is operated so it contains only two ONEs at any time, so phase that only one of them at a time is in a shift register stage that generates a CHIP SELECT signal and the other is in a shift register stage that generates a CHIP TEST OUTPUT ENABLE signal. Accordingly, each of the third through sixth instruction codes enables selective application of clocking signals in only a selected one of the chips to which the INSTRUCTION bus connects, the one of the chips having a ONE in its shift register stage that generates the CHIP SELECT signal. The second instruction code enables selective application of clocking signals in only a selected one of the chips to which the INSTRUCTION bus connects, the one of the chips having a ONE in its shift register stage that generates a CHIP TEST OUTPUT ENABLE signal. The second through sixth instruction codes can be applied only one at a time to the INSTRUCT0, INSTRUCT1 and INSTRUCT2 lines of the INSTRUCTION bus connecting to bond pads BP9, BP10 and BP11. The second, third, fifth and sixth instruction codes accordingly provide for the time-division-multiplexed loading of the bit stream supplied via the SERIAL TEST FEED bus to bond pad BP7 into the shift registers shown in FIG. 4. Loading is done through the respective serial data input ports of the the first shift register SR1, the third shift register SR3 and the fourth shift register SR4 of the chip selected by the CHIP SELECT token and into the serial data input ports of the second shift register SR2 of the chip selected by the CHIP TEST OUTPUT ENABLE token.

FIGS. 5 and 6 show representative chunks CHUNK1 and CHUNK2, respectively, of electronic circuitry on one of the chips of the electronic system and portions of the built-in test circuitry serving them. The "mini" bond pads MBP1, MBP2, MBP3 and MBP4 are associated with high density interconnections that are selectively made to the input port of CHUNK1. The "mini" bond pads MBP5, MBP8, MBP7 and MBP8 are associated with high density interconnections that are selectively made from the test output port of CHUNK1. The "mini" bond pads MBP9, MBP10, MBP11 and MBP12 are associated with high density interconnections that are selectively made to the input port of CHUNK1. The "mini" bond pads MBP13, MBP14, MBP15 and MBP16 are associated with high density interconnections that are selectively made to the input port of CHUNK1. High-density interconnections M1, M2, M3 and M4, respectively connect together "mini" bond pad MBP5 of CHUNK1 to "mini" bond pad MBP9 of CHUNK2, "mini" bond pad MBP8 of CHUNK1 to "mini" bond pad MBP10 of CHUNK2, "mini" bond pad MBP7 of CHUNK1 to "mini" bond pad MBP11 of CHUNK2 and "mini" bond pad MBP8 of CHUNK1 to "mini" bond pad MBP12 of CHUNK2.

During normal operation of the chip, the TEST ENABLE signal is a ZERO, causing ZERO output responses from AND gates &11 of FIG. 5, &12 of FIG. 6, and so forth, which AND gates receive TEST signal. In FIG. 5 AND gate &11 output response being a ZERO conditions transmission gates TG1, TG2, TG3 and TG4 to be non-conductive and not apply chunk input test vector (from tristate drivers TS1, TS2, TS3 and TS4 of FIG. 4) to the test input port of CHUNK1; in FIG. 6 AND gate &12 output response being a ZERO conditions transmission gates TG5, TG6, TG7 and TG8 to be non-conductive and not to apply chunk input test vector to the test input port of CHUNK2; and so forth for any other chunks of electronic circuitry on the same chip.

During normal operation of the chip, the TESTBAR signal is a ONE, causing ONE output responses from OR gates OR1 and OR2 in FIG. 5, OR3 and OR4 in FIG. 6, and so forth, which OR gates receive TESTBAR signal. OR gate OR1 response being ONE conditions transmission gates TG9, TG10, TG11 and TG12 selectively to connect the "mini" bond pads MBP1, MBP2, MBP3 and MBP4 associated with high density interconnections to the input port of CHUNK1. OR gate OR2 response being ONE conditions tristate drivers TS5, TS6, TS7 and TS8 to transmit the output responses from CHUNK1 output port at low source impedances to high-density interconnections M1, M2, M3 and M4, respectively. OR gate OR3 response being ONE conditions transmission gates TG13, TG14, TG15 and TG16 selectively to connect from high-density interconnections M1, M2, M3 and M4 to the input port of CHUNK2. OR gate OR4 response being ONE conditions tristate drivers TS9, TS10, TS11 and TS12 to transmit the output responses from CHUNK2 output port at low source impedances to the "mini" bond pads MBP13, MBP14, MBP15 and MBP16. Similar arrangements can be made for selectively completing all interchunk connections on a chip, supposing there are more than two chunks on the chip.

The beginning portion of the fourth shift register SR4 comprises successive shift stages RS3, RS4, RS5 and RS6 in FIG. 5 that hold CHUNK SELECTION signal tokens for CHUNK1 and successive shift stages RS7, RS8, RS9 and RS10 in FIG. 6 that hold CHUNK SELECTION signal tokens for CHUNK2. These shift stages (and their successors that hold CHUNK SELECTION signal tokens for the chunks up to CHUNKM, supposing the chip to have a plurality M more than two chunks of electronic circuitry) pass the electronic token signals used for chunk selection on the chip. During testing the TEST ENABLE signal is a ONE, so the responses of AND gates &11, &12 etc. are identical to the respective single-bit contents of the second stage RS4 of shift register SR4, the sixth stage RS8 of shift register SR4 and every fourth stage thereafter. The contents of these stages of the fourth shift register SR4 control, dependent upon whether each is a ONE or ZERO, respectively, whether or not the chunk input test vector is selectively applied to the input port of an associated chunk of electronic circuitry within the chip. During testing the TESTBAR signal is a ZERO, so the responses of OR gates OR1 of FIG. 5, OR3 of FIG. 6, etc. are identical to the single-bit contents of the first stage RS3 of shift register SR4, of the fifth stage RS7 of shift register SR4, and every fourth stage thereafter to control, dependent upon whether each stage content is a ONE or a ZERO respectively, whether or not the input port of an associated chunk of electronic circuitry is selectively connected to its HDI "mini" bond pad. Since TESTBAR signal is a ZERO during testing, the responses of OR gates OR2 of FIG. 5, OR4 of FIG. 6, etc. are identical to the single-bit contents of the third stage RS5 of shift register SR4, of the seventh stage RS9 of shift register SR4 and every fourth stage thereafter to control, dependent upon whether each stage content is a ONE or a ZERO, respectively, whether or not the output port of an associated chunk of electronic circuitry on the chip selectively drives its HDI "mini" bond pad.

The single-bit contents of the fourth and eighth shift stages RS6 and RS10 and of each fourth shift stage thereafter are used to select which of the chunks CHUNK1, CHUNK2 etc. of electronic circuitry on the chip can have a connection of its output port connected to the PROBE line that, as shown in FIG. 1, selectively drives the TEST OUT bus via tristate driver TS0 and full-sized bond pad BP6. At any time, at most one of these fourth, eighth, etc. shift stages holds a ONE.

In FIG. 5, AND gates &13, &14, &15 and &16 receive respective input signals from the TEST RESULT BIT SELECT lines, only one of which signals is a ONE and the other of which are ZEROs. If shift stage RS6 in the fourth shift registers SR4 holds a ONE, the one of AND gates &13, &14, &15 and &16 receptive of a ONE from its TEST RESULT BIT SELECT line will have a ONE as its response; the others will respond with a ZERO. Tristate drivers TS13, TS14, TS15 and TS16 are conditioned for high- or low-source-impedance output to the PROBE line depending on whether the output responses of AND gates &13, &14, &15 and &16 respectively are ZERO or ONE. The multiplexing of output signals from all chunks of electronic circuitry on the chip, including CHUNK1 and CHUNK2, is done the same way.

In FIG. 6, for example, AND gates &17, &18, &19 and &20 receive respective input signals from the TEST RESULT BIT SELECT lines, only one of which signals is a ONE and the other of which are ZEROs. If shift stage RS10 of shift register SR4 holds a ONE, the one of AND gates &17, &18, &19 and &20 receiving that ONE as one of its input signals and a ONE from its TEST RESULT BIT SELECT line as the other of its input signals will condition the one of the tristate drivers TS17, TS18, TS19 and TS20 controlled by its ONE output response to have a low source impedance to drive the PROBE line. Each other of the tristate drivers TS13, TS14, TS15, TS16, TS17, TS18, TS19 and TS20 is controlled by a ZERO response from a respective one of AND gates &13, &14, &15, &16, &17, &18, &19 and &20 to offer a high source impedance to the PROBE line.

The order in which control signals are taken from each successive cycle of four successive stages in shift register SR4 is arbitrary, but the order shown in FIGS. 5 and 6 is one in which the chunk select signal is three successive ONEs, both for chunk testing and for high-density interconnection testing. For chunk testing CHUNK1 shift stages RS3, RS4, RS5, RS6, RS7, RS8, RS9 and RS10 have a 0111 0000 pattern in them reading from left to right. For testing the interconnections from CHUNK1 output port to CHUNK2 input port the pattern is 0001 1100. For chunk testing CHUNK2 the pattern is 0000 0111. Somewhat different patterns of ONEs and ZEROs will be noted when testing interconnections between chunks that do not receive the electronic token signals used for chunk selection on the chip from adjacent segments of the fourth shift register SR4.

Figure 7:
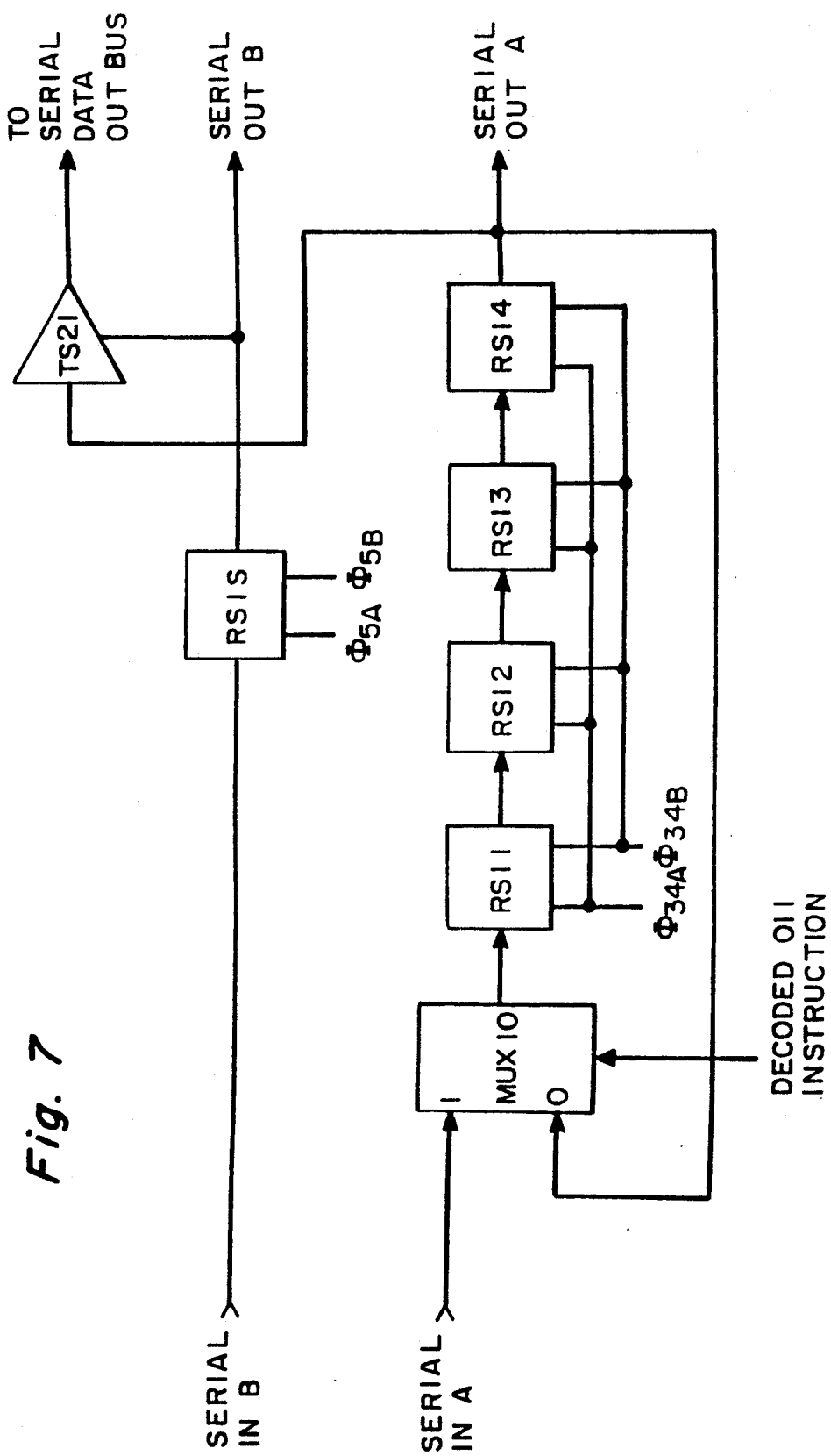
FIG. 7 is a block schematic diagram of circuitry that is repeated for each test input connection to a chunk of electronic circuitry to provide a recirculating test vector input register and associated mask register, to facilitate testing in accordance with the methods of the invention.

FIG. 7 shows the circuitry for applying one bit place of a set of successive input test vectors to a respective bit-connection of an input port of a chunk of electronic circuitry. The circuitry has SERIAL IN A, SERIAL IN B, SERIAL OUT A and SERIAL OUT B connections. Its SERIAL IN A connection is usually to the SERIAL OUT A connection of preceding similar circuitry in order to extend the first shift register SR1 by additional shift stages RS11, RS12, RS13, and RS14. Its SERIAL IN B connection is usually to the SERIAL OUT B connection of preceding similar circuitry, in order to extend the third shift register SR3 that stores input test vector masks by an additional shift stage RS15. The exceptions are that the initial circuits in the first shift register SR1 and in the third shift register SR3 have their SERIAL IN A and SERIAL IN B connections both to the SERIAL TEST FEED line via the seventh bond pad BP7. A tristate driver TS21 corresponds to tristate driver TS1, TS2, TS3 or TS4 of FIG. 4, for example. The presence of the third instruction on the bond pads BP9, BP10 and BP11 causes decoder DEC in FIG. 2 to apply a logic ONE as control signal to a multiplexer MUX10, to condition multiplexer MUX10 to complete SERIAL IN A connection to shift register stage RS11. This cascades the shift stages RS11, RS12, RS13 and RS14 in the FIG. 7 circuitry with similar shift stages in replicates of the FIG. 7 circuitry to form an extended shift register that is serially loaded at one end when the third instruction is present.

When the third instruction is no longer present, the ZERO applied as control signal to multiplexer MUX10 conditions multiplexer MUX10 to connect SERIAL OUT A connection to shift stage RS11 to complete a ring connection of the shift stages RS11, RS12, RS13 and RS14. The FIG. 7 circuitry and its replicates receive clocking signal when the fourth instruction code is supplied to the decoder DEC of FIG. 2 to recirculate four test input vectors. By cascading further shift stages with RS11, RS12, RS13 and RS14 before the SERIAL OUT A connection a larger number of test input vectors can be circulated; or one may eliminate one or more of these shift stages and circulate fewer test input vectors. From the standpoint of circulating a repeating alternating ZERO and ONE pattern in first shift register SR1 during the testing of interconnections between chunks, it is preferable that shift register SR1 be designed to circulate an even number of input test vectors. Where a long sequence of input test vectors is to be employed in functional testing, however, it is usually preferable to break up the sequence into a succession of shorter sequences and to perform testing piecemeal. The register SR1 is successively loaded with each shorter sequence and testing is done with that shorter sequence. Arranging to circulate more than four test input vectors in shift register SR1 tends to put more test hardware onto the chip than is desirable.

Figure 8:
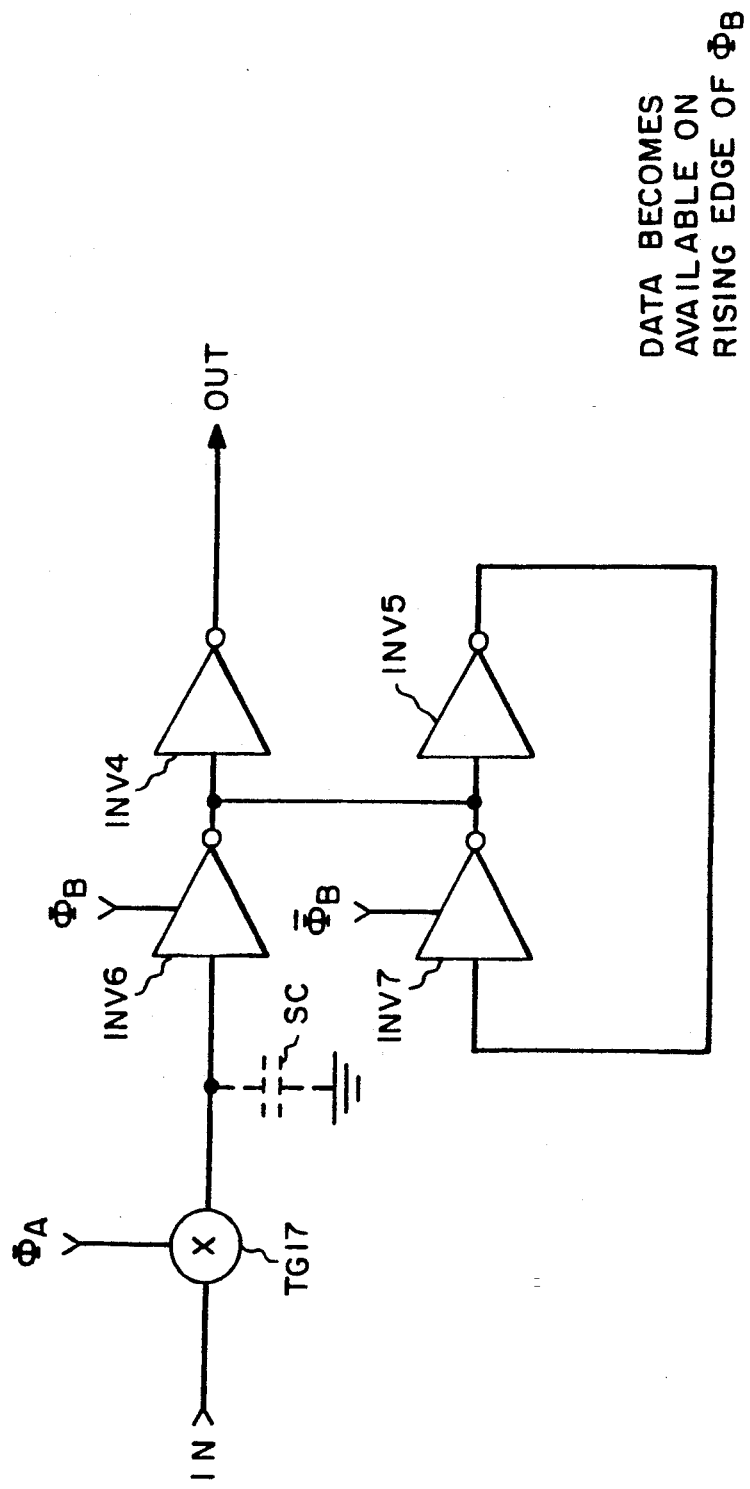
FIG. 8 is a detailed block schematic diagram of shift register stage circuitry as may be used in the circuits shown in FIGS. 2-7.

FIG. 8 shows a representative design for a shift stage such as RS1, RS2, RS3, RS4, RS5, RS6, RS7, RS8, RS9, RS10, RS11, RS12, RS13, RS14 or RS15. Non-overlapping two phase clock signals $\Phi_A$ and $\Phi_B$ (as well as their complements, though not specifically shown) are supplied to the FIG. 8 shift stage.

Logic inverters INV4 and INV5 are each formed using a respective pair of n-channel and p-channel enhancement-mode field-effect transistors in common-source amplifier configuration, with interconnected gate electrodes as input connection, and with interconnected drain electrodes as output connection. Clocked logic inverters INV6 and INV7 differ in structure from logic inverter INV4 and INV5 in that in each of the clocked inverters the common-source-amplifier n-channel enhancement-mode field-effect transistor has interposed in its drain connection an additional n-channel enhancement-mode field-effect transistor receiving $\Phi_B$ clock signal at its gate electrode and in that in each of the clocked inverters the common-source-amplifier p-channel enhancement-mode field-effect transistor has interposed in its drain connection an additional p-channel enhancement-mode field-effect transistor receiving the complement of $\Phi_B$ clock signal at its gate electrode.

A transmission gate TG17, as may comprise the paralleled channels of an n-channel enhancement-mode field-effect transistor receiving $\Phi_A$ clock signal at its gate electrode and a p-channel enhancement-mode field-effect transistor receiving the complement of $\Phi_A$ clock signal at its gate electrode, responds to $\Phi_A$ clock signal being a ONE to impress the logic state at the shift stage input terminal IN on the capacitance SC to surroundings of the input connection of the clocked inverter INV6. Subsequently, when $\Phi_B$ clock signal is ONE, clocked logic inverter INV6 applies the complement of the logic condition at its input connection to the input connection of logic inverter INV4. Logic inverter INV4 responds to apply the same logic condition as was on capacitance SC to the shift stage output terminal OUT. Clocked logic inverter INV6 also applies the complement of the logic condition at its input connection to the input connection of logic inverter INV5, and logic inverter INV5 responds to apply the same logic condition as was on capacitance SC to the input connection of clocked logic inverter INV7 with sufficient delay that, when $\Phi_B$ clock signal subsequently returns to ZERO and its complement goes to ONE, clocked logic inverter INV7 maintains the complement of the logic condition at its input connection to the input connection of logic inverter INV4 to preserve the same logic condition as was on capacitance SC at the shift stage output terminal OUT until the next time that $\Phi_B$ clock signal goes to ONE.

Consider the procedure for testing the individual chips during wafer probing to determine whether or not they meet functional requirements. This procedure entails steps 1 through 9 listed immediately below, best understood by reference to FIGS. 2–6.

(1) The chip is enabled for testing. This is done by applying a ONE as CHIP SELECT IN signal to bond pad BP4, and a 001 first instruction code to bond pads BP9, BP10 and BP11. Thereafter the TEST CLOCK signal applied to bond pad BP8 is cycled twice, stopping when $\Phi_B$ is high, to clock a ONE as CHIP TEST OUTPUT ENABLE signal being true into shift stage RS2 and to clock a ONE as CHIP SELECT signal being true into shift stage RS1. ONEs are applied to both inputs of AND gate &O enabling tristate driver TSO to drive bond pad BP6 from a low source impedance, then, providing that a ONE is applied as TEST ENABLE signal to bond pad BP3 The TEST ENABLE signal applied to bond pad BP3 is preferably a ZERO in each step, except where specified otherwise.

(2) A succession of test vectors are loaded in bit serial form into the first shift register SR1. This is done by applying a 011 third instruction code to bond pads BP9, BP10 and BP11 and cycling the TEST CLOCK signal applied to bond pad BP8 once for each bit in each of the successive test vectors supplied as SERIAL TEST FEED to bond pad BP7.

(3) Enable the application of all bits each successive test vector to input ports to be selected. This is done by simultaneously applying a ONE as SERIAL TEST FEED to bond pad BP7 and applying a 101 fifth instruction code to bond pads BP9, BP10 and by BP11 and cycling the TEST CLOCK signal applied to bond pad BP8 once for each bit in an input test vector.

(4) Select CHUNKN for testing. $N^{th}$ is the ordinal number of the chunk to be tested as determined by the progression through the quads of shift stages in shift register SR4, there being first through $P^{th}$ chunks on the chip. A 110 sixth instruction code is applied to bond pads BP9, BP10 and BP11. The TEST CLOCK signal applied to bond pad BP8 is cycled through 4P cycles beginning with and ending with $\Phi_B$. In regard to the nature of the SERIAL TEST FEED signal during this step, a ZERO is applied to bond pad 7 for each cycle except the $(4P-4N+1)^{th}$ through $(4P-4N+3)^{th}$ cycles, when a ONE is applied. This connects only CHUNKN input port to receive input test vectors from the first shift register SR1 and conditionally applies each bit of CHUNKN output port to bond pad BP6 via the PROBE line and tristate driver TSO. All other chunks have their input ports grounded and isolated from the first shift register SR1 and have their output tristate drivers disabled.

(5) Select one output bit of CHUNKN to observe. A 010 second instruction code is applied to bond pads BP9, BP10 and BP11, and the desired output bit address is serially shifted into shift register SR2. The TEST ENABLE signal is placed in a true or ONE condition.

(6) Maintain the TEST ENABLE signal in a true or ONE condition, circulate the input test vector(s) stored in shift registers SR1, and observe the TEST OUT signal from bond pad BP6. This is done by applying a 100 fourth instruction code to bond pads BP9, BP10 and BP11 and cycling TEST CLOCK signal for as many cycles as there are successive test vectors stored in shift register SR1.

(7) Repeat steps (5) and (6) once for each other output bit of CHUNKN. The output vector results from each input test vector can now be constructed.

(8) Repeat step (4) to select another chunk that requires the same input test vector sequence as first used, if possible. This may not require complete reloading of the fourth shift register SR4, but merely a forward shift while loading ZEROs into the shift register via bond pad BP7 as SERIAL TEST FEED. Repeat steps (5), (6) and (7) to test the newly selected chunk with the stored input test vectors.

(9) Repeat steps (2) through (8) until enough sets of test vectors have been sent through all chunks to completely functionally test all of the circuitry on the chip.

The foregoing procedure may be modified to test the functionality of chunks of electronic circuitry in an electronics system using a plurality of the monolithic integrated circuits with built-in test circuitry of the nature described in the preceding portion of this specification. Step (1) of the procedure is modified to cycle the TEST CLOCK signal that multiple of two times as will select the monolithic integrated circuit chip to be enabled for testing.

Consider the procedure for testing the high-density interconnections among a number L of monolithic chips mounted on a common substrate. In considering such a procedure the "input" and "output" ends of the HDI wires will be assigned according to the direction of data flow during normal operation; during interconnection testing the HDI wires are driven at their "output" ends, and responses are sensed from their "input" ends. A procedure that entails steps 10-27 set forth immediately below tests interconnections among a number L of monolithic chips mounted on a common substrate and is made possible by the first shift register SR1 storing an even number of test vectors therein.

(10) Enable for test all L chips on the substrate. Respective bits of a 001 first instruction code are applied into the INSTRUCT0 line connecting the BP9 bond pads, the INSTRUCT1 line connecting the BP10 bond pads and the INSTRUCT2 line connecting the BP11 bond pads. At the same time 2L bits aternating ZEROs and ONEs are serially clocked into the zeroeth, extended shift register by alternately applying ZERO and ONE to its initial stage while the TEST CLOCK signal applied to the paralleled BP8 bond pads of the chips is cycled 2L times. At the end of this step each of the L chips on the substrate has a ONE stored as CHIP SELECT bit in its RS1 shift register stage and has a ZERO stored as CHIP TEST OUTPUT bit in its RS2 shift register stage.

(11) A 011 third instruction code is applied to the INSTRUCT0, INSTRUCT1 and INSTUCT2 lines of the INSTRUCTION bus. At the same time a pK-bit long vector of alternating ONEs and ZEROs is serially loaded, parallelly, into the SR1 first shift registers of the chips, where K is the maximum number of bits in the input test vectors of any of the L chips on the substrate, where p is the number of test vectors stored in the circulating test vector register SR1, and where pK is p times K.

(12) Disconnect all the input and output minipads from the chunk circuitry, as follows. Apply a 110 sixth instruction code to the three-wire bus connecting BP9 bond pads, connecting BP10 bond pads and connecting BP11 bond pads. At the same time apply a ZERO to the paralleled BP7 bond pads of the L chips, and cycle the TEST CLOCK signal applied to the paralleled BP8 bond pads of the L chips a sufficient number of times to load all ZEROs into the SR4 fourth shift registers of all L chips.

(13) For each HDI wire to be tested, assume one output connection from a chunk and one input connection to another chunk are supposed to be connected. Determine if these chunks are on the same chip or are on different chips. If these chunks are on the same chip, do not perform steps (14)-(18), but rather skip to successive steps (19) and (20). Step (19) selects the chip containing the chunks connected by the HDI wire being tested; and step (20) selects the chunks connected by the HDI wire being tested. If the chunks connected by the HDI wire being tested are on different chips, perform steps (14)–(18) and then skip over steps (19) and (20) to step (21). Step (15) selects the chunk having its output connection to the input end of the HDI wire being tested after step (14) selects the chip containing that chunk. Step (17) selects the chunk having its input connection from the output end of the HDI wire being tested after step (16) selects the chip containing that chunk. Step (18) thereafter simultaeously enables for test the two chips containing the chunks connected by the HDI wire being tested for the remaining steps in the HDI testing procedure.

(14) A 001 first instruction code is applied to the INSTRUCT0, INSTRUCT1 and INSTRUCT2 lines of the INSTRUCTION bus. At the same time the TEST CLOCK signal is cycled 2L times to serially load into the zeroeth, extended shift register a signal that is all ZEROs except for a single ONE that is shifted to the position in the zeroeth, extended shift register for generating a CHIP SELECT signal corresponding to the chip providing the output connection to the input end of the HDI wire being tested.

(15) Enable the application of a selected test result bit to the PROBE line from the chunk providing the output connection to the input end of the HDI wire being tested. The 110 sixth instruction code is applied as INSTRUCTION signal to the INSTRUCT0, INSTRUCT1 and INSTRUCT2 lines respectively connecting BP9 bond pads, connecting BP10 bond pads and connecting BP11 bond pads. The SERIAL TEST FEED signal, which is serially shifted into the SR4 shift register of the chip selected in step (14) as the TEST CLOCK signal is cycled, is all ZEROs except for a single ONE, which ONE after cycling of the TEST CLOCK signal concludes is in the shift stage of that SR4 shift register that respectively conditions the selective application to the PROBE line of one of the bits of the chunk output connection to the input end of the HDI wire being tested. Since TEST ENABLE signal is true, or ONE, the bit selectively applied to the PROBE line is applied with low source impedance to the paralleled BP6 bond pads by the TS0 tristate of the chip selected per step (14).

(16) A 001 first instruction code is applied to the INSTRUCT0, INSTRUCT1 and INSTRUCT2 lines of the INSTRUCTION signal. At the same time the TEST CLOCK signal is cycled 2L times to serially load into the zeroeth, extended shift register a signal that is all ZEROs except for a single ONE, which ONE after cycling of the TEST CLOCK signal concludes is in the shift stage of that SR4 shift register that respectively conditions the generation of a CHIP SELECT signal corresponding to the chip providing the input connection from the output end of the HDI wire being tested.

(17) Make the initial arrangement for connecting the output end of the HDI wire under test from the SR1 first shift register circulating input test vectors. This is done by applying the 110 sixth instruction code as INSTRUCTION signal to the INSTRUCT0, INSTRUCT1 and INSTRUCT2 lines respectively connecting BP9 bond pads, connecting BP10 bond pads and connecting BP11 bond pads. The SERIAL TEST FEED signal, which is serially shifted into the SR4 shift register of the chip selected in step (16) as the TEST CLOCK signal is cycled, is all ZEROs except for two ONEs which after cycling of the TEST CLOCK signal concludes are in the shift stages of that SR4 shift register that respectively conditions the selective connection of the output end of the HDI wire to the succeeding chunk input port and conditions the selective connection of the SR1 first shift register circulating input test vectors to that succeeding input port.

(18) Enable for test the two chips containing the chunks connected by the HDI wire being tested. A 001 first instruction code is applied to the INSTRUCT0, INSTRUCT1 and INSTRUCT2 lines of the INSTRUCTION bus. At the same time the TEST CLOCK signal is cycled 2L times to serially load into the zeroeth, extended shift register a signal that is all ZEROs except for two ONEs. One of these ONEs is shifted to the position in the zeroeth, extended shift register for generating a CHIP SELECT signal corresponding to the chip having an input connection from the output end of the HDI wire being tested. The other of these ONEs is shifted to the position in the zeroeth, extended shift register for generating a CHIP TEST OUTPUT ENABLE signal corresponding to the chip providing the output connection to the input end of the HDI wire being tested. Skip to step (21).

(19) Enable for test the single chip containing the chunks connected by the HDI wire being tested. A 001 first instruction code is applied to the INSTRUCT0, INSTRUCT1 and INSTRUCT2 lines of the INSTRUCTION bus. At the same time the TEST CLOCK signal is cycled 2L times to serially load into the zeroeth, extended shift register a signal that is all ZEROs except for two ONEs. These ONEs are shifted to the positions in the zeroeth, extended shift register for generating CHIP SELECT and CHIP TEST OUTPUT ENABLE signals for the chip being enabled for testing.

(20) Make the initial arrangement for connecting the output end of the HDI wire under test from the SR1 first shift register circulating input test vectors and for connecting the input end of the HDI wire under test to the PROBE line of the chip enabled for testing. This is done by applying the 110 sixth instruction code as INSTRUCTION signal to the INSTRUCT0, INSTRUCT1 and INSTRUCT2 lines respectively connecting BP9 bond pads, connecting BP10 bond pads and connecting BP11 bond pads. The SERIAL TEST FEED signal, which is serially shifted into the SR4 shift register of the chip selected in step (19) as the TEST CLOCK signal is cycled, is all ZEROs except for three ONEs which after cycling of the TEST CLOCK signal concludes are in the shift stages of that SR4 shift register that respectively conditions the selective connection of the output end of the HDI wire to the succeeding chunk input port, conditions the selective connection of the SR1 first shift register circulating input test vectors to that succeeding input port, and conditions the selective application to the PROBE line of one of the bits of the chunk output connection to the input end of the HDI wire being tested. Since TEST ENABLE signal is true, or ONE, the bit selectively applied to the PROBE line is applied with low source impedance to the paralleled BP6 bond pads by the TS0 tristate of the chip selected per step (19).

(21) Specify the bit position of the single-bit connection of the selected input port to which the HDI wire being tested connects, thereby completing arrangements for connection of the output end of the HDI wire under test from the SR1 first shift register circulating input test vectors. The INSTRUCTION signal is a 101 fifth instruction code enabling the serial loading of K bits into the SR3 shift register of the chip previously selected by the CHIP TEST OUTPUT ENABLE signal in step (18) or (19), as the TEST CLOCK signal applied in parallel to the BP8 bond pads is cycled. All of the loaded bits are ZEROs except the one which corresponds to the output end of the HDI wire selected for testing, which bit is a ONE.

(22) Specify the bit position in the single-bit connection of the selected output port from which the HDI wire being tested connects, thereby completing arrangements for connection of the input end of the HDI wire under test to paralleled bond pads BP6. The INSTRUCTION signal is the 010 second instruction code. The address of the single-bit connection is the SERIAL TEST FEED supplied in parallel to the BP7 pads, which is shifted into the SR2 test results mask register of the chip previously selected in step (18) or (20), as the TEST CLOCK signal applied in parallel to the BP8 bond pads is cycled.

(23) Make the TEST ENABLE signal true or ONE during this step. Apply the 100 fourth instruction code as INSTRUCTION signal and cycle the TEST CLOCK signal. If the paralleled BP6 bond pads alternate between ZERO and ONE, then the HDI wire under test is conductive.

(24) Repeat steps (21)–(23) for all bit positions of the connections between the two selected chunks.

(25) If it is desired to assure that no shorts exist between a pair HDI wires, repeat steps (21)–(24) specifying the bit position of one in step (21) and the bit position of the other in step (22). If the paralleled BP6 bond pads alternate between ZERO and ONE, then a short-circuit between the pair of HDI wires exists.

(26) Repeat steps (13)–(24) or steps (13)–(25) for all port-to-port connections.

The theory behind the foregoing HDI test procedure is as follows. The testing of HDI wires is done by passing test signals through them in the direction opposite to that in which signals are passed during normal operation. The CHUNK INPUT TEST VECTOR bus in a selected chip has one low-impedance line cycling between ONE and ZERO which is selectively applied to one "mini" bond pad of one bit position in the input port of one chunk. This "mini" bond pad is selectively connected to the output end of the HDI wire under test, so the signal cycling between ONE and ZERO selectively appears at that end of the wire. If the HDI wire is conductive, the signal cycling between ONE and ZERO appears at its input end, which selectively drives the PROBE line in the selected chip. The TS0 tristate driver in the selected chip drives the TEST OUT bus of the substrate which links the BP6 bond pads of the chips on that substrate. Absence of the signal cycling between ONE and ZERO indicates lack of conduction in the HDI wire being tested.

Variants of the foregoing HDI test procedure divide the complete HDI testing procedure into fractional parts and replace steps (24)–(26) to reduce the amount of reprogramming required in repetitively carrying out steps (21)–(23). In one such variant each interconnection from the output port of one chunk of electronic circuitry to the input port of another chunk of electronic circuitry is tested both for conduction and lack of short circuits to adjacent interconnections in one fractional portion of the complete HDI testing procedure before going on to similarly test another of these interconnections in other fractional portions of the complete HDI testing procedure. In each fractional portion of the complete HDI testing procedure, step (22) is performed to select a new single-bit connection in the selected chunk output port only the first time that step (21) is performed, but step (21) is repeatedly performed to select sequentially each single-bit connection in the selected chunk input port for driving from a lower source impedance than the other single-bit connections in the selected chunk input port. In an alternative variant of the HDI testing procedure, in each fractional portion of the complete HDI testing procedure, step (21) is performed to select a new single-bit connection in the selected chunk input port for driving from a lower source impedance than the other single-bit connections in the selected chunk input port only the first time that step (22) is performed, but step (22) is repeatedly performed to select sequentially each single-bit connection in the selected chunk output port.

Useful variants of the HDI testing procedures thusfar described exist wherein more than one high-density interconnection at a time is driven at relatively low impedance by the test vector. These variants can reduce the amount of reloading needed of the test vector mask register SR3 on the chip possessing the CHIP SELECT token. The interconnections to be driven at relatively low impedance by the test vector are preferably chosen to be ones that are not adjacent to each other and that do not cross by each other.

Monolithic integrated circuits of a type having internal test circuitry in which the input test vector register is not capable of storing and circulating during reading a plurality of input test vectors may be encountered during testing. The HDI testing procedures set forth above accordingly must be modified in regard to checking for signal cycling between ONE and ZERO on the TEST OUT bus as caused by the circulation of test vectors in the input test vector register, and two alternative modified HDI testing procedures are respectively described in the following two paragraphs. The alternative test procedures described in the following two paragraphs can also be implemented using a circulating input test vector register to store the required test vectors, but the number of different test vectors involved is greater than for the previously described preferred procedures using a circulating input test vector register.

Where the HDI testing procedure is one where the single-bit connections of a selected chunk output port are scanned with each change of single-bit connection in the selected chunk input port for driving from a lower source impedance than the other single-bit connections in the selected chunk input port, the HDI testing procedure can be implemented on a piecemeal basis, as follows. During one half of the complete HDI testing procedure the input test vector register is sequentially loaded with test vectors each of which vectors is all ZEROs except for a ONE in the single-bit connection(s) in the selected chunk input port for driving from a lower source impedance than the other single-bit connections in the selected chunk input port, and during the other half of the complete HDI testing procedure the input test vector register is sequentially loaded with test vectors each of which vectors is all ONEs except for a ZERO in the single-bit connection(s) in the selected chunk input port for driving from a lower source impedance than the other single-bit connections in the selected chunk input port. Faults in the interconnections are detected by comparing each bit supplied to the TEST OUT bus to determine whether it differs from a corresponding bit of the test vector previously loaded into the test vector storage register.

Where the HDI testing procedure is one where with each change of single-bit connection of a selected chunk output port there is a scanning of the single-bit connections in the selected chunk input port for driving from a lower source impedance than the other single-bit connections in the selected chunk input port, the HDI testing procedure can be implemented on a piecemeal basis, as follows. During one half of the complete HDI testing procedure the input test vector register is sequentially loaded with test vectors each of which vectors is all ZEROs except for a ONE in the single-bit connection(s) in the selected chunk output port from which TEST OUT bus is driven, and during the other half of the complete HDI testing procedure the input test vector register is sequentially loaded with test vectors each of which vectors is all ONEs except for a ZERO in the single-bit connection(s) in the selected chunk output port from which TEST OUT bus is driven. Faults in the interconnections are detected by comparing each bit supplied to the TEST OUT bus to determine whether it differs from a corresponding bit of the test vector previously loaded into the test vector storage register.

Figure 9:
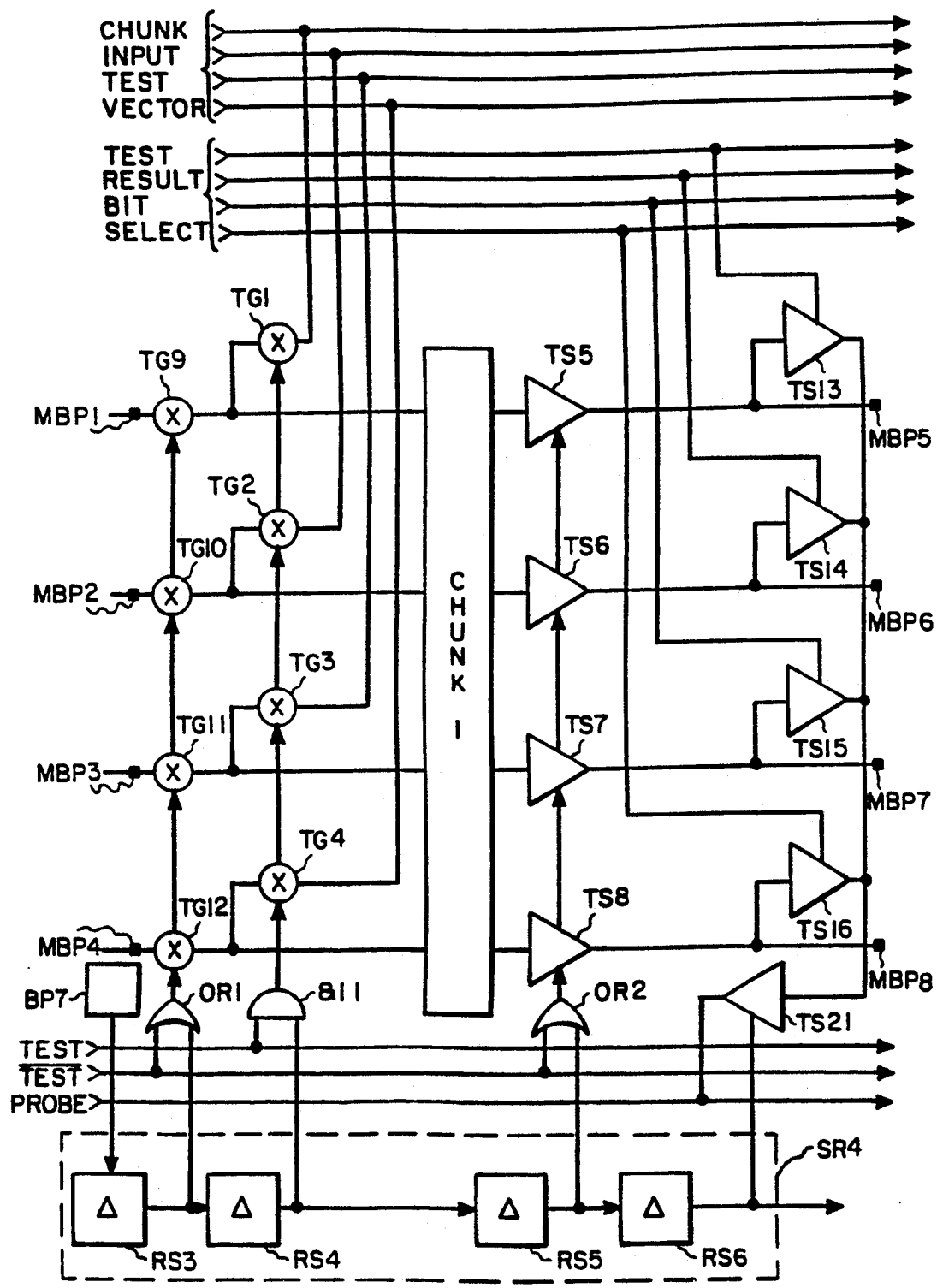
FIG. 9 is a block schematic of a type of modification that can be made in the circuitry of FIGS. 5 and 6 to provide an alternative type of built-in test circuitry as may be used in the testing methods of the invention.

FIG. 9 shows a modification tending to reduce capacitive loading of the PROBE line that can be made to the circuitry of FIG. 5, with similar modifications being made to the circuitry of FIG. 6 etc. Rather than the PROBE line being driven by as many tristate drivers as there are bits in the output ports of all the chunks, then, the PROBE line is driven by only as many tristate drivers (TS21, TS22, etc. as there are corresponding chunks. Each of these tristate drivers (TS21, in the FIG. 9 circuitry) is driven from the output connections of the group of tristate drivers (TS13, TS14, TS15, TS16 in the FIG. 9 circuitry) associated with respective bit positions in the output port of the corresponding chunk. Each of the tristate drivers in such a group receives a respective one of the TEST RESULT BIT SELECT bits directly, rather than selectively via a respective AND gate, and needs only to have the capability to drive the subsequent tristate driver to the PROBE line. AND gates &13, &14, &15 and &16 are dispensed with. The subsequent tristate driver TS21 to the PROBE line performs the ANDing function instead. The subsequent tristate drivers TS21, TS22, etc. to the PROBE line encounter only about a quarter as much capacitance on the PROBE line of FIG. 9 as is on the PROBE line of FIG. 5. This is because a single tristate driver per chunk output port connects to the PROBE LINE rather than respective tristate drivers for each of the bit connections from the chunk test output port. So the drive capability required of tristate driver TS21 in FIG. 9 is only about a quarter of the combined drive capabilities required of TS13, TS14, TS15, and TS16 in FIG. 5.

Figure 10:
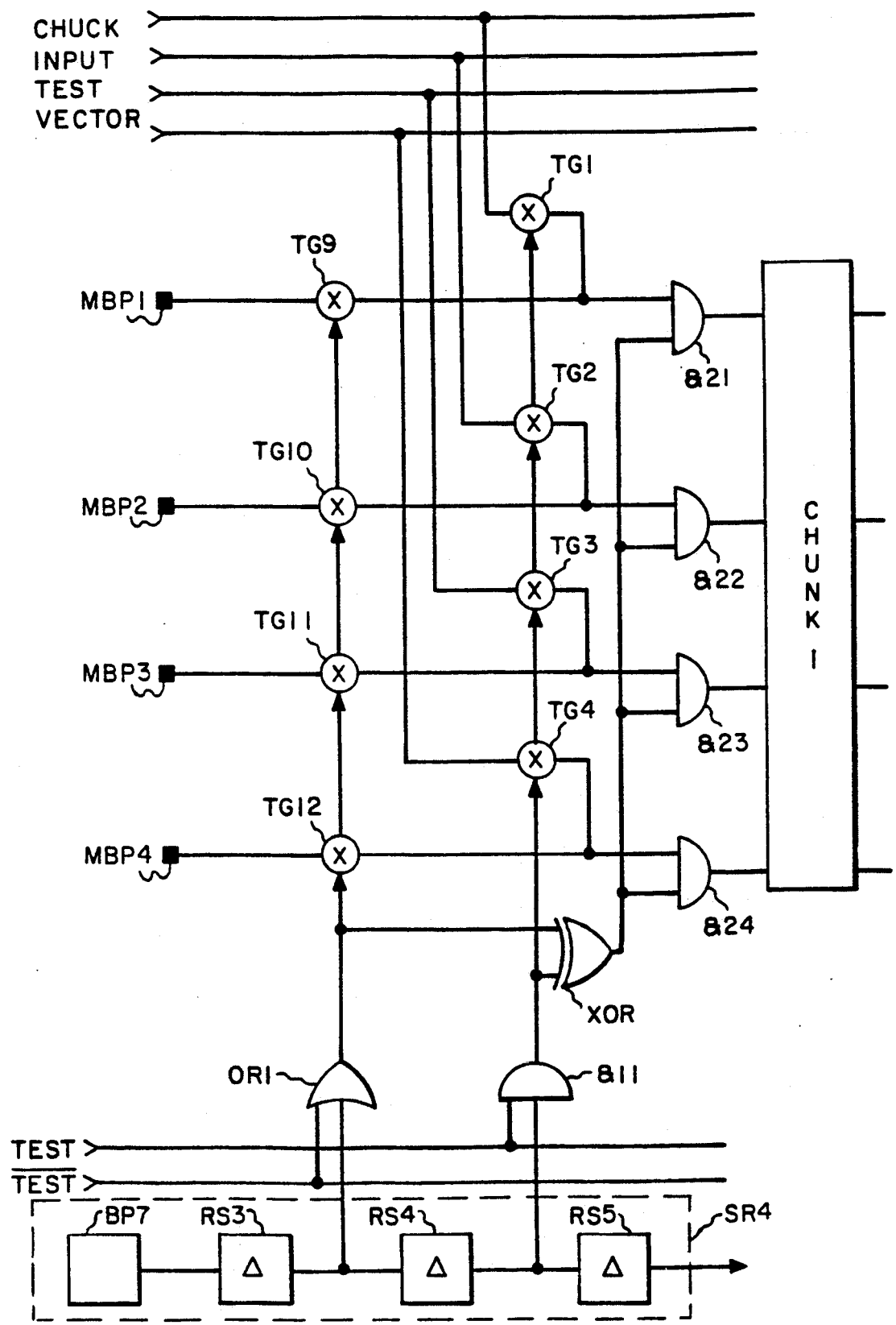
FIG. 10 is a schematic diagram illustrating how the input connections to a chunk of electronic circuitry are pulled down to logic ZERO state when they are isolated during testing.

FIG. 10 illustrates how the input connections to a chunk of electronic circuitry can be pulled down to logic ZERO state when they are isolated during testing. The CHUNK1 input connections are selectively pulled down to logic ZERO state by AND gates &21, &22, &23 and &24 respectively responsive to the output of an exclusive-OR gate XOR being low—i.e., at logic ZERO. This occurs when both &11 and OR1 gates have ZERO output responses conditioning all the transmission gates TG1, TG2, TG3, TG4, TG9, TG10, TG11 and TG12 to be non-conductive. The The non-conduction of these transmission gates would isolate the input connections of CHUNK1 and leave their potentials uncertain, if the AND gates &21, &22, &23 and &24 were not used to provide selective clamping of these input connections. The output of exclusive-OR gate XOR is also ZERO during HDI testing when both &11 or OR1 gates have ONE output responses conditioning all the transmission gates TG1, TG2, TG3, TG4, TG9, TG10, TG11 and TG12 to be conductive. This confines the application of the test vectors to the high-density interconnections. When exclusive-OR gate XOR output is high—i.e., at logic ONE—the output signals of AND gates &21, &22, &23 and &24 have the same logic states as their input signals applied via "mini" bond pads MBP1, MBP2, MBP3, and MBP4 or from test vector register SR1 respectively have.

The built-in test circuitry thus far described can be modified to write an optimally efficient binary code into the second shift register SR2 to indicate which bit of a selected test output is to be applied to the PROBE line, rather than using a positional code. However, a decoder is needed for responding to the efficient binary code to control the application of the selected bit to the PROBE line.

The simple positional code stored in each successive group of four stages (IRS3, RS4, RS5, RS6; RS7, RS8, RS9, RS10; etc.) in the fourth shift register SR4 is not optimally efficient for doing just isolated chunk testing and interconnection testing. The number of stages in fourth shift register SR4 can be reduced by coding the chunk selection information using a more sophisticated chunk selection code stored in successive groups of only three or only two stages, but this reduces flexibility in the testing procedures. Troubleshooting tests over a plurality of chunks are not so readily implemented.

Token passing can be used to address the test input ports and test output ports of the built-in test circuitry of each monolithic integrated circuit in just a chunk-selection dimension, rather than in both chip-selection and chunk-selection dimensions as thus far described. This can be done by loading the fourth shift register from the SELECT IN line via bond pad BP4, rather than from the SERIAL TEST FEED line via bond pad BP7. Shift register stages RS1 and RS2 are dispensed with, and buffer amplifier BA1 receives its input signal from a latter one of the shift register stages in the fourth shift register SR4. The CHIP SELECT signal is generated by ORing CHUNK SELECT signals taken from positions along the fourth shift register SR4 (e.g., from the output ports of shift stages RS4, RS8, etc.) The CHIP TEST OUTPUT ENABLE signal is generated by ORing CHUNK TEST OUTPUT ENABLE signals taken from positions along the fourth shift register SR4 (e.g., the output ports of shifter stages RS6, RS10, etc.). A small penalty in terms of increased digital hardware and longer time to access a particular set of test parts tends to be incurred when this is done.

One skilled in the art and acquainted with the foregoing disclosure will be enabled to design other variants of the testing methods embodying the invention thusfar described and this should be borne in mind when construing the scope of the claims which follow.

What is claimed is:

1. A method for testing a system comprising a plurality of monolithic integrated circuits; said monolithic integrated circuits having different commands supplied to them in common at different times; each of said monolithic integrated circuits connecting to a serial test feed line and to a test output line, each of said monolithic integrated circuits including a respective test vector storage register for receiving and storing test vectors in selected response to one of said commands, at least one respective chunk of electronic circuitry therewithin, and respective test instruction memory means for receiving and storing in selected response to one of said commands respective test instructions for each said respective chunk of electronic circuitry included within that said monolithic integrated circuit; each of at least certain ones of said chunks of electronic circuitry having a respective input port for testing, and each of said chunks of electronic circuitry having a respective output port for testing; said method comprising for the respective testing of each said chunk of electronic circuitry the steps of:

(a) supplying in response to one of said commands a first token just to the one of said monolithic integrated circuits which includes the input port of said chunk of electronic circuitry being tested, said first token enabling the one of said monolithic integrated circuits possessing it for serially receiving test vectors and testing instructions applied to said serial test feed line;

(b) supplying in response to one of said commands a second token just to the one of said monolithic integrated circuits which includes the output port of said chunk of electronic circuitry being tested, said second token enabling the one of said monolithic integrated circuits possessing it to apply test results to said test output line;

(c) loading via said serial test feed line a test vector into the test vector storage register located within the one of said monolithic integrated circuits possessing said first token;

(d) selecting said chunk of electronic circuitry for test by the substeps of
applying to said monolithic integrated circuits one of said commands as conditionally directs writing of the respective test instruction memory means in said monolithic integrated circuits and supplying via said serial test feed line testing instructions to be received by the respective test instruction memory means in the one of said monolithic integrated circuits enabled for receiving said testing instructions by possessing said first token, one of which testing instructions is of a nature to enable the application of the test vector stored in the test vector storage register of said monolithic integrated circuit possessing said first token to the input port of said chunk of electronic circuitry selected for test, and another of which testing instructions is of a nature to enable the output port of said chunk of electronic circuitry selected for test to apply test results to said test output line; and, (e) in response to one of said commands, selecting to said test output line output bits from the output port of said chunk of electronic circuitry selected for test.

2. A method for testing a system comprising a plurality of monolithic integrated circuits as set forth in claim 1 wherein said steps (a) and (b) are carried out by passing said first and second tokens among said plurality of monolithic integrated circuits using a shift register shifting its contents responsive to a single one of said commands and having a respective pair of stages for storing said first and second tokens for each of said plurality of monolithic integrated circuits.

3. A method for testing a system comprising a plurality of monolithic integrated circuits; said monolithic integrated circuits having different commands supplied to them in common at different times; each of said monolithic integrated circuits connecting to a serial test feed line and to a test output line, each of said monolithic integrated circuits including a respective circulating test vector storage register for receiving and storing test vectors in selected response to one of said commands, at least one respective chunk of electronic circuitry therewithin, and respective test instruction memory means for receiving and storing in selected response to one of said commands respective test instructions for each said respective chunk of electronic circuitry included within that said monolithic integrated circuit; each of at least certain ones of said chunks of electronic circuitry having a respective input port for testing, and each of said chunks of electronic circuitry having a respective output port for testing; said method comprising for the respective testing of each said chunk of electronic circuitry the steps of:

(a) supplying in response to one of said commands a first token just to the one of said monolithic integrated circuits which includes the input port of said chunk of electronic circuitry being tested, said first token enabling the one of said monolithic integrated circuits possessing it for serially receiving test vectors and testing instructions applied to said serial test feed line;

(b) supplying in response to one of said commands a second token just to the one of said monolithic integrated circuits which includes the output port of said chunk of electronic circuitry being tested, said second token enabling the one of said monolithic integrated circuits possessing it to apply test results to said test output line;

(c) loading via said serial test feed line a succession of test vectors into the test vector storage register located within the one of said monolithic integrated circuits possessing said first token;

(d) selecting said chunk of electronic circuitry for test by the substeps of
applying to said monolithic integrated circuits one of said commands as conditionally directs writing of the respective test instruction memory means in said monolithic integrated circuits and loading via said serial test feed line testing instructions to be received by the respective test instruction memory means in the one of said monolithic integrated circuits enabled for receiving said testing instructions by possessing said first token, one of which testing instructions is of a nature to enable the application of the succession of test vectors stored in the test vector storage register of said monolithic integrated circuit possessing said first token to the input port of said chunk of electronic circuitry selected for test, and another of which testing instructions is of a nature to enable the output port of said chunk of electronic circuitry selected for test to apply test results to said test output line;

(e) circulating in response to one of said commands the input test vectors stored in the test vector storage register located within the one of said monolithic integrated circuits possessing said first token to apply them one at a time to the input port of said chunk of electronic circuitry selected for test; and, (f) with each application of one of the input test vectors stored in that said test vector storage register, in response to one of said commands, selecting to said test output line output bits from the output port of said chunk of electronic circuitry selected for test.

4. A method for testing a system comprising a plurality of monolithic integrated circuits as set forth in claim 3 wherein said steps (a) and (b) are carried out by passing said first and second tokens among said plurality of monolithic integrated circuits using a shift register shifting its contents responsive to a single one of said commands and having a respective pair of stages for storing said first and second tokens for each of said plurality of monolithic integrated circuits.

5. A method for testing interconnections between chunks of electronic circuitry within the same one of a plurality of monolithic integrated circuits connected in a system; said monolithic integrated circuits having different commands supplied to them in common at different times; each of said monolithic integrated circuits connecting to a serial test feed line and to a test output line; each of said monolithic integrated circuits including a respective test vector storage register for storing a test vector that is supplied in the form of parallel bits and that can be updated via said serial test feed line responsive to one of said commands, at least one respective chunk of electronic circuitry therewithin, and respective test instruction memory means for receiving and storing in selected response to one of said commands test instructions for each said respective chunk of electronic circuitry included within that said monolithic integrated circuit; each of at least certain ones of said chunks of electronic circuitry having a respective input port for testing, and each of said chunks of electronic circuitry having a respective output port for testing; said method comprising for the respective testing of each said chunk of electronic circuitry the steps of:

(a) supplying in response to one of said commands a first token just to the one of said monolithic integrated circuits which includes the input port of that said chunk of electronic circuitry that connects to the interconnections under test, the one of said monolithic integrated circuits possessing said first token being enabled thereby for serially receiving a test vector and testing instructions applied to said serial test feed line;

(b) supplying in response to one of said commands a second token to just the one of said monolithic integrated circuits which includes the output port of that said chunk of electronic circuitry that connects to the interconnections under test, the one of said monolithic integrated circuits possessing said second token being enabled thereby to apply test results to said test output line;

(c) after step (a) is performed, applying to said monolithic integrated circuits one of said commands as conditionally directs loading in said monolithic integrated circuits of their respective test instruction memory means and (d) while step (c) is performed, supplying via said serial test feed line testing instructions to be received by the respective test instruction memory means in the one of said monolithic integrated circuits enabled for receiving said testing instructions by possessing said first token, one of which testing instructions is of a nature to enable the application of the succession of test vectors stored in the test vector storage register of said monolithic integrated circuit possessing said first token to the input port of that said chunk of electronic circuitry that connects to the interconnections under test, and another of which testing instructions is of a nature to enable the output port of that said chunk of electronic circuitry that connects to the interconnections under test to apply test results to said test output line, steps (c) and (d) together selecting said chunks of electronic circuitry connected by said interconnections under test;

(e) after steps (c) and (d) are performed, in response to one of said commands, selecting which of the parallel bits of said stored test vector will be supplied at relatively low source impedance compared to the others;

(f) concurrently with step (e) being performed, in response to one of said commands, serially selecting to said test output line the output bits from the output port of that said chunk of electronic circuitry that connects to the interconnections under test; and (g) comparing each bit supplied to said test output line to determine whether it differs from a corresponding bit of said test vector stored in the test vector storage register of the one of said monolithic integrated circuits enabled thereby for serially receiving a test vector in step (a), which is indicative of a fault in the corresponding interconnection under test.

6. A method as set forth in claim 5 wherein said steps (a) and (b) are carried out by passing said first and second tokens among said plurality of monolithic integrated circuits using a shift register shifting its contents responsive to a single one of said commands and having a respective pair of stages for storing said first and second tokens for each of said plurality of monolithic integrated circuits.

7. A method as set forth in claim 5 also including the following steps, which are performed prior to said steps (a) and (c) being performed:

(h) supplying in response to one of said commands a first token to at least the one of said monolithic integrated circuits which includes the chunks connected by the interconnections being tested, said first token for enabling each of said monolithic integrated circuits possessing it to serially receive a test vector and testing instructions applied to said serial test feed line;

(i) thereafter applying a command for loading the respective test vector storge register located within each of said monolithic integrated circuits possessing said first token as a result of step (h); and (j) at the same time as step (i) is performed, supplying via said serial test feed line a test vector for being loaded into the respective test vector storage register located within each of said monolithic integrated circuits possessing said first token, said test vector having a first of two opposite logic states for the one of the parallel bits of said stored test vector selected in step (e) to be supplied at relatively low source impedance compared to the others and having a second of said two opposite logic states for the others of the parallel bits of said stored test vector.

8. A method for testing interconnections between chunks of electronic circuitry within the same one of a plurality of monolithic integrated circuits connected in a system comprising performing the method set forth in claim 7 a first time and then performing the method set forth in claim 7 a second time, with the test vector supplied via said serial test feed line for loading into the test vector storage register located within the one of said monolithic integrated circuits possessing said first token during step (j) when performing the method set forth in claim 7 the second time being the one's complement of the test vector supplied during step (j) when performing the method set forth in claim 7 the first time.

9. A method for testing interconnections between chunks of electronic circuitry within the same one of a plurality of monolithic integrated circuits connected in a system comprising the successive performance of the method set forth in claim 8 each time selecting in step (e) a different one of the parallel bits of said stored test vector to be supplied at relatively low source impedance compared to the others.

10. A method for testing interconnections between chunks of electronic circuitry within the same one of a plurality of monolithic integrated circuits connected in a system comprising the successive performance of the method set forth in claim 7 each time selecting in step (e) a different one of the parallel bits of said stored test vector to be supplied at relatively low source impedance compared to the others.

11. A method for testing interconnections between chunks of electronic circuitry within the same one of a plurality of monolithic integrated circuits connected in a system comprising performing the method set forth in claim 10 a first time and then performing the method set forth in claim 10 a second time, with the test vector supplied via said serial test feed line for loading into the test vector storage register located within the one of said monolithic integrated circuits possessing said first token during step (j) when performing the method set forth in claim 10 the second time being the one's complement of the test vector supplied during step (j) when performing the method set forth in claim 10 the first time.

12. A method for testing interconnections between chunks of electronic circuitry within the same one of a plurality of monolithic integrated circuits connected in a system; said monolithic integrated circuits having different commands supplied to them in common at different times; each of said monolithic integrated circuits connecting to a serial test feed line and to a test output line; each of said monolithic integrated circuits including a respective test vector storage register for storing a test vector that is supplied in the form of parallel bits and that can be updated via said serial test feed line responsive to one of said commands, at least one respective chunk of electronic circuitry therewithin, and respective test instruction memory means for receiving and storing in selected response to one of said commands test instructions for each said respective chunk of electronic circuitry included within that said monolithic integrated circuit; each of at least certain ones of said chunks of electronic circuitry having a respective input port for testing, and each of said chunks of electronic circuitry having a respective output port for testing; said method comprising for the respective testing of each said chunk of electronic circuitry the steps of:

(a) supplying in response to one of said commands a first token just to the one of said monolithic integrated circuits which includes the input port of that said chunk of electronic circuitry that connects to the interconnections under test, the one of said monolithic integrated circuits possessing said first token being enabled thereby for serially receiving a test vector and testing instructions applied to said serial test feed line;

(b) supplying in response to one of said commands a second token to just the one of said monolithic integrated circuits which includes the output port of that said chunk of electronic circuitry that connects to the interconnections under test, the one of said monolithic integrated circuits possessing said second token being enabled thereby to apply test results to said test output line;

(c) after step (a) is performed, applying to said monolithic integrated circuits one of said commands as conditionally directs loading in said monolithic integrated circuits of their respective test instruction memory means and (d) while step (c) is performed, supplying via said serial test feed line testing instructions to be received by the respective test instruction memory means in the one of said monolithic integrated circuits enabled for receiving said testing instructions by possessing said first token, one of which testing instructions is of a nature to enable the application of the test vector stored in the test vector storage register of said monolithic integrated circuit possessing said firt token to the input port of that said chunk of electronic circuitry that connects to the interconnections under test, and another of which testing instructions is of a nature to enable the output port of that said chunk of electronic circuitry that connects to the interconnections under test to apply test results to said test output line, steps (c) and (d) together selecting said chunks of electronic circuitry connected by said interconnections under test;

(e) after steps (c) and (d) are performed, in response to one of said commands, selecting to said test output line one of the output bits from the output port of said chunk of electronic circuitry that connects to the interconnections under test;

(f) concurrently with step (e) being performed, in response to one of said commands, sequentially selecting which of the parallel bits of said stored test vector will be supplied at relatively low source impedance compared to the others; and (g) comparing each bit supplied to said test output line to determine whether it differs from a corresponding bit of said test vector stored in the test vector storage register of the one of said monolithic integrated circuits enabled thereby for serially receiving a test vector in step (a), which is indicative of a fault in the corresponding interconnection under test.

13. A method as set forth in claim 12 wherein said steps (a) and (b) are carried out by passing said first and second tokens among said plurality of monolithic integrated circuits using a shift register shifting its contents responsive to a single one of said commands and having a respective pair of stages for storing said first and second tokens for each of said plurality of monolithic integrated circuits.

14. A method as set forth in claim 13 also including the following steps, which are performed prior to said steps (a) and (c) being performed:
 (h) supplying in response to one of said commands a first token to at least the one of said monolithic integrated circuits which includes the chunks connected by the interconnections being tested, said first token for enabling each of said monolithic integrated circuits possessing it to serially receive a test vector and testing instructions applied to said serial test feed line;
 (i) thereafter applying a command for loading the respective test vector storage register located within each of said monolithic integrated circuits possessing said first token as a result of step (h); and
 (j) at the same time as step (i) is performed, supplying via said serial test feed line a test vector for being loaded into the respective test vector storage register located within each of said monolithic integrated circuits possessing said first token, said test vector having a first of two opposite logic states for the one of the parallel bits of said stored test vector corresponding to the one of the output bits from the output port of said chunk of electronic circuitry that connects to the interconnections under test selected in step (e) and having a second of said two opposite logic states for the others of the parallel bits of said stored test vector.

15. A method for testing interconnections between chunks of electronic circuitry within the same one of a plurality of monolithic integrated circuits connected in a system comprising performing the method set forth in claim 14 a first time and then performing the method set forth in claim 14 a second time, with the test vector supplied via said serial test feed line for loading into the test vector storage register located within the one of said monolithic integrated circuits possessing said first token during step (j) when performing the method set forth in claim 14 the second time being the one's complement of the test vector supplied during step (j) when performing the method set forth in claim 14 the first time.

16. A method for testing interconnections between chunks of electronic circuitry within the same one of a plurality of monolithic integrated circuits connected in a system comprising the successive performance of the method set forth in claim 15 each time selecting to said test output line in step (e) a different one of the output bits from the output port of said chunk of electronic circuitry that connects to the interconnections under test.

17. A method for testing interconnections between chunks of electronic circuitry within the same one of a plurality of monolithic integrated circuits connected in a system comprising the successive performance of the method set forth in claim 14 each time selecting in step (e) selecting to said test output line a different one of the output bits from the output port of said chunk of electronic circuitry that connects to the interconnections under test.

18. A method for testing interconnections between chunks of electronic circuitry within the same one of a plurality of monolithic integrated circuits connected in a system comprising performing the method set forth in claim 17 a first time and then performing the method set forth in claim 17 a second time, with the test vector supplied via said serial test feed line for loading into the test vector storage register located within the one of said monolithic integrated circuits possessing said first token during step (j) when performing the method set forth in claim 17 the second time being the one's complement of the test vector supplied during step (j) when performing the method set forth in claim 17 the first time.

19. A method for testing interconnections between chunks of electronic circuitry within different ones of a plurality of monolithic integrated circuits; said monolithic integrated circuits having different commands supplied to them in common at different times; each of said monolithic integrated circuits connecting to a serial test feed line and to a test output line; each of said monolithic integrated circuits including a respective test vector storage register for storing a test vector that is supplied in the form of parallel bits and that can be updated via said serial test feed line responsive to one of said commands, at least one respective chunk of electronic circuitry therewithin, and respective test instruction memory means for receiving and storing in selected response to one of said commands test instructions for each said respective chunk of electronic circuitry included within that said monolithic integrated circuit; each of at least certain ones of said chunks of electronic circuitry having a respective input port for testing, and each of said chunks of electronic circuitry having a respective output port for testing; said method comprising for the respective testing of each said chunk of electronic circuitry the steps of:
 (a) supplying in response to one of said commands a first token to just the one of said plurality of monolithic integrated circuits which includes the output port of that said chunk of electronic circuitry from which connect said interconnections under test, the one of said monolithic integrated circuits possessing said first token being enabled thereby for serially receiving test vectors and testing instructions applied to said serial test feed line;
 (b) while as a result of step (a) said first token is possessed by that said monolithic integrated circuit which includes the output port of that said chunk of electronic circuitry from which connect said interconnections under test, applying to said monolithic integrated circuits one of said commands, as conditionally directs loading of respective test instruction memory means in said monolithic integrated circuits;
 (c) while step (b) is performed, supplying via said serial test feed line testing instructions to be received by the respective test instruction memory means in said monolithic integrated circuit enabled for receiving said testing instructions by possessing said first token, one of which testing instructions is of a nature to select test results from the output port of that said chunk of electronic circuitry from which connect said interconnections under test to be the test results from the one of said monolithic integrated circuits enabled for receiving said testing instructions by possessing said first token;
 (d) supplying in response to one of said commands a first token to just the one of said plurality of monolithic integrated circuits which includes the input port of that said chunk of electronic circuitry to which connect the interconnections under test, the one of said monolithic integrated circuits possessing said first token being enabled thereby for serially receiving test vectors and testing instructions applied to said serial test feed line;

(e) while as a result of step (d) said first token is possessed by said monolithic integrated circuit which includes the input port of that said chunk of electronic circuitry to which connect the interconnections under test, applying to said monolithic integrated circuits one of said commands, as conditionally directs loading in said monolithic integrated circuits of their respective test instruction memory means;

(f) while step (e) is performed, supplying via said serial test feed line testing instructions to be received by the respective test instruction memory means in the one of said monolithic integrated circuits enabled for receiving said testing instructions by possessing said first token, one of which testing instructions is of a nature to enable the application of the test vector stored in the respective test vector storage register of said monolithic integrated circuit possessing said first token to the input port of that said chunk of electronic circuitry to which interconnections under test connect;

(g) supplying in response to one of said commands a second token to just the one of said monolithic integrated circuits which includes the output port of that said chunk of electronic circuitry being tested from which interconnections under test connect, the one of said monolithic integrated circuits possessing said second token being enabled thereby to enable that one of said monolithic integrated circuits to apply test results to said test output line;

(h) selecting which of the parallel bits of said stored test vector will be supplied at relatively low source impedance compared to the others;

(i) after steps (a) through (h) are performed, in response to one of said commands, serially selecting to said test output line output bits from the output port of said chunk of electronic circuitry that connects to the interconnections under test; and (j) comparing each bit supplied to said test output line while step (i) is performed, to determine whether that bit differs from a corresponding bit of said test vector stored in the test vector storage register of the one of said monolithic integrated circuits enabled thereby for serially receiving a test vector in step (d), which is indicative of a fault in the corresponding interconnection under test.

20. A method as set forth in claim 19; wherein said steps (d) and (g) are carried out concurrently by passing said first and second tokens among said plurality of monolithic integrated circuits using a shift register shifting its contents responsive to a single one of said commands and having a respective pair of stages for storing said first and second tokens for each of said plurality of monolithic integrated circuits; and wherein said step (a) is carried out by passing said first token among said plurality of monolithic integrated circuits using the same said shift register shifting its contents responsive to the same single one of said commands.

21. A method as set forth in claim 19 including the following steps, which are performed prior to said steps (d) through (f) being performed:

(k) supplying in response to one of said commands a first token to at least the one of said monolithic integrated circuits which includes that said chunk to the input port of which connect the interconnections under test, said first token for enabling each of said monolithic integrated circuits possessing it to serially receive a test vector and testing instructions applied to said serial test feed line;

(l) thereafter applying a command for loading the respective test vector storage register located within each of said monolithic integrated circuits possessing said first token as a result of step (k); and (m) at the same time as step (l) is performed, supplying via said serial test feed line a test vector for being loaded into the respective test vector storage register located within each of said monolithic integrated circuits possessing said first token, said test vector having a first of two opposite logic states for the one of the parallel bits of said stored test vector selected in step (h) to be supplied at relatively low source impedance compared to the others and having a second of said two opposite logic states for the others of the parallel bits of said stored test vector.

22. A method for testing interconnections between chunks of electronic circuitry within different ones of a plurality of monolithic integrated circuits connected in a system comprising performing the method set forth in claim 21 a first time and then performing the method set forth in claim 21 a second time, with the test vector supplied via said serial test feed line for loading into the test vector storage register located within the one of said monolithic integrated circuits possessing said first token during step (m) when performing the method set forth in claim 21 the second time being the one's complement of the test vector supplied during step (m) when performing the method set forth in claim 21 the first time.

23. A method for testing interconnections between chunks of electronic circuitry within different ones of a plurality of monolithic integrated circuits connected in a system comprising the successive performance of the method set forth in claim 22 each time selecting in step (h) a different one of the parallel bits of said stored test vector to be supplied at relatively low source impedance compared to the others.

24. A method for testing interconnections between chunks of electronic circuitry within different ones of a plurality of monolithic integrated circuits connected in a system comprising the successive performance of the method set forth in claim 21 each time selecting in step (h) a different one of the parallel bits of said stored test vector to be supplied at relatively low source impedance compared to the others.

25. A method for testing interconnections between chunks of electronic circuitry within different ones of a plurality of monolithic integrated circuits connected in a system comprising performing the method set forth in claim 24 a first time and then performing the method set forth in claim 24 a second time, with the test vector supplied via said serial test feed line for loading into the test vector storage register located within the one of said monolithic integrated circuits possessing said first token during step (m) when performing the method set forth in claim 24 the second time being the one's complement of the test vector supplied during step (m) when performing the method set forth in claim 24 the first time.

26. A method for testing interconnections between chunks of electronic circuitry within different ones of a plurality of monolithic integrated circuits; said monolithic integrated circuits having different commands supplied to them in common at different times; each of said monolithic integrated circuits connecting to a serial test feed line and to a test output line; each of said monolithic integrated circuits including a respective test vector storage register for storing a test vector that is supplied in the form of parallel bits and that can be updated via said serial test feed line responsive to one of said commands, at least one respective chunk of electronic circuitry therewithin, and respective test instruction memory means for receiving and storing in selected response to one of said commands test instructions for each said respective chunk of electronic circuitry included within that said monolithic integrated circuit; each of at least certain ones of said chunks of electronic circuitry having a respective input port for testing, and each of said chunks of electronic circuitry having a respective output port for testing; said method comprising for the respective testing of each said chunk of electronic circuitry the steps of:

(a) supplying in response to one of said commands a first token to just the one of said plurality of monolithic integrated circuits which includes the output port of that said chunk of electronic circuitry from which connect said interconnections under test, the one of said monolithic integrated circuits possessing said first token being enabled thereby for serially receiving test vectors and testing instructions applied to said serial test feed line;

(b) while as a result of step (a) said first token is possessed by said monolithic integrated circuit which includes the output port of that said chunk of electronic circuitry from which connect said interconnections under test, applying to said monolithic integrated circuits one of said commands, as conditionally directs loading of respective test instruction memory means in said monolithic integrated circuits;

(c) while step (b) is performed, supplying via said serial test feed line testing instructions to be received by the respective test instruction memory means in said monolithic integrated circuit enabled for receiving said testing instructions by possessing said first token, one of which testing instructions is of a nature to select test results from the output port of that said chunk of electronic circuitry from which connect said interconnections under test to be the test results from the one of said monolithic integrated circuits enabled for receiving said testing instructions by possessing said first token;

(d) supplying in response to one of said commands a first token to just the one of said plurality of monolithic integrated circuits which includes the input port of that said chunk of electronic circuitry to which connect the interconnections under test, the one of said monolithic integrated circuits possessing said first token being enabled thereby for serially receiving test vectors and testing instructions applied to said serial test feed line;

(e) while as a result of step (d) said first token is possessed by said monolithic integrated circuit which includes the input port of that said chunk of electronic circuitry to which connect the interconnections under test, applying to said monolithic integrated circuits of said commands, as conditionally directs loading in said monolithic integrated circuits of their respective test instruction memory means;

(f) while step (e) is performed, supplying via said serial test feed line testing instructions to be received by the respective test instruction memory means in the one of said monolithic integrated circuits enabled for receiving said testing instructions by possessing said first token, one of which testing instructions is of a nature to enable the application of the test vector stored in the respective test vector storage register of said monolithic integrated circuit possessing said first token to the input port of said chunk of electronic circuity to which interconnections under test connect;

(g) supplying in response to one of said commands a second token to just the one of said monolithic integrated circuits which includes the output port of that said chunk of electronic circuitry being tested from which interconnections under test connect, the one of said monolithic integrated circuits possessing said second token being enabled thereby to enable that one of said monolithic integrated circuits to apply test results to said test output line;

(h) after steps (a) through (g) are performed, in response to one of said commands, selecting to said test output line one of the output bits from the output port of said chunk of electronic circuitry that connects to the interconnections under test;

(i) concurrently with step (h) being performed, in response to one of said commands, sequentially selecting which of the parallel bits of said stored test vector will be supplied at relatively low source impedance compared to the others; and (j) comparing each bit supplied to said test output line while step (i) is performed to determine whether it differs from a corresponding bit of said test vector stored in the test vector storage register of the one of said monolithic integrated circuits enabled thereby for serially receiving a test vector in step (d), which is indicative of a fault in the corresponding interconnection under test.

27. A method as set forth in claim 26, wherein said steps (d) and (g) are carried out concurrently by passing said first and second tokens among said plurality of monolithic integrated circuits using a shift register shifting its contents responsive to a single one of said commands and having a respective pair of stages for storing said first and second tokens for each of said plurality of monolithic integrated circuits; and wherein said step (a) is carried out by passing said first token among said plurality of monolithic integrated circuits using the same said shift register shifting its contents responsive to the same single one of said commands.

28. A method as set forth in claim 26 including the following steps, which are performed prior to said steps (d) through (f) being performed:

(k) supplying in response to one of said commands a first token to at least the one of said monolithic integrated circuits which includes that said chunk to the input port of which connect the interconnections under test, said first token for enabling each of said monolithic integrated circuits possessing it to serially receive a test vector and testing instructions applied to said serial test feed line;

(l) thereafter applying a command for loading the respective test vector storage register located within each of said monolithic integrated circuits possessing said first token as a result of step (k); and (m) at the same time as step (l) is performed, supplying via said serial test feed line a test vector for being loaded into the respective test vector storage register located within each of said monolithic integrated circuits possessing said first token, said test vector having a first of two opposite logic states for the one of the parallel bits of said stored test vector corresponding to the one of the output bits from the output port of said chunk of electronic circuitry that connects to the interconnections under test selected in step (e) and having a second of said two opposite logic states for the others of the parallel bits of said stored test vector.

29. A method for testing interconnections between chunks of electronic circuitry within different ones of a plurality of monolithic integrated circuits connected in a system comprising performing the method set forth in claim 28 a first time and then performing the method set forth in claim 28 a second time, with the test vector supplied via said serial test feed line for loading into the test vector storage register located within the one of said monolithic integrated circuits possessing said first token during step (i) when performing the method set forth in claim 28 the second time being the one's complement of the test vector supplied during step (i) when performing the method set forth in claim 28 the first time.

30. A method for testing interconnections between chunks of electronic circuitry within different ones of a plurality of monolithic integrated circuits connected in a system comprising the successive performance of the method set forth in claim 29 each time selecting to said test output line in step (h) a different one of the output bits from the output port of said chunk of electronic circuitry that connects to the interconnections under test.

31. A method for testing interconnections between chunks of electronic circuitry within different ones of a plurality of monolithic integrated circuits connected in a system comprising the successive performance of the method set forth in claim 28 each time selecting to said test output line to said test output line in step (h) a different one of the output bits from the output port of said chunk of electronic circuitry that connects to the interconnections under test.

32. A method for testing interconnections between chunks of electronic circuitry within different ones of a plurality of monolithic integrated circuits connected in a system comprising performing the method set forth in claim 31 a first time and then performing the method set forth in claim 31 a second time, with the test vector supplied via said serial test feed line for loading into the test vector storage register located within the one of said monolithic integrated circuits possessing said first token during step (i) when performing the method set forth in claim 31 the second time being the one's complement of the test vector supplied during step (i) when performing the method set forth in claim 31 the first time.

33. A method for testing interconnections between chunks of electronic circuitry within the same one of a plurality of monolithic integrated circuits; said monolithic integrated circuits having different commands supplied to them in common at different times; each of said monolithic integrated circuits connecting to a serial test feed line and to a test output line; each of said monolithic integrated circuits including a respective circulating test vector storage register for storing a plurality of test vectors one of which test vectors as selected responsive to one of said commands is supplied in the form of parallel bits, having at least one respective chunk of electronic circuitry therewithin, and respective test instruction memory means for receiving and storing in selected response to one of said commands test instructions for each said respective chunk of electronic circuitry included within that said monolithic integrated circuit; each of at least certain ones of said chunks of electronic circuitry having a respective input port for testing, and each of said chunks of electronic circuitry having a respective output port for testing; said method comprising for the respective testing of each said chunk of electronic circuitry the steps of:

(a) supplying in response to one of said commands a first token just to the one of said monolithic integrated circuits which includes the input port of that said chunk of electronic circuitry that connects to the interconnections under test, the one of said monolithic integrated circuits possessing said first token being enabled thereby for serially receiving test vectors and testing instructions applied to said serial test feed line;

(b) supplying in response to one of said commands a second token to just the one of said monolithic integrated circuits which includes the output port of that said chunk of electronic circuitry that connects to the interconnections under test, the one of said monolithic integrated circuits possessing said second token being enabled thereby to apply test results to said test output line;

(c) after step (a) is performed, applying to said monolithic integrated circuits one of said commands as conditionally directs loading in said monolithic integrated circuits of their respective test instruction memory means and (d) while step (c) is performed, supplying via said serial test feed line testing instructions to be received by the respective test instruction memory means in the one of said monolithic integrated circuits enabled for receiving said testing instructions by possessing said first token, one of which testing instructions is of a nature to enable the application of the succession of test vectors stored in the test vector storage register of said monolithic integrated circuit possessing said first token to the input port of said chunk of electronic circuitry that connects to the interconnections under test, and another of which testing instructions is of a nature to enable the output port of that said chunk of electronic circuitry that connects to the interconnections under test to apply test results to said test output line, steps (a) and (b) together selecting said chunk of electronic circuitry for test;

(e) in response to one of said commands, selecting which of the parallel bits of said stored test vector will be supplied at relatively low source impedance compared to the others;

(f) after steps (b), (c) and (d) are performed, selecting to said test output line, in response to one of said commands, one of the output bits from the output port of said chunk of electronic circuitry that connects to the interconnections under test;

(g) after steps (e) and (f) are performed, in response to one of said commands, circulating the input test vectors stored in the test vector storage register located within the one of said monolithic integrated circuits possessing said first token to apply them successively to the input port of that said chunk of electronic circuitry that connects to the interconnections under test; and (h) determining whether the succession of output bits appearing on said test output line is indicative of a fault in the interconnection under test connecting said chunks of electronic circuitry selected in steps (c) and (d).

34. A method as set forth in claim 33 wherein said steps (a) and (b) are carried out by passing said first and second tokens among said plurality of monolithic integrated circuits using a shift register shifting its contents responsive to a single one of said commands and having a respective pair of stages for storing said first and second tokens for each of said plurality of monolithic integrated circuits.

35. A method for testing interconnections between chunks of electronic circuitry within the same one of a plurality of monolithic integrated circuits connected in a system as set forth in claim 33, for use where each of said plurality of monolithic integrated circuits includes a respective mask shift register for storing a respective mask controlling which of the parallel bits supplied from said respective circulating test vector storage register are supplied at relatively low source impedance and which of the parallel bits supplied from said respective circulating test vector storage register are supplied at relatively high source impedance, wherein said step (e) of selecting which of the parallel bits of said stored test vector to be supplied at relatively low source impedance compared to the others is performed while as a result of step (a) said first token is possessed by said monolithic integrated circuit which includes the input port of said chunk of electronic circuitry to which connect the interconnections under test, and wherein said step (e) comprises the substeps of:

applying a command for loading the respective mask shift register located within said monolithic integrated circuit possessing said first token as a result of step (a); and at the same time, sequentially supplying via said serial test feed line at least one mask bit for loading into the respective mask shift register located within one monolithic integrated circuit possessing said first token as a result of step (a).

36. A method as set forth in claim 33 also including the following steps, which are performed prior to said steps (a) and (c) being performed:

(i) supplying in response to one of said commands a first token to at least the one of said monolithic integrated circuits which includes the chunks connected by the interconnections being tested, said first token for enabling each of said monolithic integrated circuits possessing it to serially receive test vectors and testing instructions applied to said serial test feed line;

(j) thereafter applying a command for loading the respective test vector storage register located within each of said monolithic integrated circuits possessing said first token as a result of step (i); and (k) at the same time as step (j) is performed, supplying via said serial test feed line a succession of test vectors for being loaded into the respective test vector storage register located within each of said monolithic integrated circuits possessing said first token, said test vectors being such that each bit place of said succession of test vectors exhibits alternating ZEROs and ONEs during circulating.

37. A method as set forth in claim 33 wherein steps (e), (g) and (h) are repeated with the successive steps (e) selecting a different one of the parallel bits of said stored test vector to be supplied at relatively low source impedance compared to the other parallel bits of said stored test vector.

38. A method for testing interconnections between chunks of electronic circuitry within the same one of a plurality of monolithic integrated circuits connected in a system comprising the successive performance of the method set forth in claim 37 each time selecting to said test output line in step (f) a different one of the output bits from the output port of said chunk of electronic circuitry that connects to the interconnections under test.

39. A method as set forth in claim 33 wherein steps (f), (g) and (h) are repeated with the successive steps (f) selecting to said test output line different ones of the output bits from the output port of said chunk of electronic circuitry that connects to the interconnections under test.

40. A method for testing interconnections between chunks of electronic circuitry within the same one of a plurality of monolithic integrated circuits connected in a system comprising the successive performance of the method set forth in claim 39 each time selecting in step (e) a different one of the parallel bits of said stored test vector to be supplied at relatively low source impedance compared to the others.

41. A method for testing interconnections between chunks of electronic circuitry within different ones of a plurality of monolithic integrated circuits; said monolithic integrated circuits having different commands supplied to them in common at different times; each of said monolithic integrated circuits connecting to a serial test feed line and to a test output line; each of said monolithic integrated circuits including a respective circulating test vector storage register for storing a plurality of test vectors one of which test vectors as selected responsive to one of said commands is supplied in the form of parallel bits, having at least one respective chunk of electronic circuitry therewithin, at least one respective chunk of electronic circuitry therewithin, and respective test instruction memory means for receiving and storing in selected response to one of said commands test instructions for each said respective chunk of electronic circuitry included within that said monolithic integrated circuit; each of at least certain ones of said chunks of electronic circuitry having a respective input port for testing, and each of said chunks of electronic circuitry having a respective output port for testing; said method comprising for the respective testing of each said chunk of electronic circuitry the steps of:

(a) supplying in response to one of said commands a first token to just the one of said plurality of monolithic integrated circuits which includes the output port of that said chunk of electronic circuitry from which connect said interconnections under test, the one of said monolithic integrated circuits possessing said first token being enabled thereby for serially receiving test vectors and testing instructions applied to said serial test feed line;

(b) while as a result of step (a) said first token is possessed by said monolithic integrated circuit which includes the output port of that said chunk of electronic circuitry from which connect said interconnections under test, applying to said monolithic integrated circuits one of said commands, as conditionally directs loading of respective test instruction memory means in said monolithic integrated circuits;

(c) while step (b) is performed, supplying via said serial test feed line testing instructions to be received by the respective test instruction memory means in said monolithic integrated circuit enabled for receiving said testing instructions by possessing said first token, one of which testing instructions is of a nature to select test results from the output port of that said chunk of electronic circuitry from which connect said interconnections under test to be the test results from the one of said monolithic integrated circuits enabled for receiving said testing instructions by possessing said first token;

(d) supplying in response to one of said commands a first token to just the one of said plurality of monolithic integrated circuits which includes the input port of that said chunk of electronic circuitry to which connect the interconnections under test, the one of said monolithic integrated circuits possessing said first token being enabled thereby for serially receiving test vectors and testing instructions applied to said serial test feed line;

(e) while as a result of step (d) said first token is possessed by said monolithic integrated circuit which includes the input port of that said chunk of electronic circuitry to which connect the interconnections under test, applying to said monolithic integrated circuits one of said commands, as conditionally directs loading in said monolithic integrated circuits of their respective test instruction memory means;

(f) while step (e) is performed, supplying via said serial test feed line testing instructions to be received by the respective test instruction memory means in the one of said monolithic integrated circuits enabled for receiving said testing instructions by possessing said first token, one of which testing instructions is of a nature to enable the application of the succession of test vectors stored in the respective test vector storage register of said monolithic integrated circuit possessing said first token to the input port of that said chunk of electronic circuitry to which interconnections under test connect;

(g) supplying in response to one of said commands a second token to just the one of said monolithic integrated circuits which includes the output port of that said chunk of electronic circuitry being tested from which interconnections under test connect, the one of said monolithic integrated circuits possessing said second token being enabled thereby to enable that one of said monolithic integrated circuits to apply test results to said test output line;

(h) selecting which of the parallel bits of said stored test vector will be supplied at relatively low source impedance compared to the others;

(i) after steps (a) through (h) are performed, selecting to said test output line, in response to one of said commands, one of the output bits from the output port of that said chunk of electronic circuitry that connects to the interconnections under test;

(j) after step (i) is performed, in response to one of said commands, circulating the input test vectors stored in the test vector storage register located within the one of said monolithic integrated circuits possessing said first token to apply them successively to the input port of that said chunk of electronic circuitry that connects to the interconnections under test; and (k) determining whether the succession of output bits appearing on said test output line during step (j) is indicative of a fault in the interconnection under test connecting said chunks of electronic circuitry selected in steps (d) through (g).

42. A method as set forth in claim 41; wherein said steps (d) and (g) are carried out concurrently by passing said first and second tokens among said plurality of monolithic integrated circuits using a shift register shifting its contents responsive to a single one of said commands and having a respective pair of stages for storing said first and second tokens for each of said plurality of monolithic integrated circuits; and wherein said step (a) is carried out by passing said first token among said plurality of monolithic integrated circuits using the same said shift register shifting its contents responsive to the same single one of said commands.

43. A method for testing interconnections between chunks of electronic circuitry within different ones of a plurality of monolithic integrated circuits connected in a system as set forth in claim 41, for use where each of said plurality of monolithic integrated circuits includes a respective mask shift register for storing a respective mask controlling which of the parallel bits supplied from said respective circulating test vector storage register are supplied at relatively low source impedance and which of the parallel bits supplied from said respective circulating test vector storage register are supplied at relatively high source impedance, wherein said step (h) of selecting which of the parallel bits of said stored test vector to be supplied at relatively low source impedance compared to the others is performed while as a result of step (d) said first token is possessed by said monolithic integrated circuit which includes the input port of said chunk of electronic circuitry to which connect the interconnections under test, and wherein said step (h) comprises the substeps of:

applying a command for loading the respective mask shift register located within said monolithic integrated circuit possessing said first token as a result of step (d); and at the same time, sequentially supplying via said serial test feed line at least one mask bit for loading into the respective mask shift register located within monolithic integrated circuit possessing said first token as a result of step (d).

44. method for testing a system comprising a plurality of monolithic integrated circuits as set forth in claim 41 also including the following steps, which are performed prior to said steps (a) and (c) being performed:

(l) supplying in response to one of said commands a first token to at least the one of said monolithic integrated circuits which includes that said chunk to the input port of which connect the interconnections being tested, said first token for enabling each of said monolithic integrated circuits possessing it to serially receive test vectors and testing instructions applied to said serial test feed line;

(m) thereafter applying a command for loading the respective test vector storage register located within each of said monolithic integrated circuits possessing said first token as a result of step (l); and (n) at the same time as step (m) is performed, supplying via said serial test feed line a succession of test vectors for being loaded into the respective test vector storage register located within each of said monolithic integrated circuits possessing said first token, said test vectors being such that each bit place of said succession of test vectors exhibits alternating ZEROs and ONEs during circulating.

45. A method as set forth in claim 41 wherein steps (h), (j) and (k) are repeated each time selecting in step (h) a different one of the parallel bits of said stored test vector to be supplied at relatively low source impedance compared to the other parallel bits of said stored test vector.

46. A method for testing interconnections between chunks of electronic circuitry within different ones of a plurality of monolithic integrated circuits connected in a system comprising the successive performance of the method set forth in claim 45 each time selecting in step (i) a different one of the output bits from the output port of said chunk of electronic circuitry that connects to the interconnections under test.

47. A method as set forth in claim 41 wherein steps (i), (j) and (k) are repeated with the successive steps (i) selecting to said test output line different ones of the output bits from the output port of said chunk of electronic circuitry that connects to the interconnections under test.

48. A method for testing interconnections between chunks of electronic circuitry within different ones of a plurality of monolithic integrated circuits connected in a system comprising the successive performance of the method set forth in claim 47 each time selecting in step (h) a different one of the parallel bits of said stored test vector to be supplied at relatively low source impedance compared to the others.

* * * * *